United States Patent
Atsumi et al.

(10) Patent No.: US 9,716,100 B2
(45) Date of Patent: Jul. 25, 2017

(54) SEMICONDUCTOR DEVICE, METHOD FOR DRIVING SEMICONDUCTOR DEVICE, AND ELECTRONIC DEVICE

(71) Applicant: Semiconductor Energy Laboratory Co., Ltd., Atsugi-shi, Kanagawa-ken (JP)

(72) Inventors: Tomoaki Atsumi, Kanagawa (JP); Shuhei Nagatsuka, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/643,621

(22) Filed: Mar. 10, 2015

(65) Prior Publication Data

US 2015/0263008 A1    Sep. 17, 2015

(30) Foreign Application Priority Data

Mar. 14, 2014  (JP) ................................ 2014-051497
Mar. 28, 2014  (JP) ................................ 2014-069626

(51) Int. Cl.
| | |
|---|---|
| H01L 27/108 | (2006.01) |
| H01L 27/1156 | (2017.01) |
| H01L 27/11551 | (2017.01) |
| G11C 7/10 | (2006.01) |
| G11C 7/16 | (2006.01) |
| G11C 11/405 | (2006.01) |
| G11C 11/408 | (2006.01) |
| H01L 27/12 | (2006.01) |

(52) U.S. Cl.
CPC ........ *H01L 27/1156* (2013.01); *G11C 7/1006* (2013.01); *G11C 7/16* (2013.01); *G11C 11/405* (2013.01); *G11C 11/4085* (2013.01); *H01L 27/11551* (2013.01); *H01L 27/1225* (2013.01)

(58) Field of Classification Search
CPC .................................................. H01L 27/10814
USPC ...................... 257/300, 43, 57; 365/145, 149
See application file for complete search history.

(56) References Cited

U.S. PATENT DOCUMENTS

| | | | |
|---|---|---|---|
| 6,151,244 A * | 11/2000 | Fujino ................. | G11C 11/4074 365/149 |
| 8,339,828 B2 | 12/2012 | Yamazaki et al. | |
| 8,363,452 B2 | 1/2013 | Yamazaki et al. | |
| 8,520,426 B2 | 8/2013 | Ohnuki | |
| 8,542,528 B2 | 9/2013 | Sekine et al. | |

(Continued)

FOREIGN PATENT DOCUMENTS

JP    2012-256400 A    12/2012

*Primary Examiner* — Brook Kebede
(74) *Attorney, Agent, or Firm* — Fish & Richardson P.C.

(57) ABSTRACT

A novel semiconductor device that can write and read multilevel data is provided. A memory cell includes a bit line, a power supply line, first and second nodes, first to fourth transistors, and first and second capacitors. One of two divided multilevel data is written to the first node through the first transistor. The other of the divided multilevel data is written to the second node through the second transistor. A gate of the third transistor is connected to the first node, and a gate of the fourth transistor is connected to the second node. The third and fourth transistors control electrical continuity between the bit line and the power supply line. Each of the first and second transistors preferably includes an oxide semiconductor in a semiconductor layer.

16 Claims, 25 Drawing Sheets

(56) References Cited

U.S. PATENT DOCUMENTS

| | | |
|---|---|---|
| 8,614,916 B2 | 12/2013 | Nagatsuka et al. |
| 8,686,415 B2 | 4/2014 | Kamata |
| 8,792,284 B2 | 7/2014 | Ohnuki |
| 2003/0185042 A1* | 10/2003 | Kato ................... G11C 11/22 365/145 |
| 2012/0161132 A1* | 6/2012 | Yamazaki ........... H01L 27/1225 257/57 |
| 2013/0334533 A1* | 12/2013 | Yamazaki ........... H01L 29/7869 257/57 |
| 2014/0027764 A1* | 1/2014 | Yamazaki ........... H01L 27/0688 257/43 |
| 2015/0263047 A1 | 9/2015 | Kimura et al. |

* cited by examiner

CAAC-OS nc-OS as-sputtered     after heat treatment at 450°C

☐ Proportion of non-CAAC    ▤ Proportion of CAAC as-sputtered after heat treatment at 450°C

4000

4000

4000

4000

4000

4000

SEMICONDUCTOR DEVICE, METHOD FOR DRIVING SEMICONDUCTOR DEVICE, AND ELECTRONIC DEVICE

BACKGROUND OF THE INVENTION

1. Field of the Invention

The present invention relates to an object, a method, or a manufacturing method. In addition, the present invention relates to a process, a machine, manufacture, or a composition of matter. One embodiment of the present invention relates to a semiconductor device, a display device, a light-emitting device, a power storage device, a storage device, or a driving method thereof. In particular, one embodiment of the present invention relates to a semiconductor device, a display device, or a light-emitting device each including an oxide semiconductor.

In this specification and the like, a semiconductor device generally means a device that can function by utilizing semiconductor characteristics. A display device, an electro-optical device, a semiconductor circuit, and an electronic device include a semiconductor device in some cases.

2. Description of the Related Art

Much attention has been focused on a semiconductor device that retains data by using a combination of a transistor in which silicon (Si) is used for a semiconductor layer and a transistor in which an oxide semiconductor (OS) is used for a semiconductor layer (see Patent Document 1).

In recent years, with the increase in the amount of data manipulated, a semiconductor device having high storage capacity has been required. In this situation, Patent Document 1 discloses a semiconductor device where multilevel data is stored and read. In this specification, multilevel data means j-bit data (j is a natural number of two or more) unless otherwise specified.

REFERENCE

Patent Document 1: Japanese Published Patent Application No. 2012-256400

SUMMARY OF THE INVENTION

For example, in the semiconductor device disclosed in Patent Document 1, multilevel data is written by using one transistor. When the number of bits of multilevel data increases, the difference between potentials corresponding to different levels of data becomes small. Thus, determining a potential in reading data becomes difficult, and an incorrect value might be read.

An object of one embodiment of the present invention is to provide a semiconductor device where multilevel data can be written and read, or a method for driving a semiconductor device where multilevel data can be written and read. Another object of one embodiment of the present invention is to provide a novel semiconductor device.

Note that the description of a plurality of objects does not disturb the existence of each object. One embodiment of the present invention does not necessarily achieve all the objects described above. Other objects will be apparent from and can be derived from the description of the specification, the drawings, the claims, and the like, and such objects could be objects of one embodiment of the present invention.

One embodiment of the present invention is a semiconductor device that includes a bit line, a power supply line, first and second word lines, first to fourth transistors, first and second capacitors, and first and second retention nodes. First data is input to the first retention node through the first transistor. Second data is input to the second retention node through the second transistor. A gate of the third transistor is electrically connected to the first retention node. One of a source and a drain of the third transistor is electrically connected to the bit line. The other of the source and the drain of the third transistor is electrically connected to one of a source and a drain of the fourth transistor. The other of the source and the drain of the fourth transistor is electrically connected to the power supply line. A gate of the fourth transistor is electrically connected to the second retention node. A first terminal of the first capacitor is electrically connected to the first retention node. A second terminal of the first capacitor is electrically connected to the first word line. A first terminal of the second capacitor is electrically connected to the second retention node. A second terminal of the second capacitor is electrically connected to the second word line. The first data and the second data are binary data or multilevel data. Each of the first and second transistors includes an oxide semiconductor in a semiconductor layer.

In the above embodiment, the third and fourth transistors are p-channel transistors.

In the above embodiment, the third and fourth transistors are n-channel transistors.

One embodiment of the present invention is an electronic device that includes the semiconductor device described in the above embodiment and a display device, a microphone, a speaker, an operation key, or a housing.

Note that in this specification and the like, a transistor is an element having at least three terminals of a gate, a drain, and a source. The transistor includes a channel region between the drain (a drain terminal, a drain region, or a drain electrode) and the source (a source terminal, a source region, or a source electrode) and current can flow through the drain, the channel region, and the source.

Here, since the source and the drain of the transistor change depending on the structure, the operating condition, and the like of the transistor, it is difficult to define which is a source or a drain. Thus, a portion that functions as a source or a portion that functions as a drain is not referred to as a source or a drain in some cases. In that case, one of the source and the drain might be referred to as a first electrode, and the other of the source and the drain might be referred to as a second electrode.

In this specification, ordinal numbers such as "first," "second," and "third" are used to avoid confusion among components, and thus do not limit the number of the components.

In this specification, the expression "A and B are connected" means the case where "A and B are electrically connected" in addition to the case where "A and B are directly connected." Here, the expression "A and B are electrically connected" means the case where electric signals can be transmitted and received between A and B when an object having any electric action exists between A and B.

For example, the case where a source (or a first terminal or the like) of a transistor is electrically connected to X through (or not through) z and a drain (or a second terminal or the like) of the transistor is electrically connected to Y through (or not through) $z_2$, or the case where a source (or a first terminal or the like) of a transistor is directly connected to part of z and another part of z is directly connected to X while a drain (or a second terminal or the like) of the transistor is directly connected to part of $z_2$ and another part of $z_2$ is directly connected to Y, can be expressed by using any of the following expressions.

The expressions include, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in that order," "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in that order," and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are connected in that order." When the connection order in a circuit structure is defined by an expression similar to the above examples, a source (or a first terminal or the like) and a drain (or a second terminal or the like) of a transistor can be distinguished from each other to specify the technical scope. Note that these expressions are examples and there is no limitation on the expressions. Here, X, Y, z, and $z_2$ each denote an object (e.g., a device, an element, a circuit, a wiring, an electrode, a terminal, a conductive film, and a layer).

In this specification, terms for describing arrangement, such as "over" and "under," are used for convenience for describing the positional relationship between components with reference to drawings. Furthermore, the positional relationship between components is changed as appropriate in accordance with a direction in which each component is described. Thus, there is no limitation on terms used in this specification, and description can be made appropriately depending on the situation.

Unless otherwise specified, off-state current in this specification refers to drain current of a transistor in an off state. Unless otherwise specified, the off state of an n-channel transistor means that a potential difference ($V_{GS}$) between its gate and source is lower than the threshold voltage (Vth), and the off state of a p-channel transistor means that $V_{GS}$ is higher than Vth. For example, the off-state current of an n-channel transistor sometimes refers to drain current that flows when $V_{GS}$ is lower than Vth. The off-state current of a transistor depends on $V_{GS}$ in some cases. Thus, "the off-state current of a transistor is lower than or equal to $10^{-21}$ A" means "there is $V_{GS}$ with which the off-state current of a transistor becomes lower than or equal to $10^{-21}$ A" in some cases.

The off-state current of a transistor depends on a potential difference ($V_{DS}$) between its drain and source in some cases. Unless otherwise specified, the off-state current in this specification might be off-state current at $V_{DS}$ with an absolute value of 0.1 V, 0.8 V, 1 V, 1.2 V, 1.8 V, 2.5 V, 3 V, 3.3 V, 10 V, 12 V, 16 V, or 20 V. Alternatively, the off-state current might be off-state current at $V_{DS}$ at which the required reliability of a semiconductor device or the like including the transistor is ensured or $V_{DS}$ used in the semiconductor device or the like including the transistor.

One embodiment of the present invention can provide a semiconductor device where multilevel data can be written and read, or a method for driving a semiconductor device where multilevel data can be written and read. Furthermore, one embodiment of the present invention can provide e a novel semiconductor device.

Note that the description of these effects does not disturb the existence of other effects. In one embodiment of the present invention, there is no need to obtain all the effects described above. Other effects will be apparent from and can be derived from the description of the specification, the drawings, the claims, and the like.

BRIEF DESCRIPTION OF THE DRAWINGS

In the accompanying drawings.

DETAILED DESCRIPTION OF THE INVENTION

Figure 1:
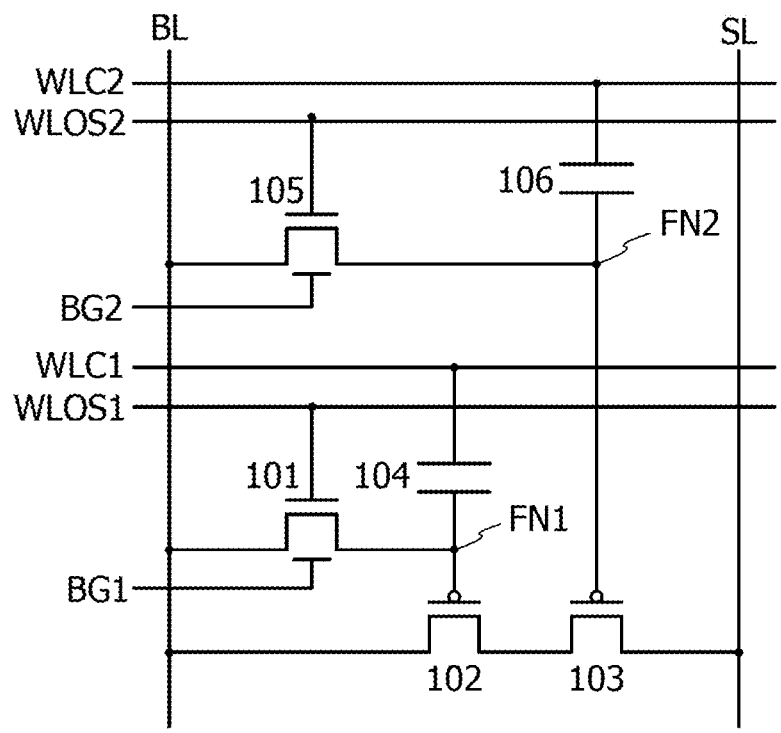
FIG. 1 is a circuit diagram illustrating a memory cell example.

Embodiments will be described below with reference to the drawings. Note that the embodiments can be implemented in various different ways and it will be readily appreciated by those skilled in the art that modes and details of the present invention can be modified in various ways without departing from the spirit and scope of the present invention. The present invention therefore should not be construed as being limited to the following description of the embodiments.

In the drawings, the size, the layer thickness, or the region is exaggerated for clarity in some cases. Thus, embodiments of the present invention are not limited to such scales. Note that the drawings are schematic views showing ideal examples, and embodiments of the present invention are not limited to shapes or values shown in the drawings. For example, the following can be included: variation in signal, voltage, or current due to noise or difference in timing. Note that in the following embodiments, the same portions or portions having similar functions are denoted by the same reference numerals in different drawings, and description thereof will not be repeated.

(Embodiment 1)

In this embodiment, a circuit structure and operation of a memory cell included in a semiconductor device according to one embodiment of the present invention are described with reference to FIG. 1, FIG. 2, and FIG. 3.

<Structure Example of Memory Cell>

FIG. 1 is a circuit diagram of a memory cell 100 according to one embodiment of the present invention.

The memory cell 100 in FIG. 1 includes a transistor 101, a transistor 102, a transistor 103, a capacitor 104, a transistor 105, a capacitor 106, a node FN1, and a node FN2. The memory cell 100 is electrically connected to a bit line BL, a power supply line SL, a word line WLC1, a word line WLOS1, a word line WLC2, and a word line WLOS2.

A gate of the transistor 101 is electrically connected to the word line WLOS1. One of a source and a drain of the transistor 101 is electrically connected to the bit line BL. The other of the source and the drain of the transistor 101 is electrically connected to the node FN1. A second gate of the transistor 101 is electrically connected to a wiring to which a signal BG1 is supplied.

A gate of the transistor 102 is electrically connected to the node FN1. One of a source and a drain of the transistor 102 is electrically connected to the bit line BL. The other of the source and the drain of the transistor 102 is electrically connected to one of a source and a drain of the transistor 103.

A gate of the transistor 103 is electrically connected to the node FN2. The other of the source and the drain of the transistor 103 is electrically connected to the power supply line SL.

One terminal of the capacitor 104 is electrically connected to the word line WLC1. The other terminal of the capacitor 104 is electrically connected to the node FN1.

A gate of the transistor 105 is electrically connected to the word line WLOS2. One of a source and a drain of the transistor 105 is electrically connected to the bit line BL. The other of the source and the drain of the transistor 105 is electrically connected to the node FN2. A second gate of the transistor 105 is electrically connected to a wiring to which a signal BG2 is supplied.

One terminal of the capacitor 106 is electrically connected to the word line WLC2. The other terminal of the capacitor 106 is electrically connected to the node FN2.

The node FN1 has a function of retaining binary or multilevel data. In other words, the node FN1 has a function of retaining M-bit ($2^M$-level, where M is a natural number of one or more) data. Specifically, 2-bit data is 4-level data ($2^2$-level data), namely, a signal having any one of the four levels of voltages.

Similarly, the node FN2 has a function of retaining binary or multilevel data. In other words, the node FN2 has a function of retaining N-bit ($2^N$-level, where N is a natural number of one or more) data.

The M-bit data and the N-bit data are input to the bit line. The M-bit data is input from the bit line to the node FN1 through the transistor 101. The N-bit data is input from the bit line to the node FN2 through the transistor 105.

In this specification, "writing data to the memory cell" means that the potential of the node FN1 or FN2 becomes a potential based on the voltage of the bit line BL. Furthermore, "reading data from the memory cell" means that the potential of the bit line BL becomes a potential based on the potential of the node FN1 or FN2.

A write signal is supplied to the word lines WLOS1 and WLOS2.

The write signal is a signal for turning on the transistor 101 or 105 to apply the potential of the bit line BL to the node FN1 or FN2.

A read signal is supplied to the word lines WLC1 and WLC2.

The read signal is a signal supplied to one electrode of the capacitor 104 or one electrode of the capacitor 106 to selectively read data from the memory cell.

The transistors 101 and 105 are n-channel transistors in the following description. Furthermore, the transistors 102 and 103 are p-channel transistors in the following description.

Each of the transistors 101 and 105 functions as a switch for controlling data writing by being turned on and off. While being kept in an off state, the transistors 101 and 105 also have a function of holding a potential based on written data.

Each of the transistors 101 and 105 is preferably a transistor in which current flowing between a source and drain in an off state (off-state current) is low. Here, the term "low off-state current" means that normalized off-state current per micrometer of channel width at room temperature with a source-drain voltage of 10 V is lower than or equal to $10 \times 10^{-21}$ A. An example of a transistor with such a low off-state current is a transistor including a semiconductor layer containing an oxide semiconductor.

In the structure of the memory cell 100 in FIG. 1, a potential based on written data is held by keeping the transistors 101 and 105 off. Thus, it is particularly preferable that transistors with low off-state current be used as switches for suppressing changes in the potential accompanied by transfer of electric charge at the nodes FN1 and FN2.

The transistors 102 and 103 have a function of making current flow between the bit line BL and the power supply line SL in accordance with the potentials of the nodes FN1 and FN2.

The transistors 102 and 103 are preferably transistors with little variation in threshold voltage. Here, transistors with little variation in threshold voltage refer to transistors fabricated in the same process to have an acceptable threshold voltage difference of 100 mV or less, and are specifically transistors including single crystal silicon in channels.

Note that the second gates of the transistors 101 and 105 have a function of controlling the threshold voltages of the transistors 101 and 105 or a function of increasing the on-state currents of the transistors 101 and 105; however, the second gates of the transistors 101 and 105 may be omitted depending on circumstances.

<Timing Chart>

Next, an operation example of the memory cell 100 is described with reference to timing charts in FIG. 2 and FIG. 3.

Figure 2:
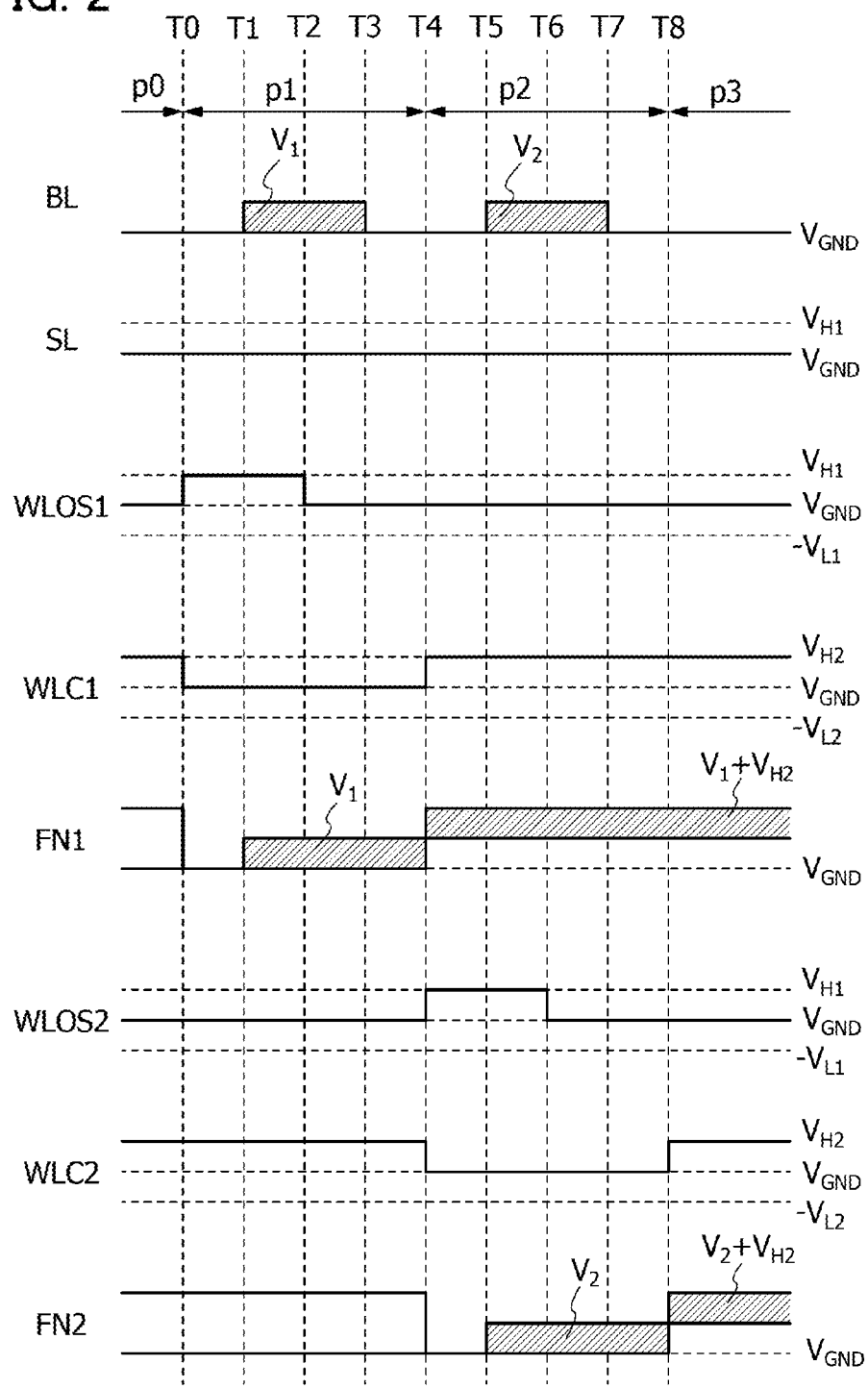
FIG. 2 is a timing chart illustrating a memory cell operation example.
Figure 3:
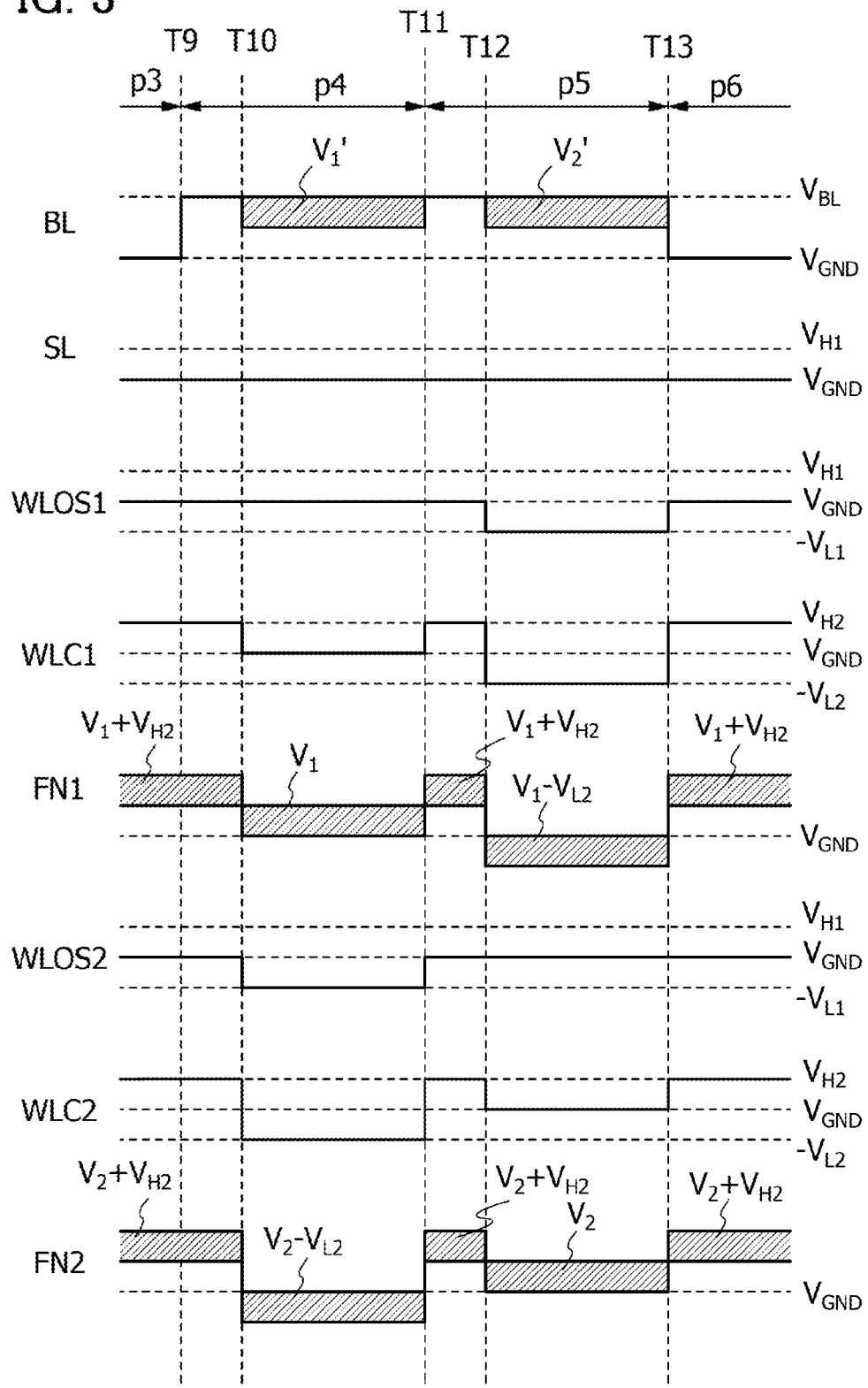
FIG. 3 is a timing chart illustrating a memory cell operation example.

The timing charts in FIG. 2 and FIG. 3 show potential changes in the bit line BL, the power supply line SL, the word line WLOS1, a word line WLC1, the node FN1, the word line WLOS2, the word line WLC2, and the node FN2 in the memory cell 100. FIG. 2 is a timing chart when data is written to the memory cell 100, and FIG. 3 is a timing chart when the data written to the memory cell 100 in FIG. 2 is read.

In FIG. 2 and FIG. 3, a potential $V_{H1}$ is applied to the power supply line SL and the word lines WLOS1 and WLOS2 as a high power supply potential, and a potential $V_{GND}$ is applied to the power supply line SL and the word lines WLOS1 and WLOS2 as a low power supply potential. Note that the potential $V_{GND}$ may be a ground potential GND. In addition, the potential $V_{H1}$ and the potential $V_{GND}$ are referred to as an H-level potential and an L-level potential, respectively, in some cases. Furthermore, a potential $-V_{L1}$ that is lower than the potential $V_{GND}$ is applied to the word lines WLOS1 and WLOS2 in some cases. The potential $-V_{L1}$ is preferably a negative potential ($-V_{L1} < 0$ V).

In FIG. 2 and FIG. 3, a potential $V_{H2}$ is applied to the word lines WLC1 and WLC2 as a high power supply potential, and the potential $V_{GND}$ is applied to the word lines WLC1 and WLC2 as a low power supply potential. Note that the potential $V_{GND}$ may be the ground potential GND. In addition, the potential $V_{H2}$ and the potential $V_{GND}$ are referred to as an H-level potential and an L-level potential, respectively, in some cases. Furthermore, a potential $-V_{L2}$ that is lower than the potential $V_{GND}$ is applied to the word lines WLC1 and WLC2 in some cases. The potential $-V_{L2}$ is preferably a negative potential ($-V_{L2} < 0$ V).

<Write Operation>

Write operation of the memory cell 100 is described with reference to the timing chart in FIG. 2.

FIG. 2 shows four periods p0 to p3. The period p0 is an initial period; the period p1 is a period during which data is written to the node FN1; the period p2 is a period during which data is written to the node FN2; and the period p3 is a period during which written data is retained. Times T0 to T8 in FIG. 2 are used to describe operation timing.

First, in the period p0, the bit line BL is initialized to $V_{GND}$; the power supply line SL maintains $V_{GND}$; an L-level potential is applied to the word line WLOS1; an H-level potential is applied to the word line WLC1; an L-level potential is applied to the word line WLOS2; and an H-level potential is applied to the word line WLC2.

Next, at the time T0, the potential of the word line WLOS1 is changed from an L level to an H level, and the potential of the word line WLC1 is changed from an H level to an L level. At this time, the transistor 101 is turned on, electrical continuity between the bit line BL and the node FN1 is established, and the node FN1 is initialized to the potential $V_{GND}$.

Next, at the time T1, a potential $V_1$ is applied to the bit line BL, and since the electrical continuity between the bit line BL and the node FN1 is established, the potential $V_1$ is also applied to the node FN1.

Note that portions indicated by hatching patterns in the timing charts of FIG. 2 and FIG. 3 represent application of potentials indicated by the hatching patterns, that is, supply of multilevel data. For example, in the case where 4-bit data is written to the node FN1, the potential $V_1$ can be a $2^4$-level (=16-level) potential.

Next, at the time T2, the potential of the word line WLOS1 is set to an L level and the transistor 101 is turned off. Then, at the time T3, the potential of the bit line BL is initialized to $V_{GND}$. At this time, the node FN1 becomes electrically floating and retains the potential $V_1$.

Then, at the time T4, the potential of the word line WLC1 is set to an H level, and the potential of the node FN1 is raised to $V_1+V_{H2}$ by capacitive coupling. When the potential of the node FN1 is kept high, the p-channel transistor 102 can be kept in an off state and leakage current can be prevented from flowing between the bit line BL and the power supply line SL. At the same time, the potential of the word line WLOS2 is changed from an L level to an H level, and the potential of the word line WLC2 is changed from an H level to an L level. At this time, the transistor 105 is turned on and the node FN2 is initialized.

Note that to transfer the potential of the word line WLC1 to the node FN1 through the capacitor 104, the capacitance of the capacitor 104 is preferably much higher than the gate capacitance of the transistor 101, and the capacitance of the capacitor 104 is preferably much higher than the gate capacitance of the transistor 102. In this embodiment, to simplify the description, a potential applied to the word line WLC1 is directly transferred to the node FN1 (for example, when the potential $V_{H2}$ is applied to the word line WLC1, the potential of the node FN1 is raised from the potential $V_1$ to the potential $V_1+V_{H2}$). However, a potential applied to the word line WLC1 is not directly transferred to the node FN1 depending on the magnitude relationship between the capacitance of the capacitor 104, the gate capacitance of the transistor 101, and the gate capacitance of the transistor 102.

Then, at the time T5, a potential V2 is applied to the bit line BL and written to the node FN2. Note that the potential V2 can be multilevel data. For example, in the case where 4-bit data is written to the node FN2, the potential $V_2$ can be a $2^4$-level (=16-level) potential.

Next, at the time T6, the potential of the word line WLOS2 is changed from an H level to an L level and the transistor 105 is turned off. Then, at the time T7, the potential of the bit line BL is initialized to $V_{GND}$. At this time, the node FN2 retains the potential V2 because it is electrically floating.

Then, at the time T8, the potential of the word line WLC2 is changed from an L level to an H level, and the potential of the node FN2 is raised to $V_2+V_{H2}$ by capacitive coupling. When the potential of the node FN2 is kept high, the p-channel transistor 103 can be kept in an off state and leakage current is prevented from flowing from the bit line BL to the power supply line SL.

Note that to transfer the potential of the word line WLC2 to the node FN2 through the capacitor 106, the capacitance of the capacitor 106 is preferably much higher than the gate capacitance of the transistor 105, and the capacitance of the capacitor 106 is preferably much higher than the gate capacitance of the transistor 103. In this embodiment, to simplify the description, a potential applied to the word line WLC2 is directly transferred to the node FN2 (for example, when the potential $V_{H2}$ is applied to the word line WLC2, the potential of the node FN2 is raised from the potential $V_2$ to the potential $V_2+V_{H2}$). However, a potential applied to the word line WLC2 is not directly transferred to the node FN2 depending on the magnitude relationship between the capacitance of the capacitor 106, the gate capacitance of the transistor 105, and the gate capacitance of the transistor 103.

In the period p3 after the time T8, the data written to the nodes FN1 and FN2 is retained.

As described above, multilevel data can be written to the nodes FN1 and FN2 by write operation described with reference to the timing chart in FIG. 2.

Note that in the period p1, the potential $V_{H1}$ applied to the word line WLOS1 is preferably higher than the sum of the potential $V_1$ and the threshold voltage of the transistor 101. For example, in the case where the potential $V_1$ is 3 V, the potential $V_{H1}$ is preferably higher than or equal to 4 V (3 V+1 V) when the threshold voltage of the transistor 101 is 1 V. This is because if the potential of the word line WLOS1 is lower than 4 V when a potential of 3 V is applied from the bit line BL to the node FN1, a potential difference ($V_{GS}$) between the gate and the source of the transistor 101 becomes lower than or equal to the threshold voltage before the potential of the node FN1 reaches 3 V, the transistor 101 is turned off, and the potential of 3 V cannot be applied to the node FN1.

Similarly, in the period p2, the potential $V_{H1}$ applied to the word line WLOS2 is preferably higher than the sum of the potential $V_2$ and the threshold voltage of the transistor 105.

Note that $V_{GS}$ in this specification refers to a potential difference between a gate and a source with the potential of the source used as a reference potential. For example, $V_{GS}$ is 2 V when a potential of 1 V and a potential of 3 V are applied to the source and the gate, respectively. For example, $V_{GS}$ is −2 V when a potential of 3 V and a potential of 1 V are applied to the source and the gate, respectively.

<Read Operation>

Operation of reading data written to the memory cell 100 is described with reference to the timing chart in FIG. 3.

FIG. 3 shows four periods p3 to p6. The period p3 is a period during which data is retained from the period p3 in FIG. 2; the period p4 is a period during which data is read from the node FN1; the period p5 is a period during which data is read from the node FN2; and the period p6 is a period during which data is retained. Times T9 to T13 in FIG. 3 are used to describe operation timing.

First, at the time T9, the bit line BL is charged (precharged) to a potential $V_{BL}$.

Then, at the time T10, the bit line BL is brought into an electrically floating state. That is, the potential of the bit line BL is changed by charging or discharging of electrical charge. This state is achieved by turning off a switch for supplying a potential to the bit line BL.

In addition, at the time T10, the potential of the word line WLC1 is decreased from an H level to an L level, and the potential of the node FN1 is decreased from the potential $V_1+V_{H2}$ to the potential $V_1$ by capacitive coupling. When the potential of the node FN1 is decreased, the absolute value of $V_{GS}$ of the p-channel transistor 102 becomes large and the transistor 102 is turned on. At the same time, the potential of the word line WLC2 is decreased from an H level to the potential $-V_{L2}$, and the potential of the node FN2 is decreased from the potential $V_2+V_{H2}$ to the potential $V_2-V_{L2}$ by capacitive coupling. When the potential of the node FN2 is decreased, the absolute value of $V_{GS}$ of the p-channel transistor 103 becomes large and the transistor 103 is turned on. When the transistors 102 and 103 are turned on, electrical continuity between the bit line BL and the power supply line SL is established, current flows, the bit line BL discharges electric charge, and the potential of the bit line BL is decreased.

When the potential of the bit line BL is decreased by discharging, the absolute value of $V_{GS}$ of the transistor 102 and the absolute value of $V_{GS}$ of the transistor 103 are decreased. Discharging is completed when $V_{GS}$ of one of the transistors 102 and 103 becomes equal to the threshold voltage of the transistor, and the potential of the bit line BL converges on a constant potential. In the period p4, a potential applied to the node FN2 is lower than a potential applied to the node FN1; thus, the absolute value of $V_{GS}$ of the transistor 103 is larger than that of the transistor 102. That is, the transistor 103 has lower channel resistance and higher on-state current than the transistor 102. Thus, when discharge of the bit line BL is started, $V_{GS}$ of the transistor 102 reaches the threshold voltage before $V_{GS}$ of the transistor 103, and the transistor 102 is turned off before the transistor 103.

When the transistor 102 is turned off, the bit line BL converges on a constant potential (potential $V_1'$). The potential $V_1'$ is substantially equal to a potential obtained by subtracting the threshold voltage of the transistor 102 from the potential of the node FN1. That is, the potential of the node FN1 can be reflected in the potential $V_1'$ of the bit line BL. When the difference in the potential is used to determine the data, the multilevel data written to the node FN1 can be read.

Note that at the time T10, the potential of the word line WLOS2 is changed from an L level to $-V_{L1}$. Thus, a potential change in the bit line BL or the node FN2 prevents the transistor 105 from being turned on.

Next, at the time T11, the potential of the bit line BL is returned to the potential $V_{BL}$ to precharge the bit line BL. At the same time, the potentials of all the word lines and the nodes FN1 and FN2 are returned to the potentials in the period p3 to turn off the transistors 102 and 103.

Then, at the time T12, the bit line BL is brought into an electrically floating state. This state is achieved by turning off the switch for supplying a potential to the bit line BL.

In addition, at the time T12, the potential of the word line WLC1 is changed from an H level to the potential $-V_{L2}$, and the potential of the word line WLC2 is changed from an H level to an L level. At this time, the potential of the node FN1 is decreased from the potential $V_1+V_{H2}$ to the potential $V_1-V_{L2}$ by capacitive coupling, and the potential of the node FN2 is decreased from the potential $V_2+V_{H2}$ to the potential $V_2$. As a result, the transistors 102 and 103 are turned on, the electrical continuity between the bit line BL and the power supply line SL is established, the bit line BL discharges electric charge, and the potential of the bit line BL is decreased.

In the period p5, a potential applied to the node FN1 is lower than a potential applied to the node FN2; thus, the absolute value of $V_{GS}$ of the transistor 102 is larger than that of the transistor 103. That is, the transistor 102 has lower channel resistance and higher on-state current than the transistor 103. Thus, when discharging of the bit line BL is started, $V_{GS}$ of the transistor 103 reaches the threshold voltage before $V_{GS}$ of the transistor 102, and the transistor 103 is turned off before the transistor 102.

When the transistor 103 is turned off, the bit line BL converges on a constant potential (potential $V_2'$). The potential $V_2'$ is substantially equal to a potential obtained by subtracting the threshold voltage of the transistor 103 from the potential of the node FN2. That is, the potential of the node FN2 can be reflected in the potential $V_2'$ of the bit line BL. When the difference in the potential is used to determine the data, the multilevel data written to the node FN2 can be read.

Note that at the time T12, the potential of the word line WLOS1 is changed from an L level to $-V_{L1}$. Thus, a potential change in the bit line BL or the node FN2 prevents the transistor 105 from being turned on.

Next, at the time T13, the bit line BL is initialized to $V_{GND}$, the potentials of all the word lines and the nodes FN1 and FN2 are returned to the potentials in the period p3 to turn off the transistors 102 and 103, and the potentials of the nodes FN1 and FN2 are retained.

As described above, multilevel data written to the nodes FN1 and FN2 can be read by read operation described with reference to the timing chart in FIG. 3.

For example, the case where 8-bit data, that is, a 256-level ($=2^8$-level) potential is written to one node is described. In that case, when the width of a single-level potential is 0.17 V, the width of a potential applied to a node for retaining data is 0.17 V×256=43.52 V. In other words, applying a power supply potential of approximately 45 V to a memory cell is needed to store 8-bit data in one node. However, the value of the power supply potential is not realistic because it causes breakage of the transistor.

On the other hand, in the case where 8-bit data is written to the memory cell 100 in this embodiment, 8-bit data can be divided into two 4-bit data. One of the 4-bit data can be stored in the node FN1, and the other of the 4-bit data can be stored in the node FN2. Thus, a 16-level ($=2^4$-level) potential is stored in one node. When the width of a single-level potential is 0.17 V, the width of a potential applied to one node is 0.17 V x 16=2.72 V. This is a realistic value for driving the memory cell.

As described above, it is possible to provide a semiconductor device that stores 8-bit data by using the memory cell 100 according to one embodiment of the present invention.

The number of bits of data that can be stored in the memory cell 100 is not limited to 8 bits, and data with various bits can be stored in the memory cell 100. For example, in the case where M-bit ($2^M$ level) data is stored in the node FN1 and N-bit ($2^N$-level) data is stored in the node FN2, the memory cell 100 can store M+N-bit ($2^{M+N}$-level) data.

Figure 21A:
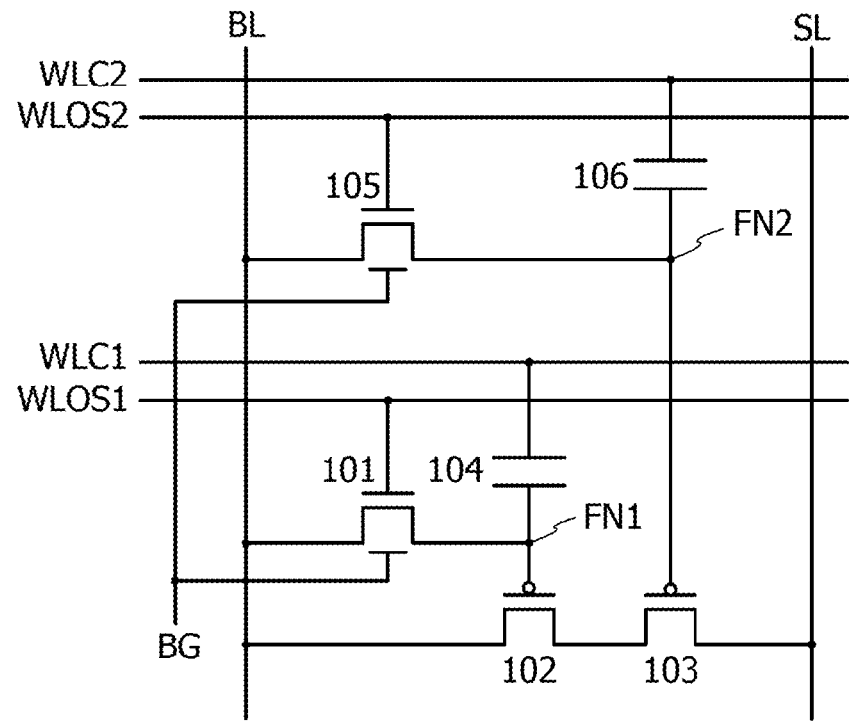
FIGS. 21A and 21B are circuit diagrams each illustrating a memory cell example.

In the memory cell 100 in FIG. 1, a common signal BG may be supplied to the second gates of the transistors 101 and 105, as illustrated in a circuit diagram in FIG. 21A.

Figure 22A:
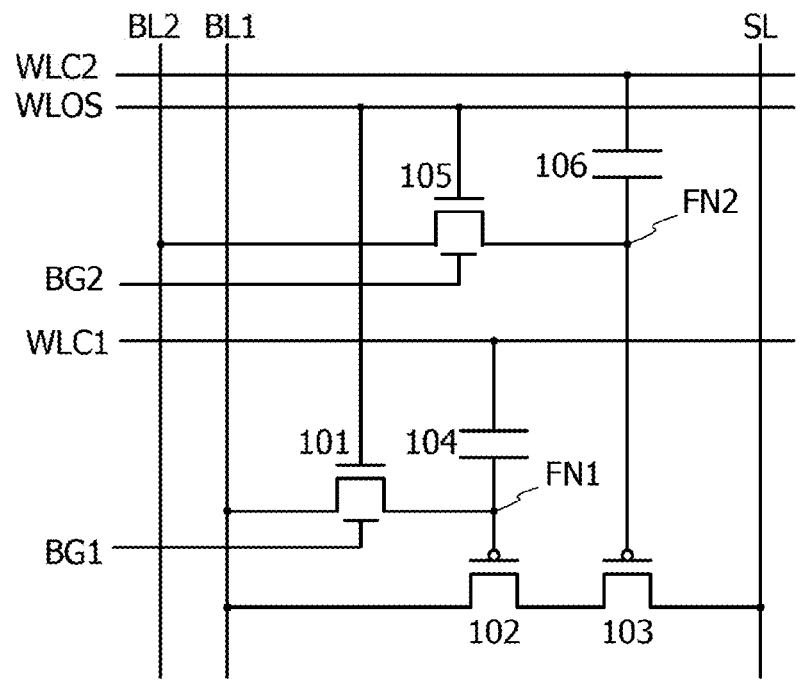
FIGS. 22A and 22B are circuit diagrams each illustrating a memory cell example.

The memory cell 100 in FIG. 1 may have a structure illustrated in a circuit diagram in FIG. 22A. The circuit diagram in FIG. 22A differs from the circuit diagram in FIG. 1 in that two bit lines BL1 and BL2 are provided and that the transistors 101 and 105 are connected to a common word line WLOS. In addition, as in FIG. 21A, a common signal may be supplied to the second gates of the transistors 101 and 105 in FIG. 22A. Furthermore, these second gates may be omitted depending on circumstances.

Figure 23A:
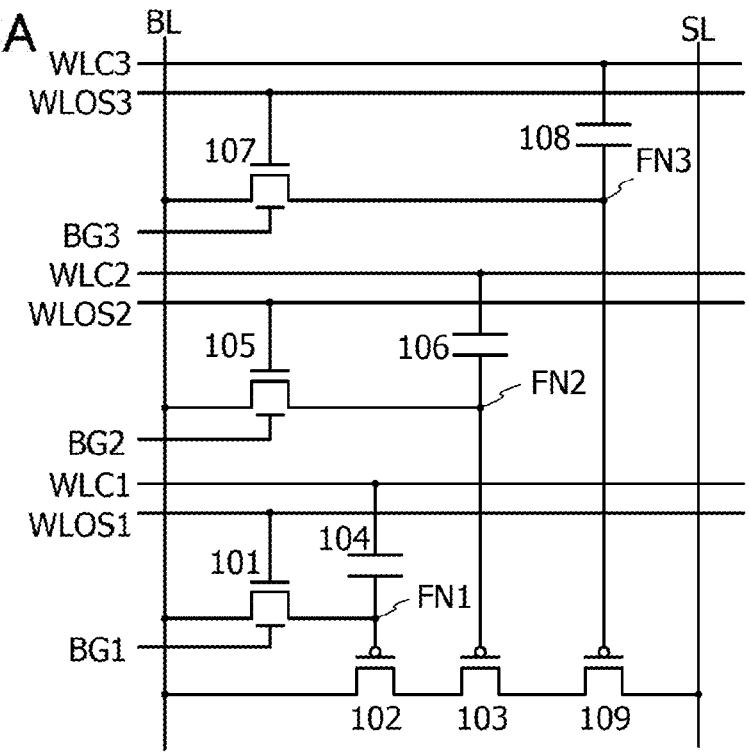
FIGS. 23A and 23B are circuit diagrams each illustrating a memory cell example.

The memory cell 100 in FIG. 1 may have a structure illustrated in a circuit diagram in FIG. 23A. The circuit diagram in FIG. 23A differs from the circuit diagram in FIG. 1 in that a transistor 107, a capacitor 108, a transistor 109, a node FN3, a word line WLOS3, and a word line WLC3 are provided. In addition, as in FIG. 21A, a common signal may be supplied to the second gates of the transistors 101, 105, and 107 in FIG. 23A. Furthermore, these second gates may be omitted depending on circumstances.

Note that the structures, the methods, and the like described in this embodiment can be combined with any of the structures, the methods, and the like described in the other embodiments as appropriate.

(Embodiment 2)

In this embodiment, a circuit structure and operation of a memory cell included in a semiconductor device according to one embodiment of the present invention are described with reference to FIG. 4, FIG. 5, and FIG. 6.

<Structure example of memory cell>

Figure 4:
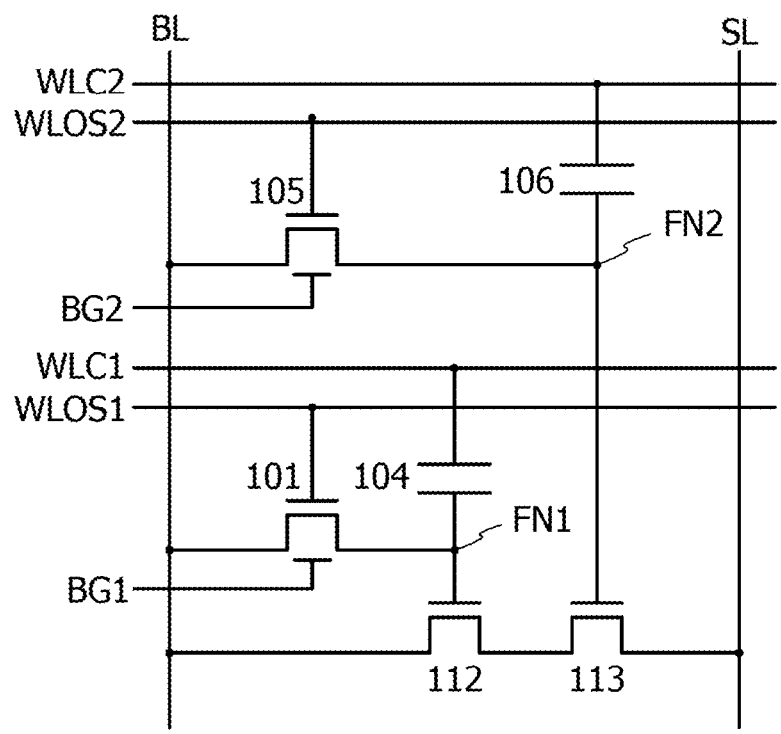
FIG. 4 is a circuit diagram illustrating a memory cell example.

FIG. 4 is a circuit diagram of a memory cell 110 according to one embodiment of the present invention.

The memory cell 110 in FIG. 4 includes the transistor 101, a transistor 112, a transistor 113, the capacitor 104, the transistor 105, the capacitor 106, the node FN1, and the node FN2. The memory cell 110 is electrically connected to the bit line BL, the power supply line SL, the word line WLC1, the word line WLOS1, the word line WLC2, and the word line WLOS2.

In the memory cell 110, the transistors 102 and 103 in the memory cell 100 described in Embodiment 1 are replaced with the transistors 112 and 113. Furthermore, the transistors 101, 112, 113, and 105 are n-channel transistors in the following description.

The transistors 112 and 113 have a function of making current flow between the bit line BL and the power supply line SL in accordance with the potentials of the nodes FN1 and FN2.

The transistors 112 and 113 are preferably transistors with little variation in threshold voltage. Here, transistors with little variation in threshold voltage refer to transistors fabricated in the same process to have an acceptable threshold voltage difference of 100 mV or less, and are specifically transistors including single crystal silicon in channels.

For the other components of the memory cell 110, the description of the memory cell 100 may be referred to.

<Timing chart>

Next, an operation example of the memory cell 110 is described with reference to timing charts in FIG. 5 and FIG. 6.

Figure 5:
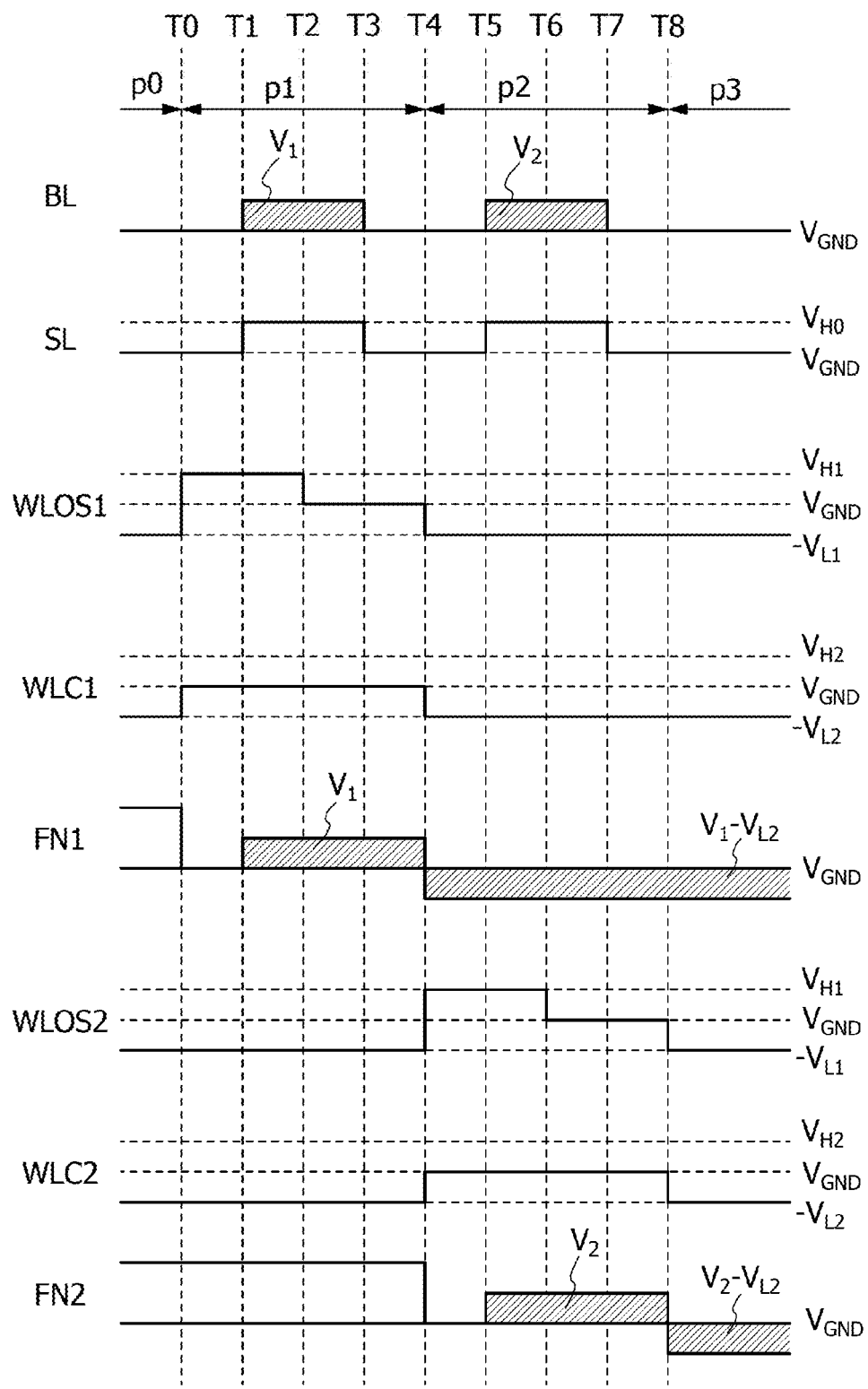
FIG. 5 is a timing chart illustrating a memory cell operation example.
Figure 6:
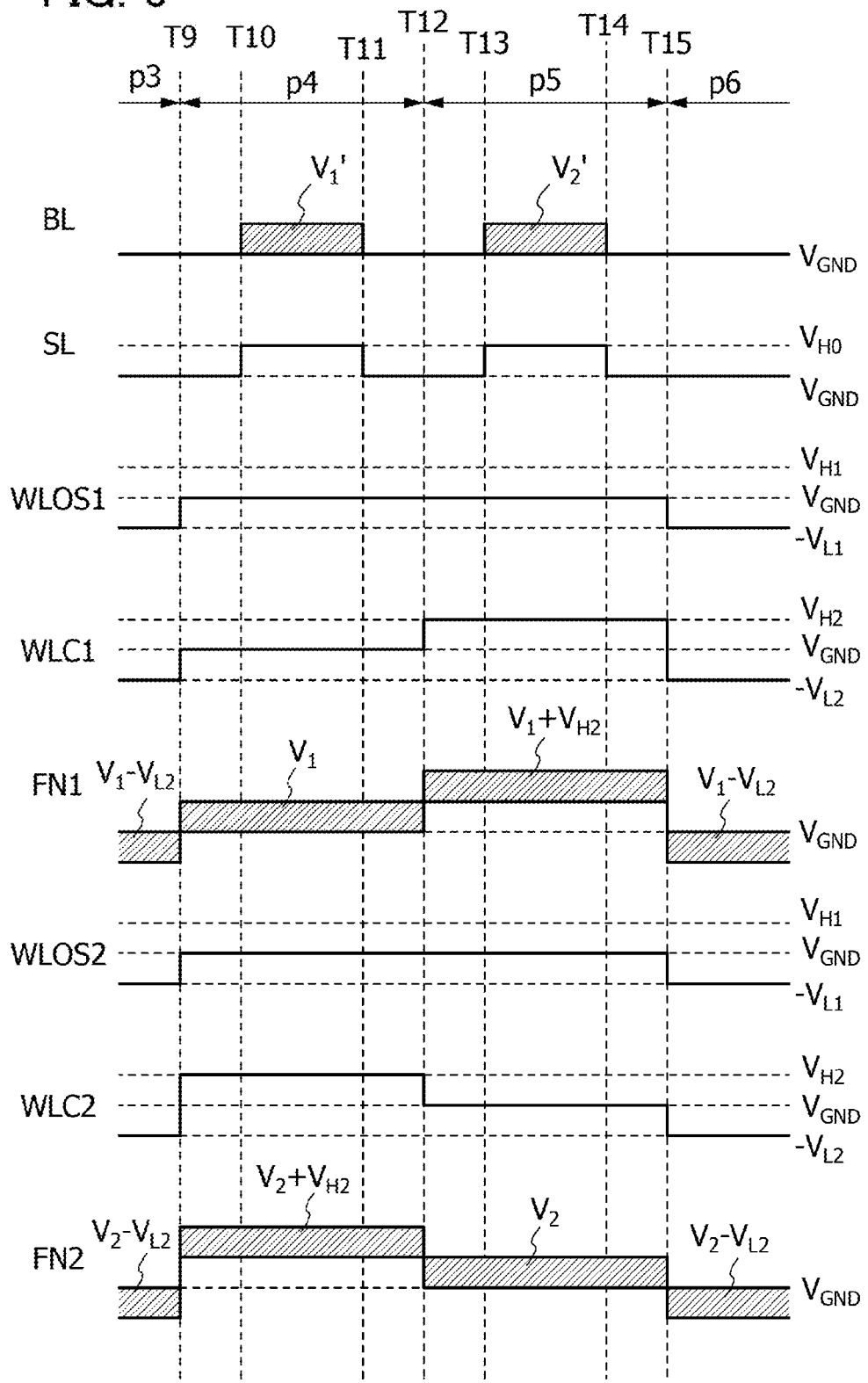
FIG. 6 is a timing chart illustrating a memory cell operation example.

The timing charts in FIG. 5 and FIG. 6 show potential changes in the bit line BL, the power supply line SL, the word line WLOS1, the word line WLC1, the node FN1, the word line WLOS2, the word line WLC2, and the node FN2 in the memory cell 110. FIG. 5 is a timing chart when data is written to the memory cell 110, and FIG. 6 is a timing chart when the data written to the memory cell 110 in FIG. 5 is read.

In FIG. 5 and FIG. 6, a potential $V_{H0}$ is applied to the power supply line SL as a high power supply potential, and the potential $V_{GND}$ is applied to the power supply line SL as a low power supply potential. Note that the potential $V_{GND}$ may be the ground potential GND. In addition, the potential $V_{H0}$ and the potential $V_{GND}$ are referred to as an H-level potential and an L-level potential, respectively, in some cases.

In FIG. 5 and FIG. 6, the potential $V_{H1}$ is applied to the word lines WLOS1 and WLOS2 as a high power supply potential, and the potential $V_{GND}$ is applied to the word lines WLOS1 and WLOS2 as a low power supply potential. Note that the potential $V_{GND}$ may be the ground potential GND. In addition, the potential $V_{H1}$ and the potential $V_{GND}$ are referred to as an H-level potential and an L-level potential, respectively, in some cases. Furthermore, the potential $-V_{L1}$ that is lower than the potential $V_{GND}$ is applied to the word lines WLOS1 and WLOS2 in some cases. The potential $-V_{L1}$ is preferably a negative potential ($-V_{L1}<0$ V).

In FIG. 5 and FIG. 6, the potential $V_{H2}$ is applied to the word lines WLC1 and WLC2 as a high power supply potential, and the potential $V_{GND}$ is applied to the word lines WLC1 and WLC2 as a low power supply potential. Note that the potential $V_{GND}$ may be the ground potential GND. In addition, the potential $V_{H2}$ and the potential $V_{GND}$ are referred to as an H-level potential and an L-level potential, respectively, in some cases. Furthermore, the potential $-V_{L2}$ that is lower than the potential $V_{GND}$ is applied to the word lines WLC1 and WLC2 in some cases. The potential $-V_{L2}$ is preferably a negative potential ($-V_{L2}$<0 V).

<Write Operation>

A write operation example of the memory cell 110 is described with reference to the timing chart in FIG. 5.

FIG. 5 shows the four periods p0 to p3. The period p0 is the initial period; the period p1 is the period during which data is written to the node FN1; the period p2 is the period during which data is written to the node FN2; and the period p3 is the period during which written data is retained. The times T0 to T8 in FIG. 5 are used to describe operation timing.

First, in the period p0, the bit line BL and the power supply line SL are initialized to $V_{GND}$; the potential $-V_{L1}$ is applied to the word line WLOS1; the potential $-V_{L2}$ is applied to the word line WLC1; the potential $-V_{L1}$ is applied to the word line WLOS2; and the potential $-V_{L2}$ is applied to the word line WLC2.

Next, at the time T0, an H-level potential is applied to the word line WLOS1, and an L-level potential is applied to the word line WLC1. At this time, the transistor 101 is turned on, the electrical continuity between the bit line BL and the node FN1 is established, and the node FN1 is initialized to the potential $V_{GND}$.

Next, at the time T1, the potential $V_1$ is applied to the bit line BL, and since the electrical continuity between the bit line BL and the node FN1 is established, the potential $V_1$ is also applied to the node FN1.

Note that portions indicated by hatching patterns in the timing charts of FIG. 5 and FIG. 6 represent application of potentials indicated by the hatching patterns, that is, supply of multilevel data. For example, in the case where 4-bit data is written to the node FN1, the potential $V_1$ can be a $2^4$-level (=16-level) potential.

At the time T1, to keep the transistor 112 off, an H-level potential is applied to the power supply line SL. At this time, the potential $V_{H0}$ applied to the power supply line SL is preferably higher than the potential $V_1$ applied to the bit line BL and the node FN1. When the potential $V_{H0}$ satisfies the above condition, $V_{GS}$ of the transistor 112 can be held at 0 V.

Next, at the time T2, an L-level potential is applied to the word line WLOS1 and the transistor 101 is turned off.

Then, at the time T3, the bit line BL and the power supply line SL are initialized to the potential $V_{GND}$. At this time, the node FN1 becomes electrically floating and retains the potential $V_1$.

Next, at the time T4, an H-level potential is applied to the word line WLOS2, and an L-level potential is applied to the word line WLC2. At this time, the transistor 105 is turned on, electrical continuity between the bit line BL and the node FN2 is established, and the node FN2 is initialized to the potential $V_{GND}$.

At the time T4, the potential $-V_{L2}$ is applied to the word line WLC1, and the potential $V_1$-$V_{L2}$ is applied to the node FN1. When the potential of the node FN1 is kept low, the n-channel transistor 112 is kept in an off state and leakage current is prevented from flowing between the bit line BL and the power supply line SL. At this time, the potential $-V_{L1}$ is applied to the word line WLOS1 to prevent the transistor 101 from being turned on.

Note that to transfer the potential of the word line WLC1 to the node FN1 through the capacitor 104, the capacitance of the capacitor 104 is preferably much higher than the gate capacitance of the transistor 101, and the capacitance of the capacitor 104 is preferably much higher than the gate capacitance of the transistor 112. In this embodiment, to simplify the description, a potential applied to the word line WLC1 is directly transferred to the node FN1 (for example, when the potential of the word line WLC1 is changed from $V_{GND}$ to the potential $-V_{L2}$, the potential of the node FN1 is changed from the potential $V_1$ to the potential $V_1$-$V_{L2}$). However, a potential applied to the word line WLC1 is not directly transferred to the node FN1 depending on the magnitude relationship between the capacitance of the capacitor 104, the gate capacitance of the transistor 101, and the gate capacitance of the transistor 112.

Then, at the time T5, the potential V2 is applied to the bit line BL and written to the node FN2. Note that the potential V2 can be multilevel data. For example, in the case where 4-bit data is written to the node FN2, the potential $V_2$ can be a $2^4$-level (=16-level) potential.

At the time T5, to keep the transistor 113 off, an H-level potential is applied to the power supply line SL. At this time, the potential $V_{H0}$ applied to the power supply line SL is preferably higher than the potential $V_2$ applied to the bit line BL and the node FN1. When the potential $V_{H0}$ satisfies the above condition, $V_{GS}$ of the transistor 113 is held at 0 V.

Next, at the time T6, an L-level potential is applied to the word line WLOS2 and the transistor 105 is turned off.

Then, at the time T7, the bit line BL and the power supply line SL are initialized to the potential $V_{GND}$. At this time, the node FN2 is in an electrically floating state and thus retains the potential $V_2$.

Next, at the time T8, the potential $-V_{L2}$ is applied to the word line WLC2, and the potential $V_2$-$V_{L2}$ is applied to the node FN2. When the potential of the node FN2 is kept low, the n-channel transistor 113 is kept in an off state and leakage current is prevented from flowing between the bit line BL and the power supply line SL. The potential $-V_{L1}$ is applied to the word line WLOS2 to prevent the transistor 105 from being turned on.

Note that to transfer the potential of the word line WLC2 to the node FN2 through the capacitor 106, the capacitance of the capacitor 106 is preferably much higher than the gate capacitance of the transistor 105, and the capacitance of the capacitor 106 is preferably much higher than the gate capacitance of the transistor 113. In this embodiment, to simplify the description, a potential applied to the word line WLC2 is directly transferred to the node FN2 (for example, when the potential of the word line WLC2 is changed from $V_{GND}$ to the potential $-V_{L2}$, the potential of the node FN2 is changed from the potential $V_2$ to the potential $V_2$-$V_{L2}$). However, a potential applied to the word line WLC2 is not directly transferred to the node FN2 depending on the magnitude relationship between the capacitance of the capacitor 106, the gate capacitance of the transistor 105, and the gate capacitance of the transistor 113.

In the period p3 after the time T8, the data written to the nodes FN1 and FN2 is retained.

As described above, multilevel data can be written to the nodes FN1 and FN2 by write operation described with reference to the timing chart in FIG. 5.

Note that in the period p1, the potential $V_{H1}$ applied to the word line WLOS1 is preferably higher than the sum of the potential $V_1$ and the threshold voltage of the transistor 101.

Similarly, in the period p2, the potential $V_{H1}$ applied to the word line WLOS2 is preferably higher than the sum of the potential $V_2$ and the threshold voltage of the transistor 105.

<Read Operation>

Operation of reading data written to the memory cell 110 is described with reference to the timing chart in FIG. 6.

FIG. 6 shows four periods p3 to p6. The period p3 is a period during which data is retained from the period p3 in FIG. 5; the period p4 is a period during which data is read from the node FN1; the period p5 is a period during which data is read from the node FN2; and the period p6 is a period during which data is retained. Times T9 to T15 in FIG. 6 are used to describe operation timing.

First, at the time T9, an L-level potential is applied to the word line WLOS1, an L-level potential is applied to the word line WLC1, and the potential of the node FN1 is increased from the potential $V_1-V_{L2}$ to the potential $V_1$ by capacitive coupling. When the potential of the node FN1 is increased, $V_{GS}$ of the n-channel transistor 112 becomes large and the transistor 112 is turned on.

In addition, at the time T9, an L-level potential is applied to the word line WLOS2, an H-level potential is applied to the word line WLC2, and the potential of the node FN2 is increased from the potential $V_2-V_{L2}$ to the potential $V_2+V_{H2}$ by capacitive coupling. When the potential of the node FN2 is increased, $V_{GS}$ of the n-channel transistor 113 becomes large and the transistor 113 is turned on.

Then, at the time T10, the bit line BL is brought into an electrically floating state. That is, the potential of the bit line BL is changed by charging or discharging of electrical charge. This state can be achieved by turning off the switch for supplying a potential to the bit line BL.

In addition, at the time T10, an H-level potential is applied to the power supply line SL. When an H-level potential is applied to the power supply line SL, a potential difference is generated between the bit line BL and the power supply line SL, and current flows from the power supply line SL to the bit line BL. The bit line BL is charged and the potential of the bit line BL is increased.

When the potential of the bit line BL is increased by charging, $V_{GS}$ of the transistor 112 and $V_{GS}$ of the transistor 113 are decreased. Charging is completed when $V_{GS}$ of one of the transistors 112 and 113 becomes equal to the threshold voltage of the transistor, and the potential of the bit line BL converges on a constant potential. In the period p4, a potential applied to the node FN2 is higher than a potential applied to the node FN1; thus, $V_{GS}$ of the transistor 113 is higher than that of the transistor 112. That is, the transistor 113 has lower channel resistance and higher on-state current than the transistor 112. Thus, when charging of the bit line BL is started, $V_{GS}$ of the transistor 112 reaches the threshold voltage before $V_{GS}$ of the transistor 113, and the transistor 112 is turned off before the transistor 113.

When the transistor 112 is turned off, the bit line BL converges on a constant potential (potential $V_1'$). The potential $V_1'$ is substantially equal to a potential obtained by subtracting the threshold voltage of the transistor 112 from the potential of the node FN1. That is, the potential of the node FN1 is reflected in the potential $V_1'$ of the bit line BL. When the difference in the potential is used to determine the data, the multilevel data written to the node FN1 can be read.

Then, at the time T11, the bit line BL and the power supply line SL are initialized to the potential $V_{GND}$.

Next, at the time T12, an H-level potential is applied to the word line WLC1, and the potential of the node FN1 is increased from the potential $V_1$ to the potential $V_1+V_{H2}$ by capacitive coupling. At the same time, an L-level potential is applied to the word line WLC2, and the potential of the node FN2 is decreased from the potential $V_2+VH_2$ to the potential $V_2$. The transistors 112 and 113 are turned on.

Then, at the time T13, the bit line BL is brought into an electrically floating state.

In addition, at the time T13, an H-level potential is applied to the power supply line SL. When the potential of the power supply line SL is set to an H level, a potential difference is generated between the bit line BL and the power supply line SL, and current flows from the power supply line SL to the bit line BL. The bit line BL is charged and the potential of the bit line BL is increased.

When the potential of the bit line BL is increased by charging, $V_{GS}$ of the transistor 112 and $V_{GS}$ of the transistor 113 are decreased. Charging is completed when $V_{GS}$ of one of the transistors 112 and 113 becomes equal to the threshold voltage of the transistor, and the potential of the bit line BL converges on a constant potential. In the period p5, a potential applied to the node FN1 is higher than a potential applied to the node FN2; thus, $V_{GS}$ of the transistor 112 is higher than that of the transistor 113. That is, the transistor 112 has lower channel resistance and higher on-state current than the transistor 113. Thus, when charging of the bit line BL is started, $V_{GS}$ of the transistor 113 reaches the threshold voltage before $V_{GS}$ of the transistor 112, and the transistor 113 is turned off before the transistor 112.

When the transistor 113 is turned off, the bit line BL converges on a constant potential (potential $V_2'$). The potential $V_2'$ is substantially equal to a potential obtained by subtracting the threshold voltage of the transistor 113 from the potential of the node FN2. That is, the potential of the node FN2 can be reflected in the potential $V2'$ of the bit line BL. When the difference in the potential is used to determine the data, the multilevel data written to the node FN2 can be read.

Then, at the time T14, the bit line BL and the power supply line SL are initialized to the potential $V_{GND}$.

Next, at the time T15, the same potentials as those in the period p3 are applied to all the wirings and nodes in FIG. 6, and the potentials of the nodes FN1 and FN2 are retained.

As described above, multilevel data written to the nodes FN1 and FN2 can be read by read operation described with reference to the timing chart in FIG. 6.

For example, the case where 8-bit data, that is, a 256-level ($=2^8$-level) potential is written to one node is described. In that case, when the width of a single-level potential is 0.17 V, the width of a potential applied to a node for retaining data is 0.17 V ×256=43.52 V. In other words, applying a power supply potential of approximately 45 V to a memory cell is needed to store 8-bit data in one node. However, the value of the power supply potential is not realistic because it causes breakage of the transistor.

On the other hand, in the case where 8-bit data is written to the memory cell 110 in this embodiment, 8-bit data can be divided into two 4-bit data. One of the 4-bit data can be stored in the node FN1, and the other of the 4-bit data can be stored in the node FN2. Thus, a 16-level ($=2^4$-level) potential is stored in one node. When the width of a single-level potential is 0.17 V, the width of a potential applied to one node is 0.17 V×16=2.72 V. This is a realistic value for driving the memory cell.

As described above, it is possible to provide a semiconductor device that stores 8-bit data by using the memory cell 110 according to one embodiment of the present invention. The number of bits of data that can be stored in the memory cell 110 is not limited to 8 bits, and data with various bits can be stored in the memory cell 110. For example, in the case where M-bit ($2^M$ level) data is stored in the node FN1 and N-bit ($2^N$-level) data is stored in the node FN2, the memory cell 110 can store M+N-bit ($2^{M+N}$-level) data.

Figure 21B:
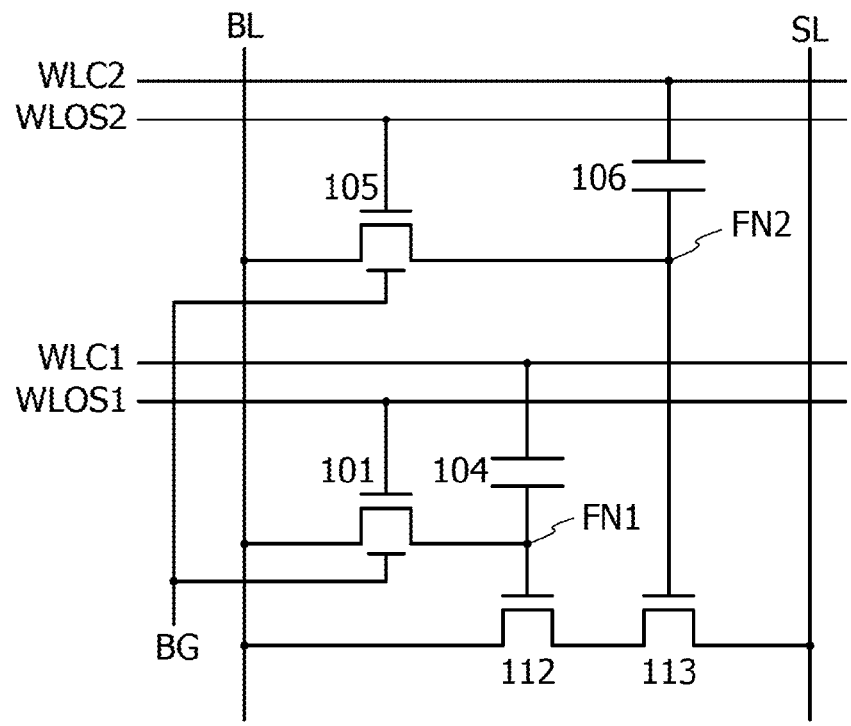

In the memory cell 110 in FIG. 4, the common signal BG may be supplied to the second gates of the transistors 101 and 105, as illustrated in a circuit diagram in FIG. 21B.

Figure 22B:
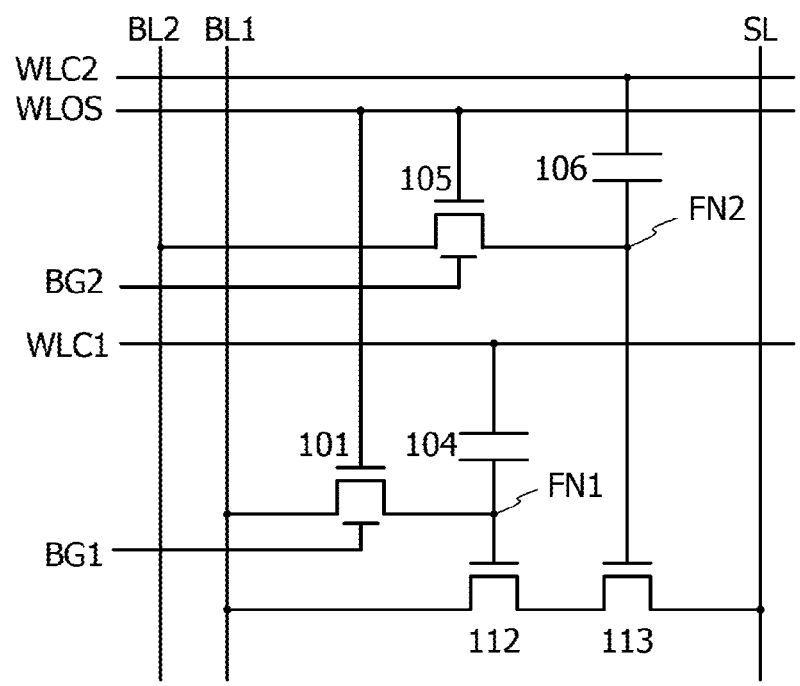

The memory cell 110 in FIG. 4 may have a structure illustrated in a circuit diagram in FIG. 22B. The circuit diagram in FIG. 22B differs from the circuit diagram in FIG. 4 in that two bit lines BL1 and BL2 are provided and that the transistors 101 and 105 are connected to the common word line WLOS. In addition, as in FIG. 21B, a common signal may be supplied to the second gates of the transistors 101 and 105 in FIG. 22B. Furthermore, these second gates may be omitted depending on circumstances.

Figure 23B:
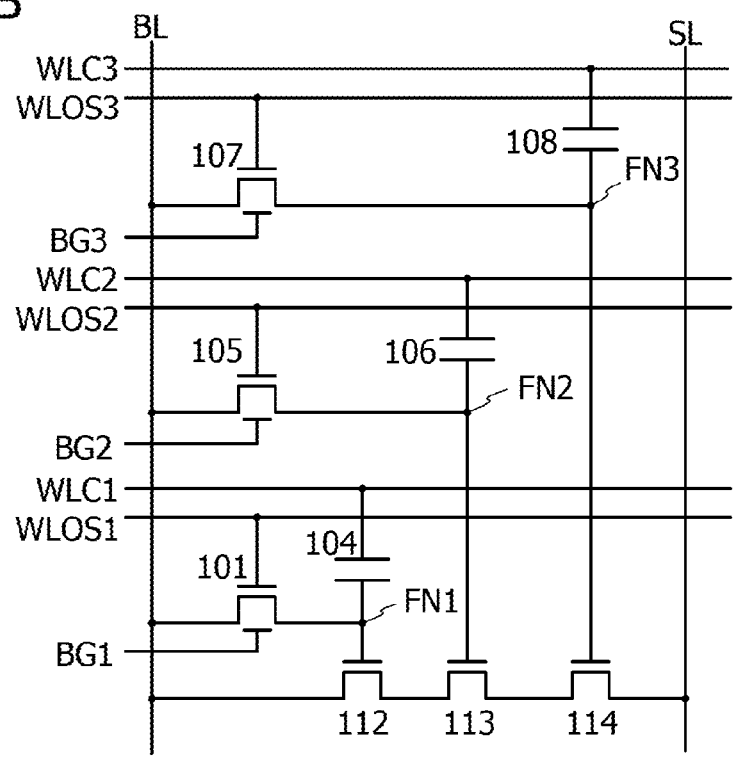

The memory cell 110 in FIG. 4 may have a structure illustrated in a circuit diagram in FIG. 23B. The circuit diagram in FIG. 23B differs from the circuit diagram in FIG. 4 in that the transistor 107, the capacitor 108, a transistor 114, the node FN3, the word line WLOS3, and the word line WLC3 are provided. In addition, as in FIG. 21B, a common signal may be supplied to the second gates of the transistors 101, 105, and 107 in FIG. 23B. Furthermore, these second gates may be omitted depending on circumstances.

Note that in this embodiment, one embodiment of the present invention has been described. Other embodiments of the present invention are described in Embodiment 1 and Embodiments 3 to 7. Note that one embodiment of the present invention is not limited to the above examples. The example in which one embodiment of the present invention is applied to a memory cell is described; however, one embodiment of the present invention is not limited thereto. For example, one embodiment of the present invention is not necessarily applied to a memory cell depending on circumstances or conditions. One embodiment of the present invention may be applied to a circuit having another function, for example.

Note that the structures, the methods, and the like described in this embodiment can be combined with any of the structures, the methods, and the like described in the other embodiments as appropriate.

(Embodiment 3)

In this embodiment, an example of a semiconductor device that can be driven by the driving method in Embodiment 1 is described with reference to drawings.

<Structure Example of Semiconductor Device>

Figure 7:
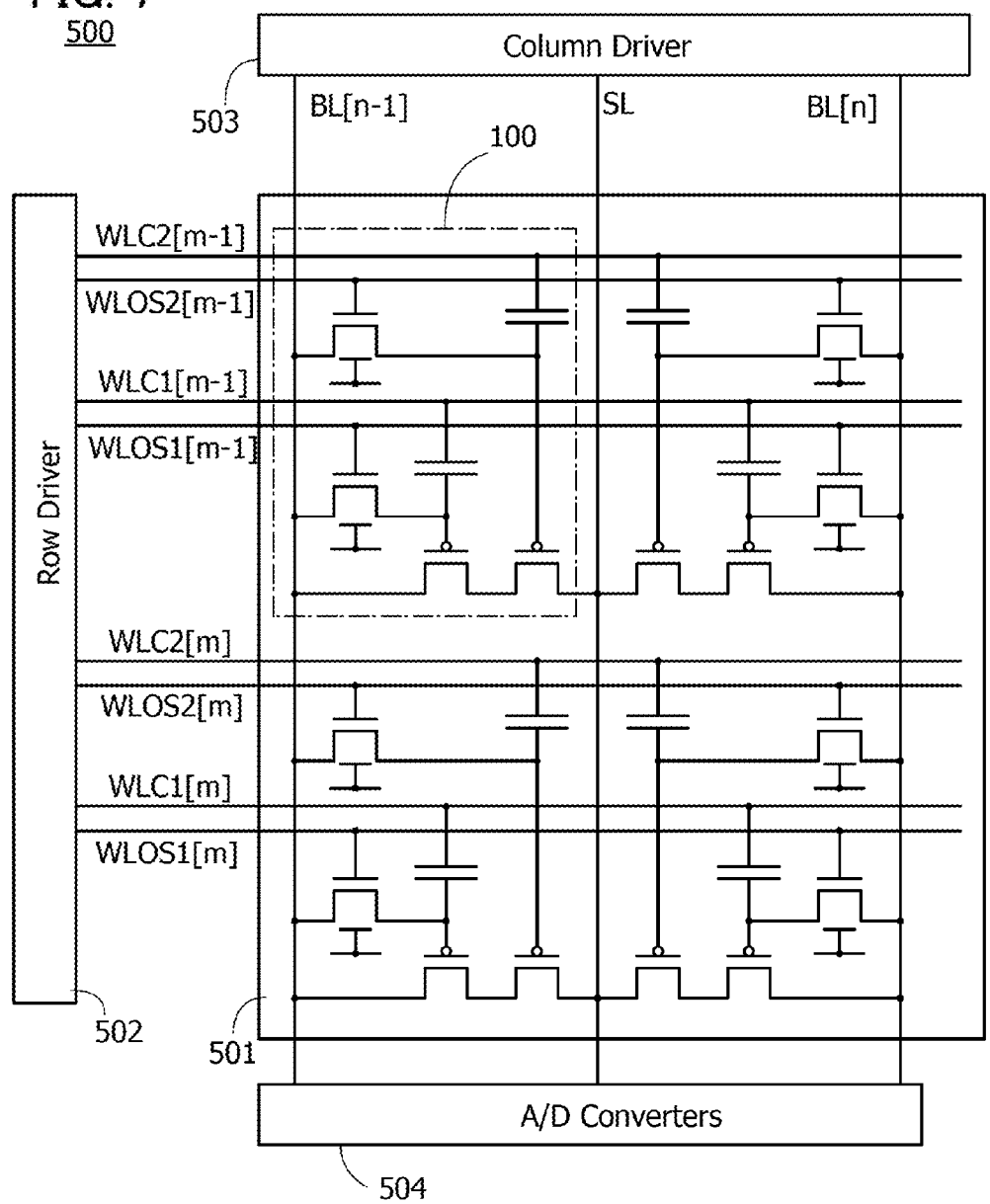
FIG. 7 is a circuit block diagram illustrating a semiconductor device example.

FIG. 7 is a block diagram illustrating a structure example of a semiconductor device including the memory cell 100 described in Embodiment 1.

A semiconductor device 500 in FIG. 7 includes a memory cell array 501 having a plurality of memory cells 100 in FIG. 1, a row driver 502, a column driver 503, and A/D converters 504. The semiconductor device 500 includes the memory cells 100 arranged in a matrix of m rows (m is a natural number of two or more) and n columns (n is a natural number of two or more). In FIG. 7, a word line WLOS1[m−1], a word line WLC1[m−1], a word line WLOS2[m−1], and a word line WLC2[m−1] are illustrated as word lines connected to the memory cell 100 in an (m−1)th row; a word line WLOS1 [m], a word line WLC1[m], a word line WLOS2[m], and a word line WLC2[m] are illustrated as word lines connected to the memory cell 100 in an m-th row; a bit line BL[n−1] and a bit line BL[n] are illustrated as a bit line connected to the memory cell 100 in an (n−1)th column and a bit line connected to the memory cell 100 in an n-th column, respectively; and the power supply line SL connected to the memory cells 100 in the (n−1)th column and the n-th column is illustrated.

In the memory cell array 501 in FIG. 7, the memory cells 100 in FIG. 4 are arranged in matrix. Note that the components of the memory cell 100 are similar to those in FIG. 4; thus, the description of the components is omitted here and the description of FIG. 4 is referred to.

In the memory cell array 501 shown in FIG. 7, the power supply line SL is shared by adjacent memory cells. With such a structure, the area occupied by the power supply line SL is reduced. Thus, a semiconductor device with this structure can have high memory capacity per unit area.

The row driver 502 is a circuit having a function of selectively turning on the transistors 101 and 105 in the memory cells 100 of each row and a function of selectively changing the potentials of the nodes FN1 and FN2 in the memory cells 100 of each row. With the row driver 502, the memory cells 100 can be selected row by row, and data can be written and read to/from the selected memory cells 100 in the semiconductor device 500.

The column driver 503 is a circuit having functions of selectively writing data to the nodes FN1 and FN2 in the memory cells 100 of each column, initializing the potential of the bit line BL, and bringing the bit line BL into an electrically floating state. Specifically, the column driver 503 is a circuit that supplies a potential corresponding to multilevel data and the potential $V_{GND}$ to the bit line BL through a switch. With the column driver 503, the memory cells 100 can be selected column by column, and data can be written and read to/from the selected memory cells 100 in the semiconductor device 500.

The A/D converter 504 is a circuit having a function of converting the potential of the bit line BL that is an analog value into a digital value and outputting the digital value to the outside. Specifically, the A/D converter 504 is a flash A/D converter. The A/D converters 504 enable the semiconductor device 500 to output, to the outside, the potential of the bit line BL that corresponds to data read from the memory cell 100.

Note that the A/D converter 504 is described as a flash A/D converter. However, the A/D converter 504 may be a successive approximation A/D converter, a multi-slope A/D converter, or a delta-sigma A/D converter.

Figure 8:
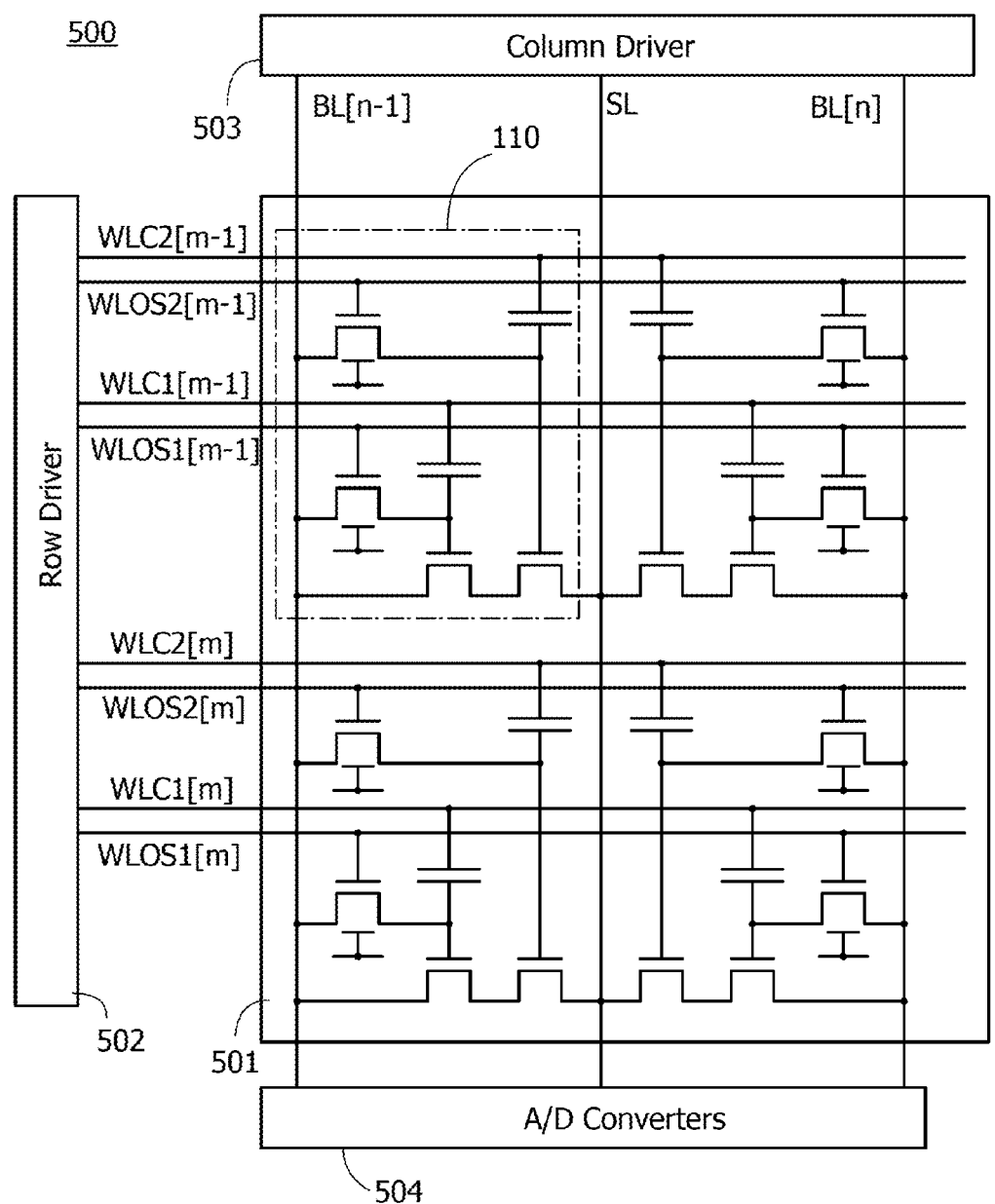
FIG. 8 is a circuit block diagram illustrating a semiconductor device example.

In FIG. 8, the memory cells 100 in FIG. 7 are replaced with the memory cells 110 described in Embodiment 2. The description of FIG. 7 can be referred to for the details of the memory cells 110.

Figure 24:
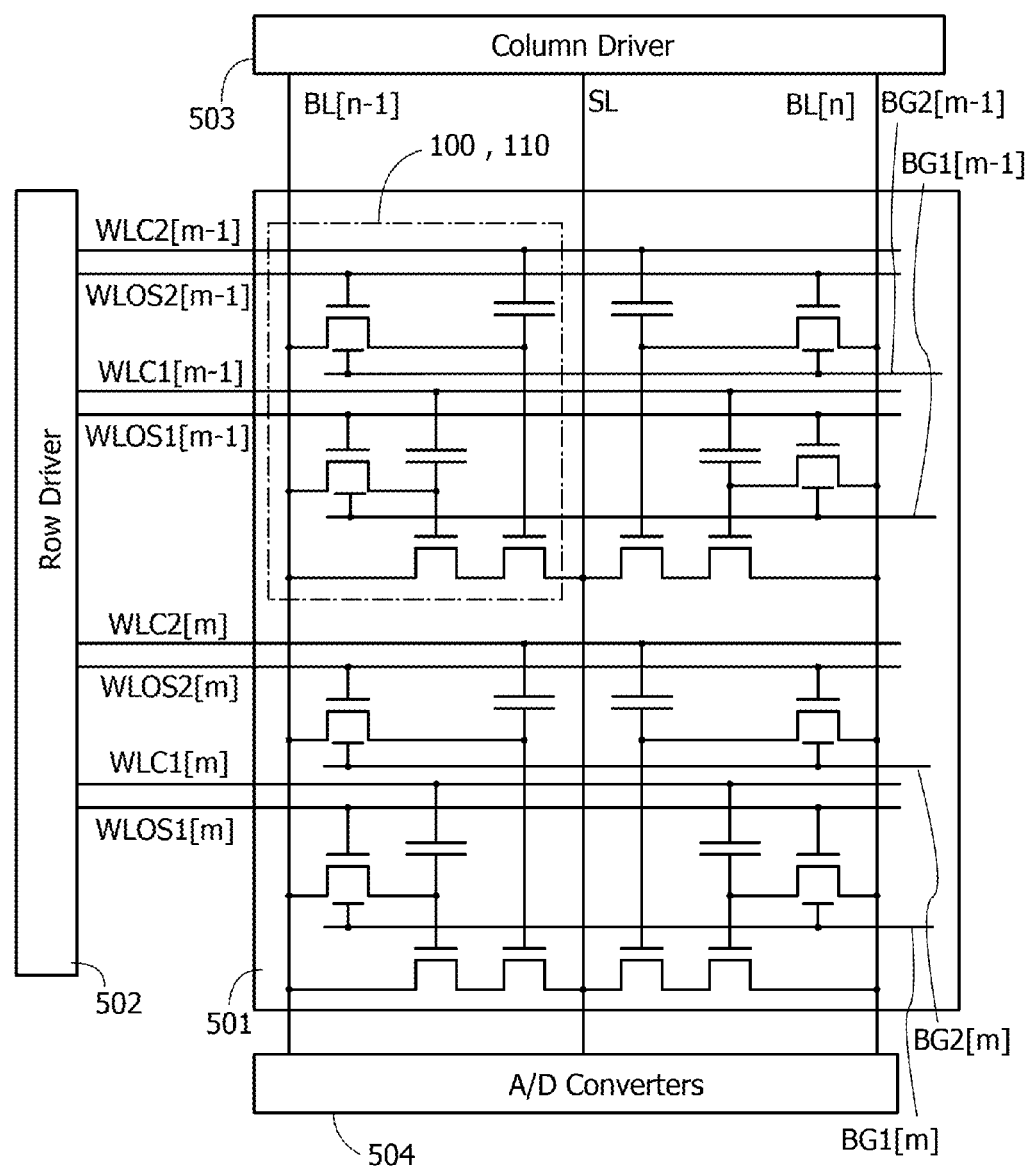
FIG. 24 is a circuit block diagram illustrating a semiconductor device example.

The semiconductor devices 500 in FIG. 7 and FIG. 8 may have a structure illustrated in a block diagram of FIG. 24. In the block diagram of FIG. 24, second gates of transistors connected to the same word line are connected to a common wiring. Second gates of transistors connected to the word line WLOS1[m−1] are connected to a wiring to which a signal BG1[m−1] is supplied. Second gates of transistors connected to the word line WLOS2[m−1] are connected to a wiring to which a signal BG2 [m−1] is supplied. Second gates of transistors connected to the word line WLOS1[m] are connected to a wiring to which a signal BG1[m] is supplied. Second gates of transistors connected to the word line WLOS2[m] are connected to a wiring to which a signal BG2[m] is supplied. The signal BG1[m−1] and the signal BG2[m−1] may be the same or different. Similarly, the signal BG1[m] and the signal BG2[m] may be the same or different.

Figure 25:
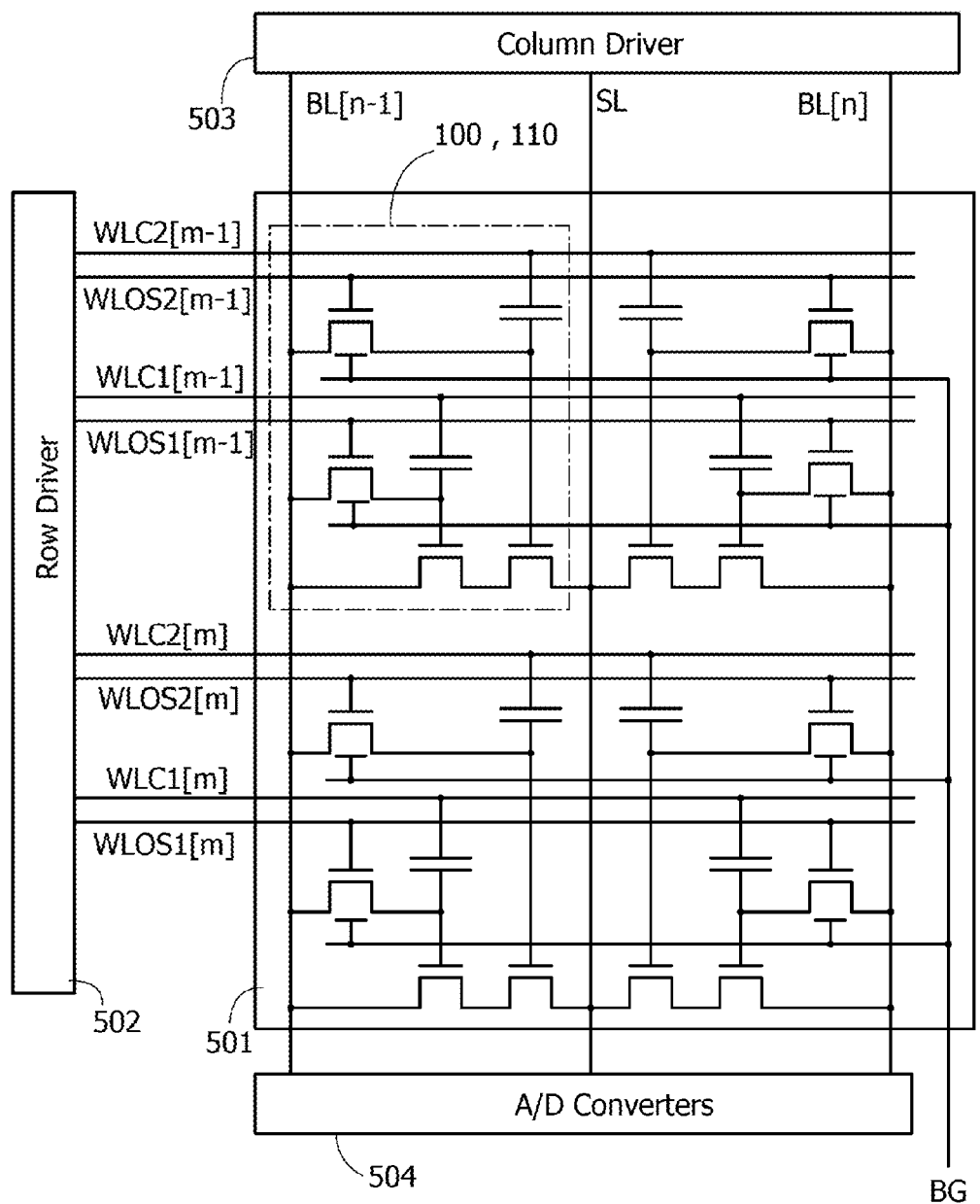
FIG. 25 is a circuit block diagram illustrating a semiconductor device example.

The semiconductor devices 500 in FIG. 7 and FIG. 8 may have a structure illustrated in a block diagram of FIG. 25. In the block diagram of FIG. 25, all the second gates included in the memory cell array 501 are connected to a common wiring, and the common signal BG is supplied to the second gates.

<Structure Example of Row Driver>

Figure 9:
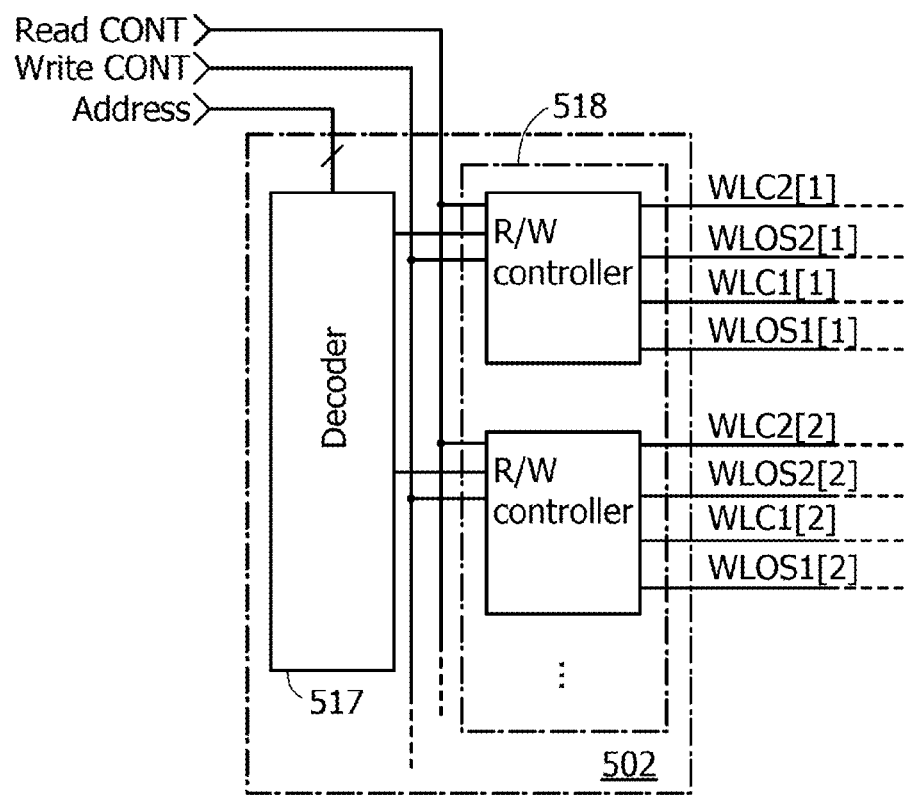
FIG. 9 is a circuit block diagram illustrating a row driver example.

FIG. 9 is a block diagram illustrating a structure example of the row driver 502 in FIG. 7 and FIG. 8.

The row driver 502 in FIG. 9 includes a decoder 517 and read/write controllers 518. The read/write controller 518 is connected to the word lines WLOS1, WLC1, WLOS2, and WLC2 and is provided in each row.

The decoder 517 is a circuit having a function of outputting a signal for selecting a row of word lines. Specifically, the decoder 517 receives an address signal (Address) and selects the read/write controller 518 in any of rows in accordance with the address signal Address. With the decoder 517, the row driver 502 can select a given row to write or read data.

The read/write controller 518 is a circuit having a function of outputting a write word signal and selectively outputting a read word signal, in a row including the write word lines selected by the decoder 517. Specifically, the read/write controller 518 is a circuit that receives a write control signal Write_CONT and a read control signal Read_CONT and selectively outputs a write word signal or a read word signal in accordance with the signal. With the read/write controllers 518, the row driver 502 can select and output the write word signal or the read word signal in the row selected by the decoder 517.

<Structure Example of Column Driver>

Figure 10:
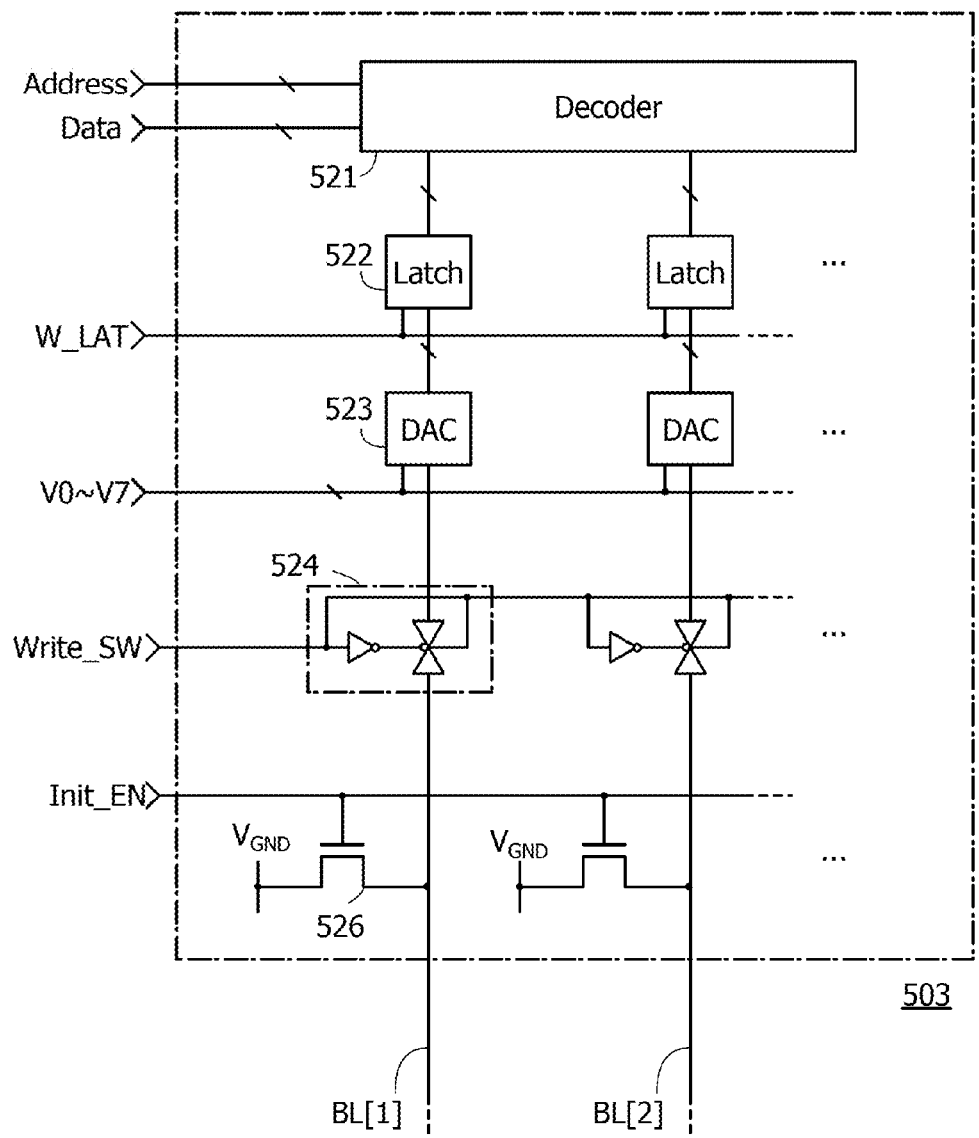
FIG. 10 is a circuit block diagram illustrating a column driver example.

FIG. 10 is a block diagram illustrating a structure example of the column driver 503 in FIG. 7 and FIG. 8.

The column driver 503 in FIG. 10 includes a decoder 521, latch circuits 522, D/A converters 523, switch circuits 524, and transistors 526. The latch circuit 522, the D/A converter 523, the switch circuit 524, and the transistor 525 are provided for each column. Furthermore, the switch circuit 524 and the transistor 526 in each column are connected to the bit line BL.

The decoder 521 is a circuit having a function of selecting a column of the bit line BL and sorting and outputting input data. Specifically, the decoder 521 receives an address signal (Address) and data (Data) and outputs the data Data to the latch circuit 522 of any of columns in accordance with the address signal Address. The decoder 521 allows the column driver 503 to select a given column and write data.

Note that the data Data input to the decoder 521 is k-bit digital data. The k-bit digital data is a signal represented by binary data of '1' or '0' for each bit. Specifically, 2-bit digital data is data represented by '00', '01', '10', and '11'.

The latch circuit 522 has a function of temporarily storing the input data Data. Specifically, the latch circuit 522 is a flip-flop circuit that receives a latch signal W_LAT, stores the data Data, and outputs the data Data to the D/A converter 523 in accordance with the latch signal W_LAT. The latch circuit 522 enables the column driver 503 to write data at an opportune time.

The D/A converter 523 is a circuit having a function of converting input digital data (Data) into analog data ($V_{data}$). Specifically, the D/A converter 523 converts 3-bit data Data, for example, into one of eight potentials (V0 to V7) and outputs the potential to the switch circuit 524. The D/A converter 523 allows the column driver 503 to convert data to be written to the memory cell 110 into a potential corresponding to multilevel data.

Note that the data $V_{data}$ output from the D/A converter 523 are represented by different voltage levels. For example, 2-bit data $V_{data}$ is represented by any of the four voltage levels (0.5 V, 1.0 V, 1.5 V, and 2.0 V).

The switch circuit 524 has a function of supplying the input data $V_{data}$ to the bit line BL and a function of bringing the bit line BL into an electrically floating state. Specifically, the switch circuit 524 includes an analog switch and an inverter. The switch circuit 524 supplies the data $V_{data}$ to the bit line BL in accordance with a switch control signal Write_SW, and then makes the bit line BL electrically floating by turning off the analog switch. The switch circuit 524 enables the column driver 503 to keep the bit line BL in an electrically floating state after the data $V_{data}$ is supplied to the bit line BL.

The transistor 526 has a function of supplying a potential $V_{GND}$ to the bit line BL and a function of bringing the bit line BL into an electrically floating state. Specifically, the transistor 526 is a switch that supplies the potential $V_{GND}$ to the bit line BL in accordance with an initialization control signal Init_EN, and then brings the bit line BL into an electrically floating state. The transistor 526 enables the column driver 503 to keep the bit line BL in an electrically floating state after the potential $V_{GND}$ is applied to the bit line BL.

<Structure Example of A/D Converter>

Figure 11:
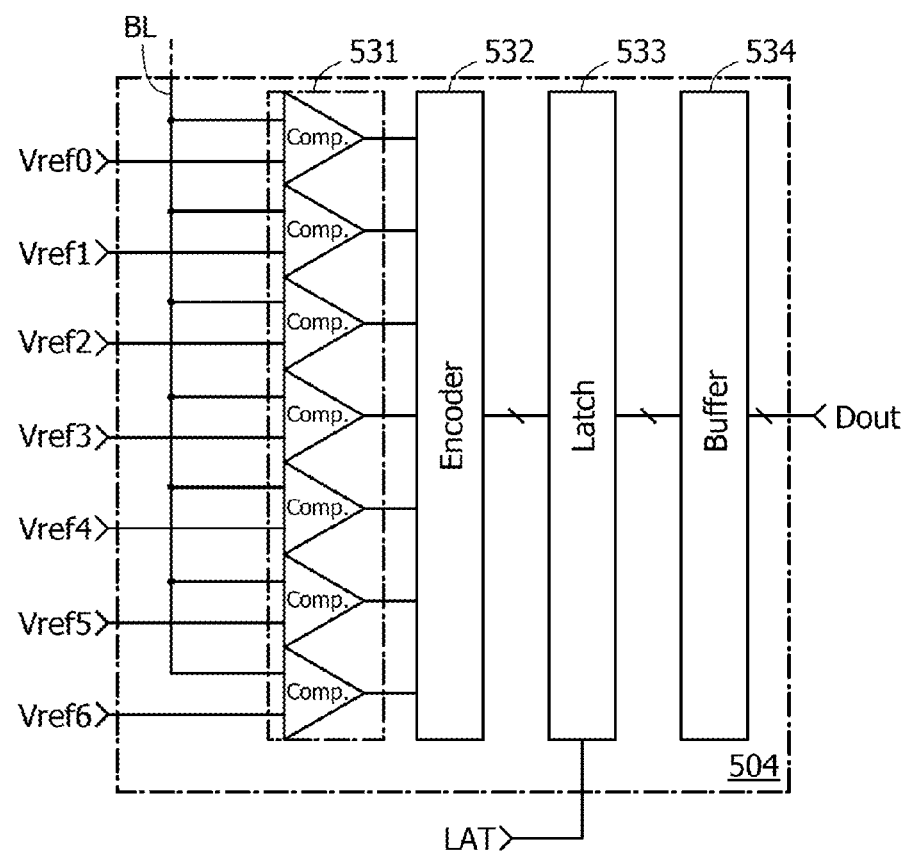
FIG. 11 is a circuit block diagram illustrating an A/D converter example.

FIG. 11 is a block diagram illustrating a structure example of the A/D converter 504 in FIG. 8.

The A/D converter 504 in FIG. 11 includes a comparator 531, an encoder 532, a latch circuit 533, and a buffer 534. The circuits and the transistors are provided for each column. The buffer 534 in each column outputs data Dout.

The comparator 531 is a circuit having a function of determining which of the levels of multilevel data the potential of the bit line BL corresponds to, by comparing the levels of the potential of the bit line BL and the potentials of reference voltages Vref0 to Vref6. Specifically, the comparator 531 includes a plurality of comparators to which the potential of the bit line BL and a corresponding one of the reference voltages Vref0 to Vref6 are supplied, and determines which of two potentials among the reference voltages Vref0 to Vref6 the potential of the bit line BL is between. With the comparator 531, the A/D converter 504 can determine which of the levels of the multilevel data the potential of the bit line BL corresponds to.

Note that the reference voltages Vref0 to Vref6 illustrated in FIG. 11 are potentials that are supplied when multilevel data is 3-bit data, that is, 8-level data.

The encoder 532 is a circuit having a function of generating a multi-bit digital signal based on a signal for determining the potential of the bit line BL that is output from the comparator 531. Specifically, the encoder 532 encodes an H-level or L-level signal output from the plurality of comparators 531 to generate a digital signal. With the encoder 532, the A/D converter 504 can change data read from the memory cell 110 into digital data.

The latch circuit 533 has a function of temporarily storing input digital data. Specifically, the latch circuit 533 is a flip-flop circuit that receives a latch signal LAT, stores data, and outputs the data to the buffer 534 in accordance with the latch signal LAT. With the latch circuit 533, the A/D converter 504 can output data at an opportune time. Note that the latch circuit 533 can be omitted.

The buffer 534 is a circuit having a function of amplifying data output from the latch circuit 533 and outputting the amplified data as an output signal Dout. Specifically, the buffer 534 is a circuit provided with an even number of inverter circuits. The buffer 534 allows the A/D converter 504 to reduce noise of a digital signal. Note that the buffer 534 can be omitted.

The structures, the methods, and the like described in this embodiment can be combined with any of the structures, the methods, and the like described in the other embodiments as appropriate.

(Embodiment 4)

In this embodiment, an example of a semiconductor device that can achieve the memory cells 100 and 110 is described with reference to FIG. 12.

<Structure Example of Semiconductor Device>

Figure 12:
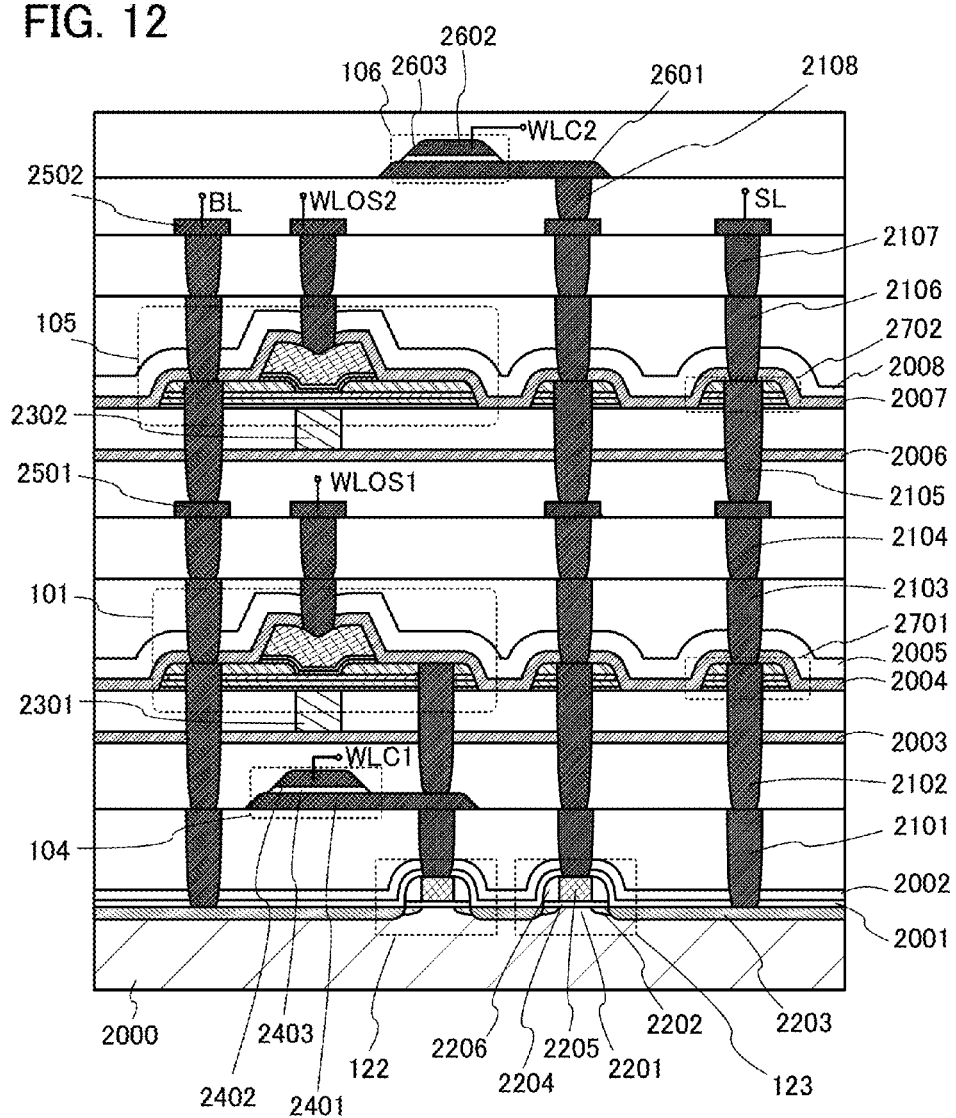
FIG. 12 is a cross-sectional view illustrating a semiconductor device example.

A semiconductor device in FIG. 12 includes a substrate 2000, the transistor 101, a transistor 122, a transistor 123, the transistor 105, the capacitor 104, the capacitor 106, an insulating film 2001, an insulating film 2002, an insulating film 2003, an insulating film 2004, an insulating film 2005, an insulating film 2006, an insulating film 2007, an insulating film 2008, a plug 2101, a plug 2102, a plug 2103, a plug 2104, a plug 2105, a plug 2106, a plug 2107, a plug 2108, a wiring 2301, a wiring 2302, a wiring 2501, a wiring 2502, a conductive film 2701, and a conductive film 2702.

Note that when the memory cell 100 is achieved using the structure illustrated in FIG. 12, in the following description, the transistor 122 is replaced with the transistor 102 and the transistor 123 is replaced with the transistor 103. Similarly, when the memory cell 110 is achieved using the structure illustrated in FIG. 12, in the following description, the transistor 122 is replaced with the transistor 112 and the transistor 123 is replaced with the transistor 113.

The transistors 122 and 123 each include a gate electrode 2205, a gate insulating film 2204, a sidewall insulating layer 2206, an impurity region 2203 functioning as a source region or a drain region, an impurity region 2202 functioning as a lightly doped drain (LDD) region or an extension region, and a channel formation region 2201.

The capacitor 104 includes a first electrode 2401, a second electrode 2402, and an insulating film 2403.

The capacitor 106 includes a first electrode 2601, a second electrode 2602, and an insulating film 2603.

The conductive film 2701 includes a conductive film formed through the same processing step as a conductive film used for the source and drain electrodes of the transistor 101 and a semiconductor layer formed through the same processing step as a semiconductor layer of the transistor 101.

The conductive film 2702 includes a conductive film formed through the same processing step as a conductive film used for the source and drain electrodes of the transistor 105 and a semiconductor layer formed through the same processing step as a semiconductor layer of the transistor 105.

Note that in FIG. 12, when there are a plurality of plugs at the same level, a reference numeral is given only to one representative plug and the other plugs are denoted by the reference numeral. Similarly, when there are a plurality of wirings at the same level, a reference numeral is given only to one representative wiring and the other wirings are denoted by the reference numeral. Similarly, when there are a plurality of conductive films at the same level, a reference numeral is given only to one representative conductive film and the other conductive films are denoted by the reference numeral.

FIG. 12 illustrates terminals connected to the bit line BL, the power supply line SL, the word line WLOS1, the word line WLOS2, the word line WLC1, and the word line WLC2.

In the semiconductor device in FIG. 12, the transistors 122 and 123 are provided over the substrate 2000; the capacitor 104 is provided over the transistors 122 and 123; the transistor 101 is provided over the capacitor 104; the transistor 105 is provided over the transistor 101; and the capacitor 106 is provided over the transistor 105. Note that the positions of these elements are not limited thereto. For example, the capacitor 106 may be provided over the transistor 101, and the transistor 105 may be provided over the capacitor 106.

A single crystal semiconductor substrate or a polycrystalline semiconductor substrate of silicon or silicon carbide, a compound semiconductor substrate of silicon germanium, a silicon-on-insulator (SOI) substrate, or the like can be used as the substrate 2000. A transistor formed using a semiconductor substrate can operate at high speed easily. Note that in the case where a p-type single crystal silicon substrate is used as the substrate 2000, an impurity element imparting n-type conductivity may be added to part of the substrate 2000 to form an n-well, and a p-type transistor can be formed in a region where the n-well is formed. As the impurity element imparting n-type conductivity, phosphorus (P), arsenic (As), or the like can be used. As the impurity element imparting p-type conductivity, boron (B) or the like may be used.

Alternatively, the substrate 2000 can be an insulating substrate or a metal substrate provided with a semiconductor film. Examples of the metal substrate include a stainless steel substrate, a substrate including stainless steel foil, a tungsten substrate, and a substrate including tungsten foil. Examples of the insulating substrate include a glass substrate, a quartz substrate, a plastic substrate, a flexible substrate, an attachment film, paper including a fibrous material, and a base film. Examples of a glass substrate include a barium borosilicate glass substrate, an aluminoborosilicate glass substrate, and a soda lime glass substrate. For a flexible substrate, a flexible synthetic resin such as plastics typified by polyethylene terephthalate (PET), polyethylene naphthalate (PEN), and polyethersulfone (PES) or acrylic can be used, for example. Examples of an attachment film include attachment films formed using polypropylene, polyester, polyvinyl fluoride, polyvinyl chloride, and the like. Examples of a base material film include films formed using polyester, polyamide, polyimide, aramid, epoxy, an inorganic vapor deposition film, and paper.

Note that a semiconductor element may be formed using one substrate and then transferred to another substrate. Examples of a substrate to which a semiconductor element is transferred include, in addition to the above-described substrates, a paper substrate, a cellophane substrate, an aramid film substrate, a polyimide film substrate, a stone substrate, a wood substrate, a cloth substrate (including a natural fiber (e.g., silk, cotton, and hemp), a synthetic fiber (e.g., nylon, polyurethane, and polyester), a regenerated fiber (e.g., acetate, cupra, rayon, and regenerated polyester), and the like), a leather substrate, and a rubber substrate. When such a substrate is used, a transistor with excellent properties or a transistor with low power consumption can be formed, a device with high durability or high heat resistance can be provided, or reduction in weight or thickness can be achieved.

A first semiconductor material is preferably used for channels of the transistors 122 and 123. A second semiconductor material is preferably used for channels of the transistors 101 and 105. The first semiconductor material and the second semiconductor material preferably have different band gaps. For example, the first semiconductor material can be a semiconductor material other than an oxide semiconductor (examples of such a semiconductor material include silicon (including strained silicon), germanium, silicon germanium, silicon carbide, gallium arsenide, aluminum gallium arsenide, indium phosphide, gallium nitride, and an organic semiconductor), and the second semiconductor material can be an oxide semiconductor. A transistor including single crystal silicon as a semiconductor material can operate at high speed easily. In contrast, a transistor including an oxide semiconductor has low off-state current.

Details of the transistors 101 and 105 are described in Embodiment 4.

As each of the transistors 122 and 123, a transistor containing silicide (salicide) or a transistor that does not include the sidewall insulating layer 2206 may be used. When a structure that contains silicide (salicide) is used, the resistance of the source region and the drain region can be further lowered and the speed of the semiconductor device is increased. Furthermore, the semiconductor device can be operated at low voltage; thus, the power consumption of the semiconductor device can be reduced.

Each of the transistors 122 and 123 may be either an n-channel transistor or a p-channel transistor, and an appropriate transistor may be used depending on a circuit. The impurity region 2203 has higher impurity concentration than the impurity region 2202. The impurity regions 2202 and 2203 can be formed in a self-aligned manner using the gate electrode 2205 and the sidewall insulating layer 2206 as masks.

In the case where a silicon-based semiconductor material is used for the transistors 122 and 123, the insulating films 2001 and 2002 preferably contain hydrogen. When the insulating films containing hydrogen are provided over the transistors 122 and 123 and heat treatment is performed, dangling bonds in the semiconductor film are terminated by hydrogen contained in these insulating films, so that the reliability of the transistors 122 and 123 can be increased.

The insulating films 2001 and 2002 may be formed to have a single-layer structure or a layered structure of, for example, silicon oxide, silicon oxynitride, silicon nitride oxide, silicon nitride, aluminum oxide, aluminum oxynitride, aluminum nitride oxide, aluminum nitride, or the like.

When an oxide semiconductor is used for the transistors 101 and 105, hydrogen in the insulating films 2001 and 2002 are factors of generating carriers in the oxide semiconductor; thus, the reliability of the transistors 101 and 105 might be decreased. Consequently, providing the insulating films 2003 and 2006 with a function of preventing hydrogen diffusion between the transistors 101 and 105 and the transistors 122 and 123 is particularly effective. The insulating films 2003 and 2006 make hydrogen remain in the lower layer, so that the reliability of the transistors 122 and 123 can be increased. In addition, since the insulating films 2003 and 2006 inhibit diffusion of hydrogen from the lower layer to the upper layer, the reliability of the transistors 101 and 105 can also be increased.

Each of the insulating films 2003 and 2006 can be formed using aluminum oxide, aluminum oxynitride, gallium oxide, gallium oxynitride, yttrium oxide, yttrium oxynitride, hafnium oxide, hafnium oxynitride, or yttria-stabilized zirconia (YSZ), for example. In particular, an aluminum oxide film is preferably used because the aluminum oxide film has a high shielding (blocking) effect of preventing transmission of oxygen and impurities such as hydrogen and moisture.

For the insulating films 2004 and 2007, as in the case of the insulating films 2003 and 2006, a material into which water or hydrogen does not easily diffuse is preferably used. A material relatively impermeable to oxygen is particularly preferably used. By covering the oxide semiconductor film with an insulating film including a material relatively impermeable to oxygen, oxygen can be inhibited from being released from the oxide semiconductor film to a portion over the insulating film.

The insulating films 2004 and 2007 that are relatively impermeable to water or hydrogen can inhibit entry of water or hydrogen, which is an impurity for an oxide semiconductor, so that changes in electrical characteristics of the transistors 101 and 105 can be reduced and the transistors can have high reliability.

The insulating film 2005 has a function of protecting the transistor 101, and the insulating film 2008 has a function of protecting the transistor 105. Each of the insulating films 2005 and 2008 can be formed using an insulating film containing one or more of silicon oxide, silicon oxynitride, silicon nitride oxide, silicon nitride, aluminum oxide, aluminum oxynitride, gallium oxide, germanium oxide, yttrium oxide, zirconium oxide, lanthanum oxide, neodymium oxide, hafnium oxide, and tantalum oxide. Each of the insulating films 2005 and 2008 may be a stack of any of the above materials. Note that the insulating films 2005 and 2008 may be omitted depending on circumstances.

The wiring 2301 functions as a second gate electrode of the transistor 101. The wiring 2301 may be supplied with a constant potential, or a potential or a signal that is the same as that supplied to a first gate electrode of the transistor 101. The wiring 2302 functions as a second gate electrode of the transistor 105. The wiring 2302 may be supplied with a constant potential, or a potential or a signal that is the same as that supplied to a first gate electrode of the transistor 105. Note that the wirings 2301 and 2302 may be omitted depending on circumstances.

The plugs 2101 to 2108 preferably have a single-layer structure or a layered structure of a conductive film containing a low-resistance material selected from copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), and cobalt (Co); an alloy of such a low-resistance material; or a compound containing such a material as its main component. It is particularly preferable to use a high-melting-point material that has heat resistance and conductivity, such as tungsten or molybdenum. The plugs 2101 to 2108 are preferably formed using a low-resistance conductive material such as aluminum or copper. The plugs 2101 to 2108 are particularly preferably formed using a Cu—Mn alloy because manganese oxide formed at the interface with an insulator containing oxygen has a function of preventing Cu diffusion.

The wirings 2301, 2302, 2501, and 2502, the first electrode 2401 of the capacitor 104, the second electrode 2402 of the capacitor 104, the first electrode 2601 of the capacitor 106, and the second electrode 2602 of the capacitor 106 preferably have a single-layer structure or a layered structure of a conductive film containing a low-resistance material selected from copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), and cobalt (Co); an alloy of such a low-resistance material; or a compound containing such a material as its main component. It is particularly preferable to use a high-melting-point material that has heat resistance and conductivity, such as tungsten or molybdenum. The wirings 2301, 2302, 2501, and 2502, the first electrode 2401 of the capacitor 104, the second electrode 2402 of the capacitor 104, the first electrode 2601 of the capacitor 106, and the second electrode 2602 of the capacitor 106 are preferably formed using a low-resistance conductive material such as aluminum or copper. The wirings 2301, 2302, 2501, and 2502, the first electrode 2401 of the capacitor 104, the second electrode 2402 of the capacitor 104, the first electrode 2601 of the capacitor 106, and the second electrode 2602 of the capacitor 106 are particularly preferably formed using a Cu—Mn alloy because manganese oxide formed at the interface with an insulator containing oxygen has a function of preventing Cu diffusion.

Note that an insulating material having a high dielectric constant is preferably used for the insulating film 2403 of the capacitor 104 and the insulating film 2603 of the capacitor 106. For example, each of these insulating films can be formed using an insulating film containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. Each of the insulating films 2403 and 2603 may be a stack of any of the above materials. Note that these insulating films may contain lanthanum (La), nitrogen, zirconium (Zr), or the like as an impurity.

In FIG. 12, regions where reference numerals and hatching patterns are not given are each formed of an insulator. In these regions, an insulator containing one or more materials selected from aluminum oxide, aluminum nitride oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, tantalum oxide, and the like can be used. Alternatively, in these regions, an organic resin such as a polyimide resin, a polyamide resin, an acrylic resin, a siloxane resin, an epoxy resin, or a phenol resin can be used.

Note that each of the transistors 122 and 123 can be a transistor of various types without being limited to a planar type transistor. For example, a FIN-type transistor, a TRI-GATE transistor, or the like can be used.

When the memory cell 110 in FIG. 4 has the structure illustrated in FIG. 12, the area occupied by each memory cell can be small. Since the memory cell 110 can store multilevel data, it is possible to provide a semiconductor device with a small area that can store high-density data when the memory cell 110 has the structure illustrated in FIG. 12.

The structures, the methods, and the like described in this embodiment can be combined with any of the structures, the methods, and the like described in the other embodiments as appropriate.

(Embodiment 5)
<Structure Example of Oxide Semiconductor Transistor>

In this embodiment, a transistor including an oxide semiconductor layer in a channel (hereinafter referred to as an oxide semiconductor (OS) transistor) that can be used as each of the transistors 101 and 105 in FIG. 12 is described with reference to FIGS. 13A to 13C, FIGS. 14A and 14B, FIGS. 15A to 15C, FIGS. 16A to 16D, FIG. 17, and FIGS. 18A to 18C.

Figure 13A:
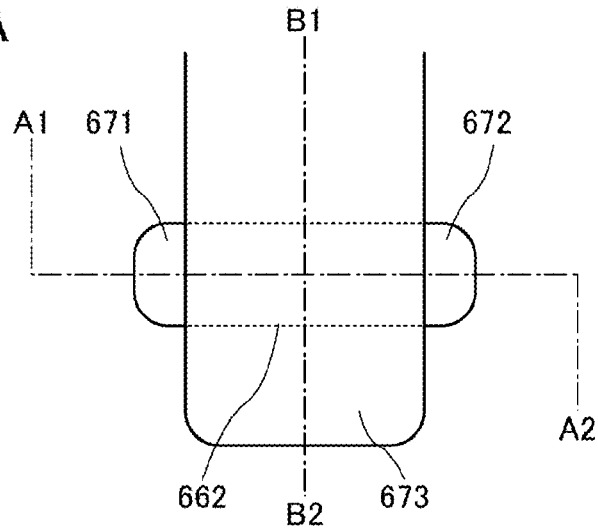
FIGS. 13A to 13C are a top view and cross-sectional views illustrating a transistor example.
Figure 13B:
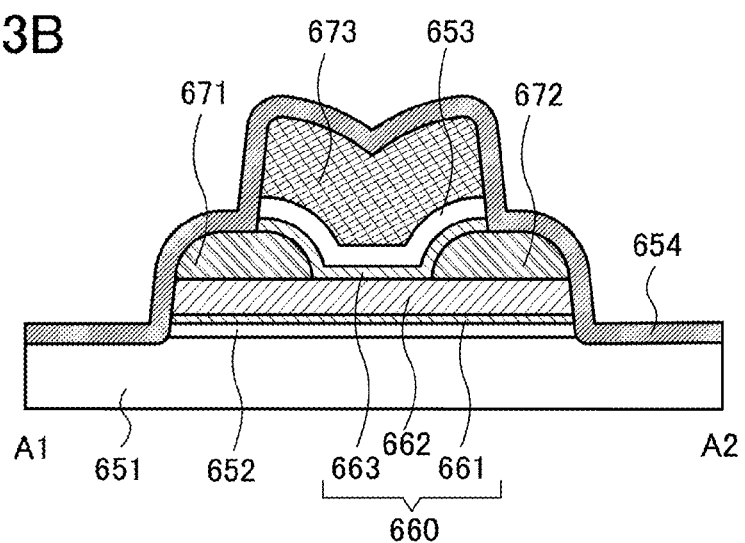
Figure 13C:
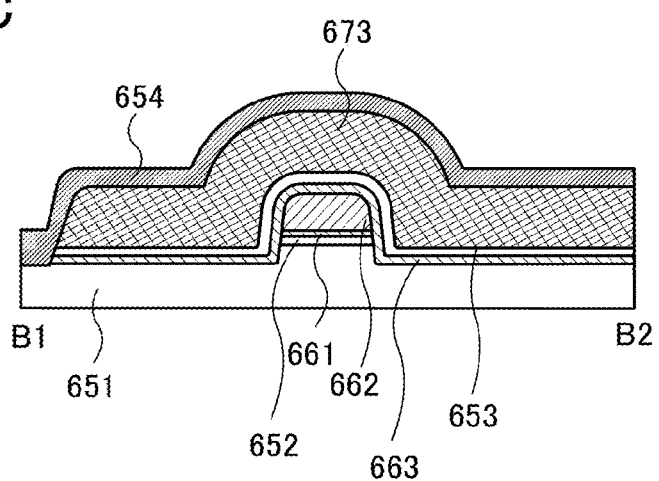

FIGS. 13A to 13C are a top view and cross-sectional views illustrating the OS transistor. FIG. 13A is the top view. FIG. 13B illustrates a cross section taken along dashed-dotted line A1-A2 in FIG. 13A. FIG. 13C illustrates a cross section taken along dashed-dotted line B1-B2 in FIG. 13A. In FIGS. 13A to 13C, some components are scaled up or down or omitted for easy understanding. In some cases, the direction of dashed-dotted line A1-A2 is referred to as a channel length direction and the direction of dashed-dotted line B1-B2 is referred to as a channel width direction.

Note that the channel length refers to, for example, a distance between a source (a source region or a source electrode) and a drain (a drain region or a drain electrode) in a region where a semiconductor (or a portion where current flows in a semiconductor when a transistor is on) and a gate electrode overlap with each other or in a region where a channel is formed in a top view of the transistor. In one transistor, channel lengths in all regions are not necessarily the same. In other words, the channel length of one transistor is not limited to one value in some cases. Therefore, in this specification, the channel length is any one of values, the maximum value, the minimum value, or the average value in a region where a channel is formed.

The channel width refers to, for example, the length of a portion where a source and a drain face each other in a region where a semiconductor (or a portion where current flows in a semiconductor when a transistor is on) and a gate electrode overlap with each other or a region where a channel is formed. In one transistor, channel widths in all regions do not necessarily have the same value. In other words, the channel width of one transistor is not fixed to one value in some cases. Therefore, in this specification, the channel width is any one of values, the maximum value, the minimum value, or the average value in a region where a channel is formed.

Note that depending on transistor structures, a channel width in a region where a channel is actually formed (hereinafter referred to as an effective channel width) is sometimes different from a channel width shown in a top view of a transistor (hereinafter referred to as an apparent channel width). For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a side surface of a semiconductor is higher than the proportion of a channel region formed in a top surface of a semiconductor in some cases. In that case, an effective channel width obtained when a channel is actually formed is greater than an apparent channel width shown in the top view.

In a transistor having a three-dimensional structure, measuring an effective channel width is difficult in some cases. For example, to estimate an effective channel width from a design value, it is necessary to assume that the shape of a semiconductor is known. Therefore, in the case where the shape of a semiconductor is not known accurately, measuring an effective channel width accurately is difficult.

Accordingly, in this specification, in a top view of a transistor, an apparent channel width that is the length of a portion where a source and a drain face each other in a region where a semiconductor and a gate electrode overlap with each other is referred to as a surrounded channel width (SCW) in some cases. Furthermore, in this specification, the term "channel width" may denote a surrounded channel width, i.e., an apparent channel width or an effective channel width. Note that the values of a channel length, a channel width, an effective channel width, an apparent channel width, a surrounded channel width, and the like can be determined by obtaining and analyzing a cross-sectional TEM image and the like.

A surrounded channel width may be used to calculate field-effect mobility, a current value per channel width, and the like of a transistor. In this case, the obtained value is sometimes different from the value obtained by using an effective channel width for the calculation.

The OS transistor includes an insulating film 652 over an insulating film 651; a stack in which a first oxide semiconductor 661 and a second oxide semiconductor 662 are formed in that order over the insulating film 652; a source electrode 671 and a drain electrode 672 electrically connected to part of the stack; a third oxide semiconductor 663 that covers part of the stack, part of the source electrode 671, and part of the drain electrode 672; a gate insulating film 653 and a gate electrode 673 that cover part of the stack, part of the source electrode 671, part of the drain electrode 672, and part of the third oxide semiconductor 663; an insulating film 654 over the source electrode 671, the drain electrode 672, and the gate electrode 673; and an insulating film 655 over the insulating film 654. Note that the first oxide semiconductor 661, the second oxide semiconductor 662, and the third oxide semiconductor 663 are collectively referred to as an oxide semiconductor 660.

Note that at least part (or all) of the source electrode 671 (and/or the drain electrode 672) is provided on at least part (or all) of a surface, side surfaces, a top surface, and/or a bottom surface of a semiconductor layer such as the second oxide semiconductor 662 (and/or the first oxide semiconductor 661).

Alternatively, at least part (or all) of the source electrode 671 (and/or the drain electrode 672) is in contact with at least part (or all) of a surface, side surfaces, a top surface, and/or a bottom surface of a semiconductor layer such as the second oxide semiconductor 662 (and/or the first oxide semiconductor 661). Alternatively, at least part (or all) of the source electrode 671 (and/or the drain electrode 672) is in contact with at least part (or all) of a semiconductor layer such as the second oxide semiconductor 662 (and/or the first oxide semiconductor 661).

Alternatively, at least part (or all) of the source electrode 671 (and/or the drain electrode 672) is electrically connected to at least part (or all) of a surface, side surfaces, a top surface, and/or a bottom surface of a semiconductor layer such as the second oxide semiconductor 662 (and/or the first oxide semiconductor 661). Alternatively, at least part (or all) of the source electrode 671 (and/or the drain electrode 672) is electrically connected to part (or all) of a semiconductor layer such as the second oxide semiconductor 662 (and/or the first oxide semiconductor 661).

Alternatively, at least part (or all) of the source electrode 671 (and/or the drain electrode 672) is provided near part (or all) of a surface, a side surface, a top surface, and/or a bottom surface of a semiconductor layer such as the second oxide semiconductor 662 (and/or the first oxide semiconductor 661). Alternatively, at least part (or all) of the source electrode 671 (and/or the drain electrode 672) is provided near part (or all) of a semiconductor layer such as the second oxide semiconductor 662 (and/or the first oxide semiconductor 661).

Alternatively, at least part (or all) of the source electrode 671 (and/or the drain electrode 672) is provided next to part (or all) of a surface, a side surface, a top surface, and/or a bottom surface of a semiconductor layer such as the second oxide semiconductor 662 (and/or the first oxide semiconductor 661). Alternatively, at least part (or all) of the source electrode 671 (and/or the drain electrode 672) is provided next to part (or all) of a semiconductor layer such as the second oxide semiconductor 662 (and/or the first oxide semiconductor 661).

Alternatively, at least part (or all) of the source electrode 671 (and/or the drain electrode 672) is provided obliquely above part (or all) of a surface, a side surface, a top surface, and/or a bottom surface of a semiconductor layer such as the second oxide semiconductor 662 (and/or the first oxide semiconductor 661). Alternatively, at least part (or all) of the source electrode 671 (and/or the drain electrode 672) is provided obliquely above part (or all) of a semiconductor layer such as the second oxide semiconductor 662 (and/or the first oxide semiconductor 661).

Alternatively, at least part (or all) of the source electrode 671 (and/or the drain electrode 672) is provided above part (or all) of a surface, a side surface, a top surface, and/or a bottom surface of a semiconductor layer such as the second oxide semiconductor 662 (and/or the first oxide semiconductor 661). Alternatively, at least part (or all) of the source electrode 671 (and/or the drain electrode 672) is provided above part (or all) of a semiconductor layer such as the second oxide semiconductor 662 (and/or the first oxide semiconductor 661).

Note that functions of a "source" and a "drain" of a transistor are sometimes interchanged with each other when a transistor of an opposite conductivity type is used or when the direction of current flow is changed in circuit operation, for example. Therefore, the terms "source" and "drain" can be interchanged with each other in this specification.

The transistor according to one embodiment of the present invention is a top-gate transistor with a channel length of 10 to 1000 nm, preferably 20 to 500 nm, more preferably 30 to 300 nm.

Components of the semiconductor device of this embodiment are described in detail below.

<Base Insulating Film>

Each of the insulating films 651 and 652 can have a function of supplying oxygen to the oxide semiconductor 660 as well as a function of preventing diffusion of impurities from under the insulating film 651. For this reason, each of the insulating films 651 and 652 is preferably an insulating film containing oxygen, more preferably an insulating film having an oxygen content higher than that in the stoichiometric composition. For example, each of the insulating films 651 and 652 is a film in which the amount of released oxygen converted into oxygen atoms is $1.0 \times 10^{19}$ atoms/cm$^3$ or more in thermal desorption spectroscopy (TDS) analysis. Note that the temperature of the film surface in the TDS analysis preferably ranges from 100 to 700° C. or from 100 to 500° C. When a device is formed under the insulating film 651 as illustrated in FIG. 12, each of the insulating films 651 and 652 is preferably subjected to planarization treatment such as chemical mechanical polishing (CMP) treatment to have a flat surface.

Each of the insulating films 651 and 652 can be formed using an oxide insulating film of aluminum oxide, magnesium oxide, silicon oxide, silicon oxynitride, gallium oxide, germanium oxide, yttrium oxide, zirconium oxide, lanthanum oxide, neodymium oxide, hafnium oxide, tantalum oxide, or the like; a nitride insulating film of silicon nitride, silicon nitride oxide, aluminum nitride, aluminum nitride oxide, or the like; or a mixed material of any of these.

<Oxide Semiconductor>

The oxide semiconductor 660 is typically formed using an In—Ga oxide, an In—Zn oxide, or an In—M—Zn oxide (M is Ti, Ga, Y, Zr, La, Ce, Nd, Sn, or Hf), and is preferably formed using an In—M—Zn oxide.

Note that the oxide semiconductor 660 is not limited to the oxide containing indium. The oxide semiconductor 660 may be, for example, a Zn oxide, a Zn—Sn oxide, a Ga oxide, or a Ga—Sn oxide.

In the case where the oxide semiconductor 660 is an In—M—Zn oxide formed by sputtering, it is preferable that the atomic ratio of metal elements of a target used for depositing the In—M—Zn oxide satisfy In≥M and Zn≥M. As the atomic ratio of metal elements of such a target, In:M:Zn=1:1:1, In:M:Zn=1:1:1.2, and In:M:Zn=3:1:2 are preferable. Note that the atomic ratios of metal elements in the oxide semiconductor 660 vary from those in the sputtering target within an error range of ±40%.

Figure 14A:
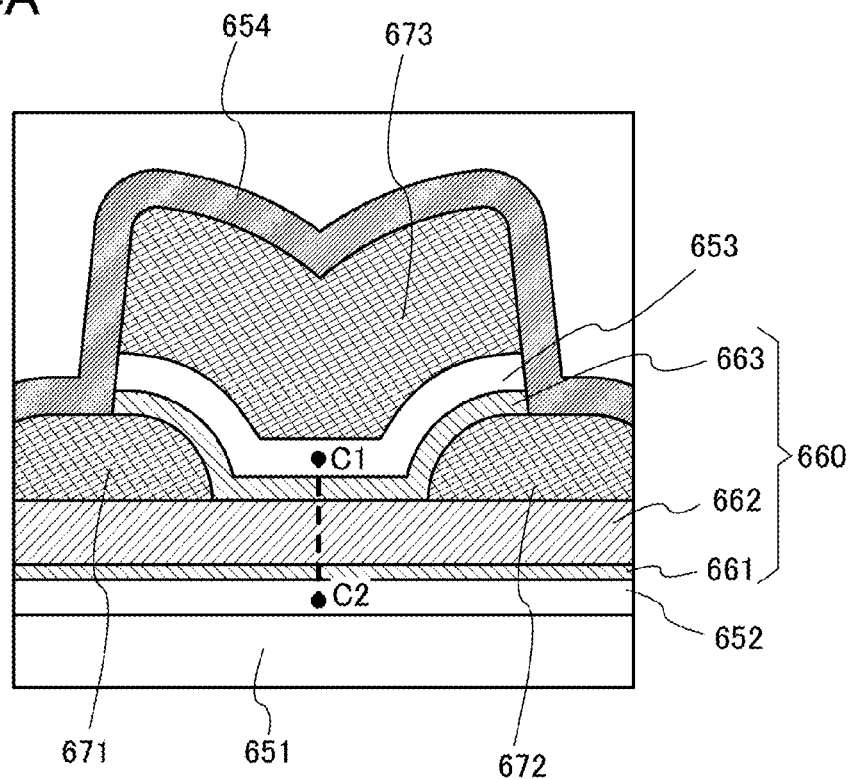
FIG. 14A is a cross-sectional view illustrating a transistor example.
Figure 14B:
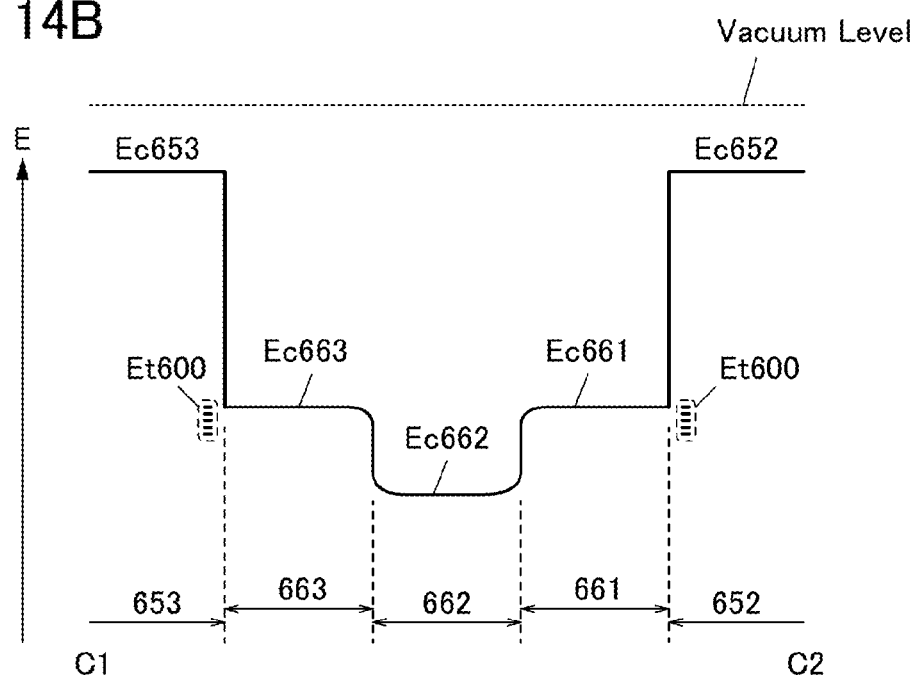
FIG. 14B is a band diagram of the transistor.

Next, a function and an effect of the oxide semiconductor 660 in which the first oxide semiconductor 661, the second oxide semiconductor 662, and the third oxide semiconductor 663 are stacked are described using an energy band diagram in FIG. 14B. FIG. 14A is an enlarged view of the channel portion of the transistor 111 illustrated in FIG. 13B. FIG. 14B shows the energy band structure of a portion taken along chain line C1-C2 in FIG. 14A. That is, FIG. 14B shows the energy band structure of a channel formation region of the OS transistor.

In FIG. 14B, Ec652, Ec661, Ec662, Ec663, and Ec653 indicate the energy of the conduction band minimum of the insulating film 652, the first oxide semiconductor 661, the second oxide semiconductor 662, the third oxide semiconductor 663, and the gate insulating film 653, respectively.

Here, a difference in energy between the vacuum level and the conduction band minimum (the difference is also referred to as electron affinity) corresponds to a value obtained by subtracting an energy gap from a difference in energy between the vacuum level and the valence band maximum (the difference is also referred to as ionization potential). The energy gap can be measured using a spectroscopic ellipsometer (UT-300 manufactured by HORIBA Jobin Yvon SAS). The energy difference between the vacuum level and the valence band maximum can be measured using an ultraviolet photoelectron spectroscopy (UPS) device (VersaProbe manufactured by ULVAC-PHI, Inc.).

An In—Ga—Zn oxide formed using a target with an atomic ratio of In:Ga:Zn=1:3:2 has an energy gap of approximately 3.5 eV and an electron affinity of approximately 4.5 eV. An In—Ga—Zn oxide formed using a target with an atomic ratio of In:Ga:Zn=1:3:4 has an energy gap of approximately 3.4 eV and an electron affinity of approximately 4.5 eV. An In—Ga—Zn oxide formed using a target with an atomic ratio of In:Ga:Zn=1:3:6 has an energy gap of approximately 3.3 eV and an electron affinity of approximately 4.5 eV. An In—Ga—Zn oxide formed using a target with an atomic ratio of In:Ga:Zn=1:6:2 has an energy gap of approximately 3.9 eV and an electron affinity of approximately 4.3 eV. An In—Ga—Zn oxide formed using a target with an atomic ratio of In:Ga:Zn=1:6:8 has an energy gap of approximately 3.5 eV and an electron affinity of approximately 4.4 eV. An In—Ga—Zn oxide formed using a target with an atomic ratio of In:Ga:Zn=1:6:10 has an energy gap of approximately 3.5 eV and an electron affinity of approximately 4.5 eV. An In—Ga—Zn oxide formed using a target with an atomic ratio of In:Ga:Zn=1:1:1 has an energy gap of approximately 3.2 eV and an electron affinity of approximately 4.7 eV. An In—Ga—Zn oxide formed using a target with an atomic ratio of In:Ga:Zn=3:1:2 has an energy gap of approximately 2.8 eV and an electron affinity of approximately 5.0 eV.

Since the insulating film 652 and the gate insulating film 653 are insulators, Ec652 and Ec653 are closer to the vacuum level than Ec661, Ec662, and Ec663 (i.e., the insulating film 652 and the gate insulating film 653 have a smaller electron affinity than the first oxide semiconductor 661, the second oxide semiconductor 662, and the third oxide semiconductor 663).

Ec661 is closer to the vacuum level than Ec662. Specifically, Ec661 is preferably closer to the vacuum level than Ec662 by 0.05 eV or more, 0.07 eV or more, 0.1 eV or more, or 0.15 eV or more and 2 eV or less, 1 eV or less, 0.5 eV or less, or 0.4 eV or less.

Ec663 is closer to the vacuum level than Ec662. Specifically, Ec663 is preferably closer to the vacuum level than Ec662 by 0.05 eV or more, 0.07 eV or more, 0.1 eV or more, or 0.15 eV or more and 2 eV or less, 1 eV or less, 0.5 eV or less, or 0.4 eV or less.

Mixed regions are formed in the vicinity of the interface between the first oxide semiconductor 661 and the second oxide semiconductor 662 and the interface between the second oxide semiconductor 662 and the third oxide semiconductor 663; thus, the energy of the conduction band minimum changes continuously. In other words, no state or few states exist at these interfaces.

Accordingly, electrons transfer mainly through the second oxide semiconductor 662 in the layered structure having the above energy band. Therefore, even when an interface state exists between the first oxide semiconductor 661 and the insulating film 652 or between the third oxide semiconductor 663 and the gate insulating film 653, the interface state hardly influences the transfer of electrons. In addition, since no interface state or few interface states exist between the first oxide semiconductor 661 and the second oxide semiconductor 662 and between the second oxide semiconductor 662 and the third oxide semiconductor 663, the transfer of electrons is not interrupted in the regions. Consequently, high field-effect mobility can be obtained in the OS transistor 101 having the layered structure of the oxide semiconductors.

Although trap states Et600 due to impurities or defects might be formed in the vicinity of the interface between the first oxide semiconductor 661 and the insulating film 652 and the interface between the third oxide semiconductor 663 and the gate insulating film 653 as illustrated in FIG. 14B, the second oxide semiconductor 662 can be separated from the trap states owing to the existence of the first oxide semiconductor 661 and the third oxide semiconductor 663.

In the OS transistor described in this embodiment, in the channel width direction, the top surface and side surfaces of the second oxide semiconductor 662 are in contact with the third oxide semiconductor 663, and the bottom surface of the second oxide semiconductor 662 is in contact with the first oxide semiconductor 661 (see FIG. 13C). Surrounding the second oxide semiconductor 662 by the first oxide semiconductor 661 and the third oxide semiconductor 663 in this manner can further reduce the influence of the trap states.

However, when the energy difference between Ec662 and Ec661 or Ec663 is small, an electron in the second oxide semiconductor 662 might reach the trap state by passing over the energy difference. When the electron is trapped in the trap state, a negative fixed charge is generated at the interface with the insulating film, so that the threshold voltage of the transistor is shifted in the positive direction.

Therefore, each of the energy gaps between Ec661 and Ec662 and between Ec662 and Ec663 is preferably 0.1 eV or more, more preferably 0.15 eV or more, in which case a change in the threshold voltage of the transistor can be reduced and the transistor can have favorable electrical characteristics.

The band gap of each of the first oxide semiconductor 661 and the third oxide semiconductor 663 is preferably wider than that of the second oxide semiconductor 662.

For the first oxide semiconductor 661 and the third oxide semiconductor 663, a material containing Al, Ti, Ga, Ge, Y, Zr, Sn, La, Ce, or Hf with a higher atomic ratio than that used for the second oxide semiconductor 662 can be used, for example. Specifically, the atomic ratio of any of the above metal elements in the first oxide semiconductor 661 and the third oxide semiconductor 663 is 1.5 times or more, preferably 2 times or more, more preferably 3 times or more that in the second oxide semiconductor 662. Any of the above metal elements is strongly bonded to oxygen and thus has a function of inhibiting generation of oxygen vacancies in the oxide semiconductor. That is, oxygen vacancies are less likely to be generated in the first oxide semiconductor 661 and the third oxide semiconductor 663 than in the second oxide semiconductor 662.

When the third oxide semiconductor 663 contains In, In might be diffused into the gate insulating film 653 and cause gate leakage. Thus, the third oxide semiconductor 663 is preferably formed using a material that does not contain In. For example, the third oxide semiconductor 663 is preferably formed using gallium oxide.

When each of the first oxide semiconductor 661, the second oxide semiconductor 662, and the third oxide semiconductor 663 is an In—M—Zn oxide containing at least indium, zinc, and M (M is a metal such as Al, Ti, Ga, Ge, Y, Zr, Sn, La, Ce, or Hf) and the atomic ratio of In to M and Zn of the first oxide semiconductor 661 is $x_1:y_1:z$, that of the second oxide semiconductor 662 is $x_2:y_2:z_2$, and that of the third oxide semiconductor 663 is $x_3:y_3:z_3$, each of $y_1/x_1$ and $y_3/x_3$ is preferably larger than $y_2/x_2$. Each of $y_1/x_1$ and $y_3/x_3$ is 1.5 times or more, preferably 2 times or more, more preferably 3 times or more as large as $y_2/x_2$. In this case, the transistor can have stable electrical characteristics when $y_2$ is greater than or equal to $x_2$ in the second oxide semiconductor 662. However, when $y_2$ is 3 times or more as large as $x_2$, the field-effect mobility of the transistor is reduced; thus, $y_2$ is preferably smaller than 3 times $X_2$.

In the case where Zn and O are not taken into consideration, the proportion of In and the proportion of M in the first oxide semiconductor 661 and the third oxide semiconductor 663 are preferably lower than 50 atomic % and higher than or equal to 50 atomic %, respectively, more preferably lower than 25 atomic % and higher than or equal to 75 atomic %, respectively. In the case where Zn and O are not taken into consideration, the proportion of In and the proportion of M in the second oxide semiconductor 662 are preferably higher than or equal to 25 atomic % and lower than 75 atomic %, respectively, more preferably higher than or equal to 34 atomic % and lower than 66 atomic %, respectively.

The thickness of each of the first oxide semiconductor 661 and the third oxide semiconductor 663 ranges from 3 nm to 100 nm, preferably from 3 nm to 50 nm. The thickness of the second oxide semiconductor 662 ranges from 3 nm to 200 nm, preferably from 3 nm to 100 nm, more preferably from 3 nm to 50 nm. The second oxide semiconductor 662 is preferably thicker than the first oxide semiconductor 661 and the third oxide semiconductor 663.

Note that in order that a transistor in which a channel is formed in an oxide semiconductor have stable electrical characteristics, it is effective to make the oxide semiconductor intrinsic or substantially intrinsic by reducing the concentration of impurities in the oxide semiconductor. The term "substantially intrinsic" refers to a state where an oxide semiconductor has a carrier density lower than $1\times10^{17}/cm^3$, preferably lower than $1\times10^{15}/cm^3$, more preferably lower than $1\times10^{13}/cm^3$.

In the oxide semiconductor, hydrogen, nitrogen, carbon, silicon, and a metal element other than a main component are impurities. For example, hydrogen and nitrogen form donor levels to increase the carrier density, and silicon forms impurity levels in the oxide semiconductor. The impurity levels serve as traps and might cause the electric characteristics of the transistor to deteriorate. Therefore, it is preferable to reduce the concentration of the impurities in the first oxide semiconductor 661, the second oxide semiconductor 662, and the third oxide semiconductor 663 and at interfaces between the layers.

In order to make the oxide semiconductor intrinsic or substantially intrinsic, for example, the concentration of silicon at a certain depth of the oxide semiconductor or in a region of the oxide semiconductor, which is measured by secondary ion mass spectrometry (SIMS), is lower than $1\times10^{19}$ atoms/cm$^3$, preferably lower than $5\times10^{18}$ atoms/cm$^3$, more preferably lower than $1\times10^{18}$ atoms/cm$^3$. The concentration of hydrogen at a certain depth of the oxide semiconductor or in a region of the oxide semiconductor is lower than or equal to $2\times10^{20}$ atoms/cm$^3$, preferably lower than or equal to $5\times10^{19}$ atoms/cm$^3$, more preferably lower than or equal to $1\times10^{19}$ atoms/cm$^3$, still more preferably lower than or equal to $5\times10^{18}$ atoms/cm$^3$. The concentration of nitrogen at a certain depth of the oxide semiconductor or in a region of the oxide semiconductor is lower than $5\times10^{19}$ atoms/cm$^3$, preferably lower than or equal to $5\times10^{18}$ atoms/cm$^3$, more preferably lower than or equal to $1\times10^{18}$ atoms/cm$^3$, still more preferably lower than or equal to $5\times10^{17}$ atoms/cm$^3$.

In addition, in the case where the oxide semiconductor includes a crystal, high concentration of silicon or carbon might reduce the crystallinity of the oxide semiconductor. In order not to reduce the crystallinity of the oxide semiconductor, for example, the concentration of silicon at a certain depth of the oxide semiconductor or in a region of the oxide semiconductor is lower than $1\times10^{19}$ atoms/cm$^3$, preferably lower than $5\times10^{18}$ atoms/cm$^3$, more preferably lower than $1\times10^{18}$ atoms/cm$^3$. Furthermore, the concentration of carbon at a certain depth of the oxide semiconductor or in a region of the oxide semiconductor is lower than $1\times10^{19}$ atoms/cm$^3$, preferably lower than $5\times10^{18}$ atoms/cm$^3$, more preferably lower than $1\times10^{18}$ atoms/cm$^3$, for example.

A transistor in which the above highly purified oxide semiconductor is used for a channel formation region exhibits extremely low off-state current. When voltage between a source and a drain is set at about 0.1 V, 5 V, or 10 V, for example, the off-state current standardized on the channel width of the transistor can be as low as several yoctoamperes per micrometer to several zeptoamperes per micrometer.

In the OS transistor described in this embodiment, the gate electrode 673 is formed to electrically surround the oxide semiconductor 660 in the channel width direction; thus, a gate electric field is applied to the semiconductor 660 in the side surface direction in addition to the perpendicular direction (see FIG. 13C). In other words, a gate electric field is applied to the whole oxide semiconductor, so that current flows through the entire second oxide semiconductor 662 serving as a channel, leading to a further increase in on-state current.

<Gate Electrode>

The gate electrode 673 can be formed using a metal element selected from chromium (Cr), copper (Cu), aluminum (Al), gold (Au), silver (Ag), zinc (Zn), molybdenum (Mo), tantalum (Ta), titanium (Ti), tungsten (W), manganese (Mn), nickel (Ni), iron (Fe), cobalt (Co), and ruthenium (Ru); an alloy containing any of these metal element as its component; an alloy containing a combination of any of these metal elements; or the like. The gate electrode 673 may have a single-layer structure or a layered structure of two or more layers. For example, any of the following structures can be employed: a single-layer structure of an aluminum film containing silicon; a two-layer structure in which a titanium film is stacked over an aluminum film; a two-layer structure in which a titanium film is stacked over a titanium nitride film; a two-layer structure in which a tungsten film is stacked over a titanium nitride film; a two-layer structure in which a tungsten film is stacked over a tantalum nitride film or a tungsten nitride film; a three-layer structure in which a titanium film, an aluminum film, and a titanium film are stacked in that order; a single-layer structure of a Cu—Mn alloy film; a two-layer structure in which a Cu film is stacked over a Cu—Mn alloy film; and a three-layer structure in which a Cu—Mn alloy film, a Cu film, and a Cu—Mn alloy film are stacked in that order. A Cu—Mn alloy film is preferably used because of its low electrical resistance and because it forms manganese oxide at the interface with an insulating film containing oxygen and manganese oxide can prevent Cu diffusion.

The gate electrode 673 can also be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. Moreover, the gate electrode 673 can have a layered structure using the light-transmitting conductive material and the metal element.

<Gate Insulating Film>

The gate insulating film 653 can be formed using an insulating film containing at least one of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The gate insulating film 653 may be a stack of any of the above materials. The gate insulating film 653 may contain lanthanum (La), nitrogen, or zirconium (Zr) as an impurity.

An example of a layered structure of the gate insulating film 653 is described. The gate insulating film 653 contains oxygen, nitrogen, silicon, or hafnium, for example. Specifically, the gate insulating film 653 preferably contains hafnium oxide and one of silicon oxide and silicon oxynitride.

Hafnium oxide has a higher dielectric constant than silicon oxide and silicon oxynitride. Hence, with the use of hafnium oxide, the physical thickness can be larger than the equivalent oxide thickness; thus, even when the equivalent oxide thickness is 10 nm or less or 5 nm or less, leakage current due to tunneling current can be low. That is, it is possible to provide a transistor with low off-state current.

<Source and Drain Electrodes>

The source electrode 671 and the drain electrode 672 can be formed using a material similar to that of the gate electrode 673. A Cu—Mn alloy film is preferably used because of its low electrical resistance and because it forms manganese oxide at the interface with the oxide semiconductor 660 and manganese oxide can prevent Cu diffusion.

<Protective Insulating Film>

The insulating film 654 has a function of blocking oxygen, hydrogen, water, alkali metal, alkaline earth metal, and the like. The insulating film 654 can prevent outward diffusion of oxygen from the oxide semiconductor 660 and entry of hydrogen, water, or the like into the oxide semiconductor 660 from the outside. The insulating film 654 can be a nitride insulating film, for example. Examples of the nitride insulating film include a silicon nitride film, a silicon nitride oxide film, an aluminum nitride film, and an aluminum nitride oxide film. Note that instead of the nitride insulating film having a blocking effect against oxygen, hydrogen, water, alkali metal, alkaline earth metal, and the like, an oxide insulating film having a blocking effect against oxygen, hydrogen, water, and the like may be provided. Examples of the oxide insulating film having a blocking effect against oxygen, hydrogen, water, and the like include an aluminum oxide film, an aluminum oxynitride film, a gallium oxide film, a gallium oxynitride film, an yttrium oxide film, an yttrium oxynitride film, a hafnium oxide film, and a hafnium oxynitride film.

An aluminum oxide film is preferably used as the insulating film 654 because it is highly effective in preventing transmission of both oxygen and impurities such as hydrogen and moisture. Thus, during and after the manufacturing process of the transistor, the aluminum oxide film can suitably function as a protective film that has effects of preventing entry of impurities such as hydrogen and moisture, which cause variations in the electrical characteristics of the transistor, into the oxide semiconductor 660, preventing release of oxygen, which is the main component of the oxide semiconductor 660, from the oxide semiconductor, and preventing unnecessary release of oxygen from the insulating film 652. Furthermore, oxygen contained in the aluminum oxide film can be diffused into the oxide semiconductor.

<Crystal Structure of Oxide Semiconductor>

Next, the crystal structure of an oxide semiconductor applicable to an OS transistor is described.

In this specification, the term "parallel" indicates that an angle formed between two straight lines is −10 to 10°, and accordingly includes the case where the angle is −5 to 5°. In addition, the term "perpendicular" indicates that an angle formed between two straight lines is 80 to 100°, and accordingly includes the case where the angle is 85 to 95°.

In this specification, trigonal and rhombohedral crystal systems are included in a hexagonal crystal system.

An oxide semiconductor film is roughly classified into a non-single-crystal oxide semiconductor film and a single-crystal oxide semiconductor film. The non-single-crystal oxide semiconductor film means any of a c-axis aligned crystalline oxide semiconductor (CAAC-OS) film, a polycrystalline oxide semiconductor film, a microcrystalline oxide semiconductor film, an amorphous oxide semiconductor film, and the like.

First, a CAAC-OS film is described.

The CAAC-OS film is one of oxide semiconductor films having a plurality of c-axis aligned crystal parts.

With a transmission electron microscope (TEM), a combined analysis image (also referred to as a high-resolution TEM image) of a bright-field image and a diffraction pattern of the CAAC-OS film is observed. Consequently, a plurality of crystal parts are observed clearly. However, in the high-resolution TEM image, a boundary between crystal parts, i.e., a grain boundary is not observed clearly. Thus, in the CAAC-OS film, a reduction in electron mobility due to the grain boundary is less likely to occur.

According to the high-resolution cross-sectional TEM image of the CAAC-OS film observed in a direction substantially parallel to a sample surface (cross-sectional TEM image), metal atoms are arranged in a layered manner in the crystal parts. Each metal atom layer has a morphology that reflects a surface over which the CAAC-OS film is formed (also referred to as a formation surface) or a top surface of the CAAC-OS film, and is provided parallel to the formation surface or the top surface of the CAAC-OS film.

On the other hand, according to the high-resolution planar TEM image of the CAAC-OS film observed in a direction substantially perpendicular to the sample surface (planar TEM image), metal atoms are arranged in a triangular or hexagonal configuration in the crystal parts. However, there is no regularity of arrangement of metal atoms between different crystal parts.

Figure 15A:
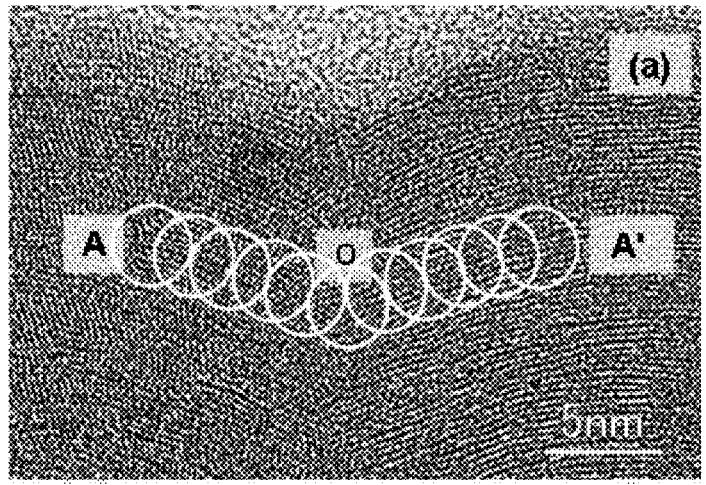
FIGS. 15A to 15C are high-resolution cross-sectional TEM images and a local Fourier transform image of an oxide semiconductor.
Figure 15B:
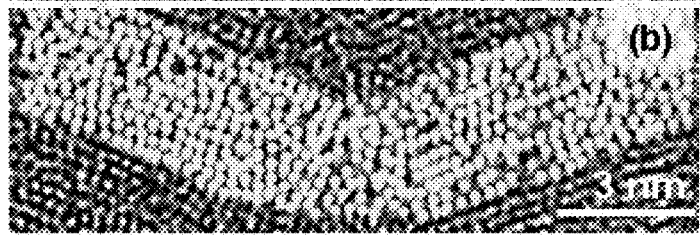

FIG. 15A is a high-resolution cross-sectional TEM image of a CAAC-OS film. FIG. 15B is a high-resolution cross-sectional TEM image obtained by enlarging the image of FIG. 15A. In FIG. 15B, atomic order is highlighted for easy understanding.

Figure 15C:
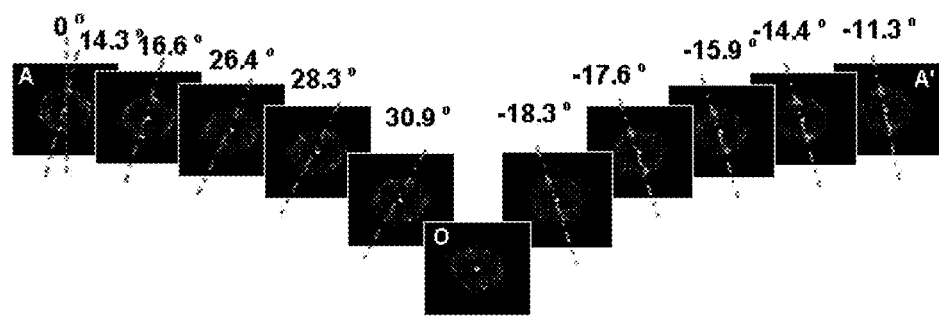

FIG. 15C shows Fourier transform images of regions each surrounded by a circle (diameter is approximately 4 nm) between A and O and between O and A' in FIG. 15A. C-axis alignment can be observed in each region in FIG. 15C. The c-axis direction between A and O is different from that between 0 and A', which indicates that a grain in the region between A and O is different from that between 0 and A'. In addition, between A and O, the angle of the c-axis continuously and gradually changes, for example, 14.3°, 16.6°, and 26.4°. Similarly, between 0 and A', the angle of the c-axis continuously changes, for example, −18.3°, −17.6°, and −15.9°.

Note that in an electron diffraction pattern of the CAAC-OS film, spots (bright spots) indicating alignment are observed. For example, when electron diffraction with an electron beam having a diameter of 1 to 30 nm (such electron diffraction is also referred to as nanobeam electron diffraction) is performed on the top surface of the CAAC-OS film, spots are observed (see FIG. 16A).

From the results of the high-resolution cross-sectional TEM image and the high-resolution planar TEM image, alignment is found in the crystal parts in the CAAC-OS film.

Most of the crystal parts included in the CAAC-OS film each fit into a cube whose one side is less than 100 nm. Thus, there is a case where a crystal part included in the CAAC-OS film fits into a cube whose one side is less than 10 nm, less than 5 nm, or less than 3 nm. Note that when a plurality of crystal parts included in the CAAC-OS film are connected to each other, one large crystal region is formed in some cases. For example, a crystal region with an area of larger than or equal to 2500 nm$^2$, larger than or equal to 5 µm$^2$, or larger than or equal to 1000 µm$^2$ is observed in some cases in the high-resolution planar TEM image.

The CAAC-OS film is subjected to structural analysis with an X-ray diffraction (XRD) apparatus. For example, when the CAAC-OS film including an InGaZnO$_4$ crystal is analyzed by an out-of-plane method, a peak appears frequently when the diffraction angle (2θ) is around 31°. This peak is derived from the (009) plane of the InGaZnO$_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when 2θ is around 56°. This peak is derived from the (110) plane of the InGaZnO$_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of InGaZnO$_4$, six peaks appear. The six peaks are derived from crystal planes equivalent to the (110) plane. On the other hand, in the case of a CAAC-OS film, a peak is not clearly observed even when φ scan is performed with 2θ fixed at around 56°.

According to the above results, in the CAAC-OS film having c-axis alignment, while the directions of a-axes and b-axes are irregularly oriented between crystal parts, the c-axes are aligned in a direction parallel to a normal vector of a formation surface or a normal vector of a top surface. Thus, each metal atom layer which is arranged in a layered manner and observed in the high-resolution cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where the shape of the CAAC-OS film is changed by etching or the like, the c-axis might not be necessarily parallel to a normal vector of a formation surface or a normal vector of a top surface of the CAAC-OS film.

In addition, distribution of c-axis aligned crystal parts in the CAAC-OS film is not necessarily uniform. For example, in the case where crystal growth leading to the crystal parts of the CAAC-OS film occurs from the vicinity of the top surface of the film, the proportion of the c-axis aligned crystal parts in the vicinity of the top surface is higher than that in the vicinity of the formation surface in some cases. Furthermore, when an impurity is added to the CAAC-OS film, a region to which the impurity is added is altered, and the proportion of the c-axis aligned crystal parts in the CAAC-OS film varies depending on regions, in some cases.

Note that when the CAAC-OS film with an InGaZnO$_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ not appear at around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic order of the oxide semiconductor film by depriving the oxide semiconductor film of oxygen and causes a decrease in crystallinity. Furthermore, a heavy metal such as iron or nickel, argon, carbon dioxide, or the like has a large atomic radius (molecular radius), and thus disturbs the atomic order of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having low density of defect states. In some cases, oxygen vacancies in the oxide semiconductor film serve as carrier traps or serve as carrier generation sources when hydrogen is captured therein.

The state in which impurity concentration is low and density of defect states is low (the number of oxygen vacancies is small) is referred to as "highly purified intrinsic" or "substantially highly purified intrinsic." A highly purified intrinsic or substantially highly purified intrinsic oxide semiconductor film has few carrier generation sources, and thus can have low carrier density. Thus, a transistor including the oxide semiconductor film rarely has negative threshold voltage (is rarely normally on). The highly purified intrinsic or substantially highly purified intrinsic oxide semiconductor film has few carrier traps. Accordingly, the transistor including the oxide semiconductor film has few variations in electrical characteristics and high reliability. Charge trapped by the carrier traps in the oxide semiconductor film takes a long time to be released and may behave like fixed charge. Thus, the transistor that includes the oxide semiconductor film having high impurity concentration and high density of defect states has unstable electrical characteristics in some cases.

In a transistor including the CAAC-OS film, changes in electrical characteristics of the transistor due to irradiation with visible light or ultraviolet light are small.

Next, a microcrystalline oxide semiconductor film is described.

A microcrystalline oxide semiconductor film has a region where a crystal part is observed in a high-resolution TEM image and a region where a crystal part is not clearly observed in a high-resolution TEM image. In most cases, a crystal part in the microcrystalline oxide semiconductor film is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal is referred to as a nanocrystalline oxide semiconductor (nc-OS) film. In a high-resolution TEM image, a grain boundary cannot be found clearly in the nc-OS film in some cases.

In the nc-OS film, a microscopic region (e.g., a region with a size greater than or equal to 1 nm and less than or equal to 10 nm, in particular, a region with a size greater than or equal to 1 nm and less than or equal to 3 nm) has periodic atomic order. There is no regularity of crystal orientation between different crystal parts in the nc-OS film. Thus, the orientation of the whole film is not observed. Accordingly, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than that of a crystal part, a peak that shows a crystal plane does not appear. Furthermore, a halo pattern is shown in a selected-area electron diffraction pattern of the nc-OS film obtained by using an electron beam having a probe diameter larger than the diameter of a crystal part (e.g., larger than or equal to 50 nm). Meanwhile, spots are shown in a nanobeam electron diffraction pattern of the nc-OS film obtained by using an electron beam having a probe diameter close to or smaller than the diameter of a crystal part. Furthermore, in a nanobeam electron diffraction pattern of the nc-OS film, regions with high luminance in a circular (ring) pattern are observed in some cases. Also in a nanobeam electron diffraction pattern of the nc-OS film, a plurality of spots are shown in a ring-like region in some cases (see FIG. 16B).

The nc-OS film is an oxide semiconductor film that has high regularity than an amorphous oxide semiconductor film. Thus, the nc-OS film has a lower density of defect states than the amorphous oxide semiconductor film. Note that there is no regularity of crystal orientation between different crystal parts in the nc-OS film; thus, the nc-OS film has a higher density of defect states than the CAAC-OS film.

Next, an amorphous oxide semiconductor film is described.

The amorphous oxide semiconductor film has disordered atomic arrangement and no crystal part. For example, the amorphous oxide semiconductor film does not have a specific state as in quartz.

In a high-resolution TEM image of the amorphous oxide semiconductor film, crystal parts cannot be found.

When the amorphous oxide semiconductor film is subjected to structural analysis by an out-of-plane method with an XRD apparatus, a peak which shows a crystal plane does not appear. A halo pattern is shown in an electron diffraction pattern of the amorphous oxide semiconductor film. Furthermore, a halo pattern is shown but a spot is not shown in a nanobeam electron diffraction pattern of the amorphous oxide semiconductor film.

Note that an oxide semiconductor film may have a structure having physical properties between the nc-OS film and the amorphous oxide semiconductor film. The oxide semiconductor film having such a structure is specifically referred to as an amorphous-like oxide semiconductor (amorphous-like OS) film.

In a high-resolution TEM image of the amorphous-like OS film, a void may be seen. Furthermore, in the high-resolution TEM image, there are a region where a crystal part is clearly observed and a region where a crystal part is not observed. In the amorphous-like OS film, crystallization by a slight amount of electron beam used for TEM observation occurs and growth of the crystal part is found sometimes. In contrast, crystallization by a slight amount of electron beam used for TEM observation is less observed in the nc-OS film having good quality.

Note that the crystal part size in the amorphous-like OS film and the nc-OS film can be measured using high-resolution TEM images. For example, an $InGaZnO_4$ crystal has a layered structure in which two Ga—Zn—O layers are included between In—O layers. A unit cell of the $InGaZnO_4$ crystal has a structure in which nine layers of three In—O layers and six Ga—Zn—O layers are layered in the c-axis direction. Accordingly, the spacing between these adjacent layers is equivalent to the lattice spacing on the (009) plane (also referred to as a d value). The value is calculated to be 0.29 nm from crystal structure analysis. Thus, each of the lattice fringes in which the spacing therebetween is from 0.28 nm to 0.30 nm is regarded to correspond to the a-b plane of the $InGaZnO_4$ crystal, focusing on the lattice fringes in the high-resolution TEM image. Let the maximum length in the region in which the lattice fringes are observed be the size of the crystal parts of the amorphous-like OS film and the nc-OS film. Note that the crystal part whose size is 0.8 nm or larger is selectively evaluated.

Figure 17:
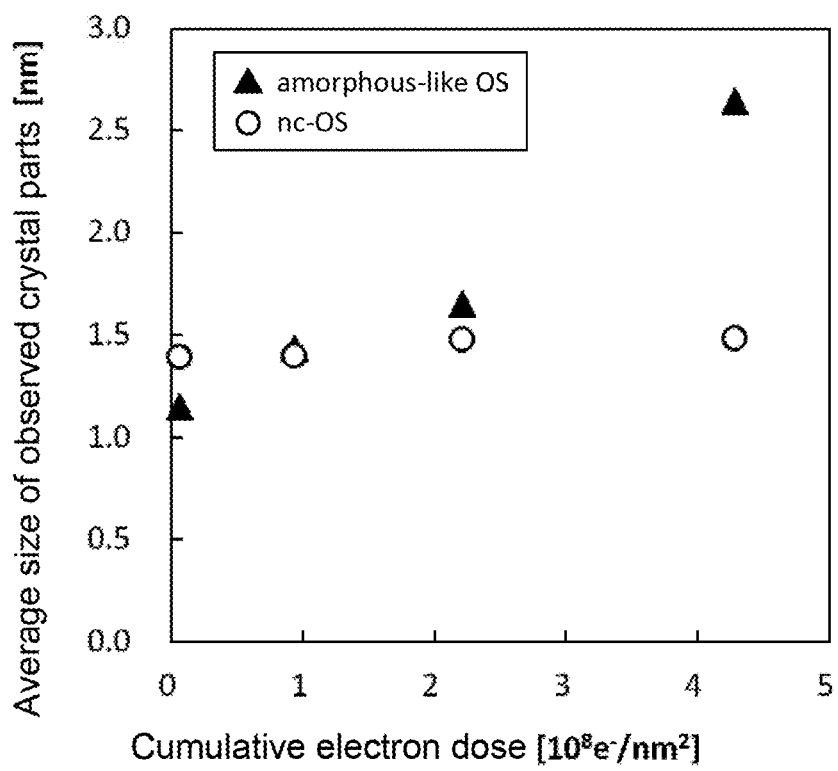
FIG. 17 shows a change in crystal parts by electron beam irradiation.

FIG. 17 shows examination results of change in average size of crystal parts (20 to 40 points) in the amorphous-like OS film and the nc-OS film using the high-resolution TEM images. FIG. 17 indicates that the crystal part size in the amorphous-like OS increases with an increase in the cumulative electron dose. Specifically, a crystal part of approximately 1.2 nm at the start of TEM observation grows to a size of approximately 2.6 nm at a cumulative electron dose of $4.2 \times 10^8 e^-/nm^2$. In contrast, the crystal part size in the good-quality nc-OS film shows little change from the start of electron irradiation to a cumulative electron dose of $4.2 \times 10^8 e^-/nm^2$ regardless of the amount of the cumulative electron dose.

Furthermore, in FIG. 17, by linear approximation of the change in the crystal part size in the amorphous-like OS film and the nc-OS film and extrapolation to the cumulative electron dose of $0 e^-/nm^2$, the average size of the crystal part is found to be a positive value. This means that the crystal parts exist in the amorphous-like OS film and the nc-OS film before TEM observation.

Note that an oxide semiconductor film may be a stacked film including two or more films of an amorphous oxide semiconductor film, a microcrystalline oxide semiconductor film, and a CAAC-OS film, for example.

In the case where the oxide semiconductor film has a plurality of structures, the structures can be analyzed using nanobeam electron diffraction in some cases.

Figure 16A:
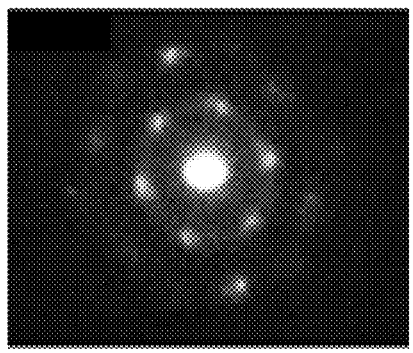
FIGS. 16A and 16B show nanobeam electron diffraction patterns of oxide semiconductor films.
Figure 16B:
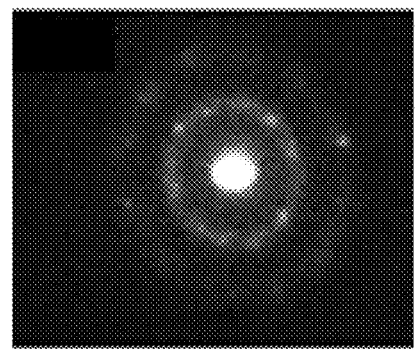
Figure 16C:
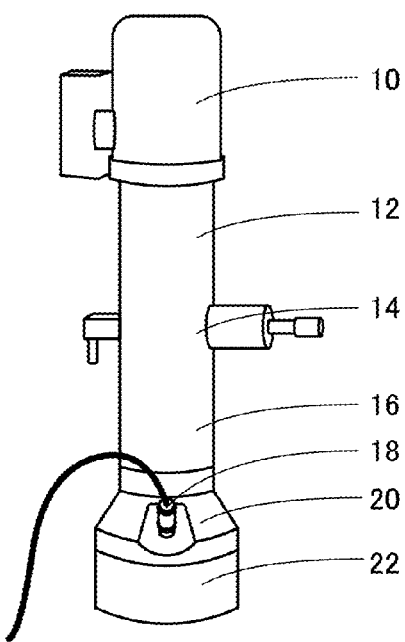
FIGS. 16C and 16D illustrate an example of a transmission electron diffraction measurement apparatus.

FIG. 16C illustrates a transmission electron diffraction measurement apparatus. The transmission electron diffraction measurement apparatus includes an electron gun chamber 10, an optical system 12 below the electron gun chamber 10, a sample chamber 14 below the optical system 12, an optical system 16 below the sample chamber 14, an observation chamber 20 below the optical system 16, a camera 18 provided for the observation chamber 20, and a film chamber 22 below the observation chamber 20. The camera 18 is provided to face toward the inside of the observation chamber 20. Note that the film chamber 22 is not necessarily provided.

Figure 16D:
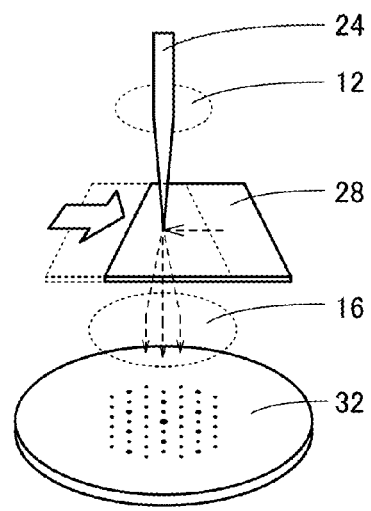

FIG. 16D illustrates the internal structure of the transmission electron diffraction measurement apparatus in FIG. 16C. In the transmission electron diffraction measurement apparatus, a substance 28 that is positioned in the sample chamber 14 is irradiated with electrons emitted from an electron gun installed in the electron gun chamber 10 through the optical system 12. Electrons passing through the substance 28 enter a fluorescent plate 32 provided in the observation chamber 20 through the optical system 16. On the fluorescent plate 32, a pattern corresponding to the intensity of the incident electron appears, which enables measurement of a transmission electron diffraction pattern.

The camera 18 is installed to face the fluorescent plate 32 and can take a picture of a pattern appearing in the fluorescent plate 32. An angle formed by a straight line that passes through the center of a lens of the camera 18 and the center of the fluorescent plate 32 and an upper surface of the fluorescent plate 32 is, for example, 15 to 80°, 30 to 75°, or 45 to 70°. As the angle is reduced, distortion of the transmission electron diffraction pattern taken by the camera 18 becomes larger. Note that if the angle is obtained in advance, distortion of an obtained transmission electron diffraction pattern can be corrected. The camera 18 may be set in the film chamber 22 in some cases. For example, the camera 18 may be set in the film chamber 22 to be opposite to the incident direction of electrons 24. In that case, a transmission electron diffraction pattern with less distortion can be taken from a rear surface of the fluorescent plate 32.

A holder for fixing the substance 28 that is a sample is provided in the sample chamber 14. The holder transmits electrons passing through the substance 28. The holder may have, for example, a function of moving the substance 28 along the x-axis, the y-axis, the z-axis, or the like. The movement function of the holder may have an accuracy of moving the substance in the range of, for example, 1 to 10 nm, 5 to 50 nm, 10 to 100 nm, 50 to 500 nm, and 100 nm to 1 μm. The range is preferably optimized depending on the structure of the substance 28.

Then, a method for measuring a transmission electron diffraction pattern of a substance by the transmission electron diffraction measurement apparatus is described.

For example, changes in the structure of a substance can be observed by changing the irradiation position of the electrons 24 that are a nanobeam in the substance (or by scanning) as illustrated in FIG. 16D. At this time, when the substance 28 is a CAAC-OS film, a diffraction pattern as shown in FIG. 16A is observed. When the substance 28 is an nc-OS film, a diffraction pattern shown in FIG. 16B is observed.

Even when the substance 28 is a CAAC-OS film, a diffraction pattern similar to that of an nc-OS film or the like is partly observed in some cases. Therefore, whether a CAAC-OS film is favorable can be determined by the proportion of a region where a diffraction pattern of a CAAC-OS film is observed in a predetermined area (also referred to as proportion of CAAC). In the case of a high quality CAAC-OS film, for example, the proportion of CAAC is higher than or equal to 50%, preferably higher than or equal to 80%, more preferably higher than or equal to 90%, still preferably higher than or equal to 95%. Note that the proportion of a region where a diffraction pattern different from that of a CAAC-OS film is observed is referred to as the proportion of non-CAAC.

For example, transmission electron diffraction patterns were obtained by scanning a top surface of a sample including a CAAC-OS film obtained immediately after deposition (represented as "as-sputtered") and a top surface of a sample including a CAAC-OS subjected to heat treatment at 450° C. in an atmosphere containing oxygen. Here, the proportion of CAAC was obtained in such a manner that diffraction patterns were observed by scanning for 60 seconds at a rate of 5 nm/s and the obtained diffraction patterns were converted into still images every 0.5 seconds. Note that as an electron beam, a nanobeam with a probe diameter of 1 nm was used. The above measurement was also performed on six samples. The proportion of CAAC was calculated using the average value of the six samples.

Figure 18A:
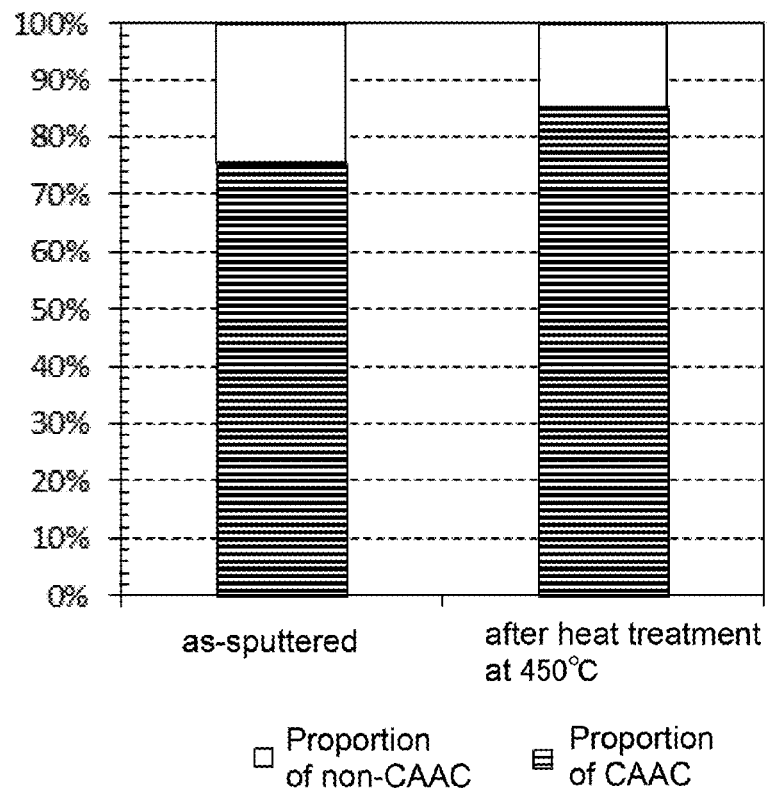
FIG. 18A shows an example of structural analysis by transmission electron diffraction measurement.

FIG. 18A shows the proportion of CAAC in each sample. The proportion of CAAC of the CAAC-OS film obtained immediately after the deposition was 75.7% (the proportion of non-CAAC was 24.3%). The proportion of CAAC of the CAAC-OS film subjected to the heat treatment at 450° C. was 85.3% (the proportion of non-CAAC was 14.7%). These results show that the proportion of CAAC obtained after the heat treatment at 450° C. is higher than that obtained immediately after the deposition. That is, heat treatment at high temperature (e.g., higher than or equal to 400° C.) reduces the proportion of non-CAAC (increases the proportion of CAAC). The above results also indicate that even when the temperature of the heat treatment is lower than 500° C., the CAAC-OS film can have a high proportion of CAAC.

Here, most of diffraction patterns different from that of a CAAC-OS film were similar to that of an nc-OS film. Furthermore, an amorphous oxide semiconductor film was not able to be observed in a measurement region. Thus, the results suggest that a region having a structure similar to that of an nc-OS film is rearranged by the heat treatment owing to the influence of the structure of an adjacent region, so that the region becomes CAAC.

Figure 18B:
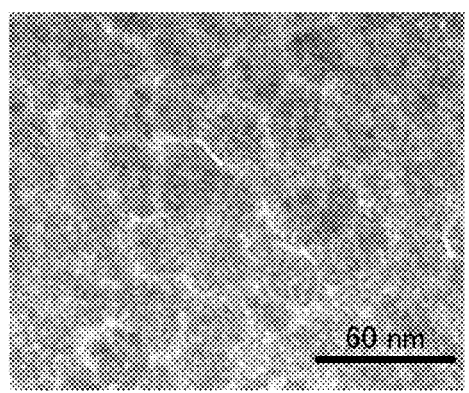
FIGS. 18B and 18C show high-resolution planar TEM images.
Figure 18C:
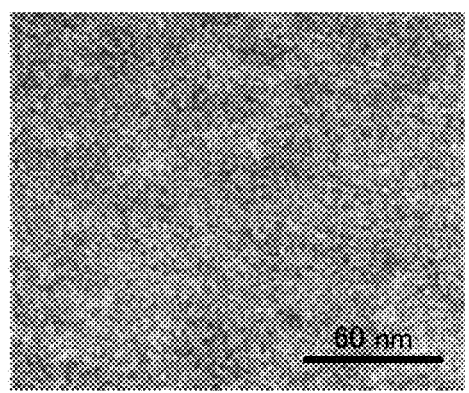

FIGS. 18B and 18C are high-resolution planar TEM images of the CAAC-OS film obtained immediately after the deposition and the CAAC-OS film subjected to the heat treatment at 450° C., respectively. Comparison between FIGS. 18B and 18C shows that the CAAC-OS film subjected to the heat treatment at 450° C. has more even film quality. That is, the heat treatment at high temperature improves the film quality of the CAAC-OS film.

With such a measurement method, the structure of an oxide semiconductor film having a plurality of structures can be analyzed in some cases.

The structures, the methods, and the like described in this embodiment can be combined with any of the structures, the methods, and the like described in the other embodiments as appropriate.

(Embodiment 6)

A semiconductor device according to one embodiment of the present invention can be used for display devices, personal computers, or image reproducing devices provided with recording media (typically, devices that reproduce the content of recording media such as digital versatile discs (DVDs) and have displays for displaying the reproduced images). Furthermore, as electronic devices that can include the semiconductor device according to one embodiment of the present invention, cellular phones, game machines (including portable game machines), portable information terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATMs), vending machines, and the like can be given. FIGS. 19A to 19F illustrate specific examples of these electronic devices.

Figure 19A:
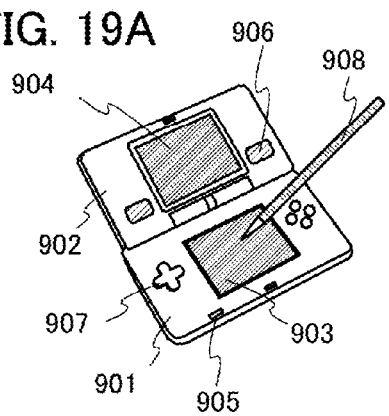
FIGS. 19A to 19F illustrate electronic device examples.

FIG. 19A illustrates a portable game machine, which includes a housing 901, a housing 902, a display portion 903, a display portion 904, a microphone 905, speakers 906, an operation key 907, a stylus 908, and the like. Although the portable game machine in FIG. 19A has the two display portions 903 and 904, the number of display portions included in the portable game machine is not limited to this.

Figure 19B:
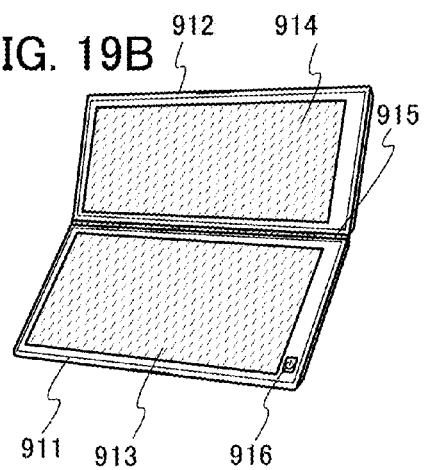

FIG. 19B illustrates a portable data terminal, which includes a first housing 911, a second housing 912, a first display portion 913, a second display portion 914, a joint 915, an operation key 916, and the like. The first display portion 913 is provided in the first housing 911, and the second display portion 914 is provided in the second housing 912. The first housing 911 and the second housing 912 are connected to each other with the joint 915, and an angle between the first housing 911 and the second housing 912 can be changed with the joint 915. An image displayed on the first display portion 913 may be switched in accordance with the angle between the first housing 911 and the second housing 912 at the joint 915. A display device with a position input function may be used as at least one of the first display portion 913 and the second display portion 914. Note that the position input function can be added by provision of a touch panel in a display device. Alternatively, the position input function can be added by provision of a photoelectric conversion element called a photosensor in a pixel portion of a display device.

Figure 19C:
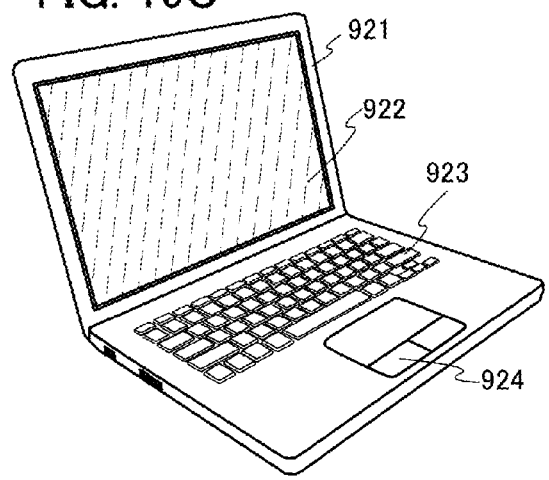

FIG. 19C illustrates a laptop, which includes a housing 921, a display portion 922, a keyboard 923, a pointing device 924, and the like.

Figure 19D:
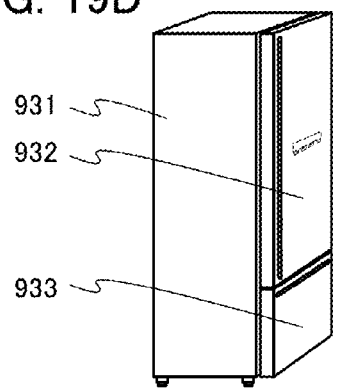

FIG. 19D illustrates an electric refrigerator-freezer, which includes a housing 931, a refrigerator door 932, a freezer door 933, and the like.

Figure 19E:
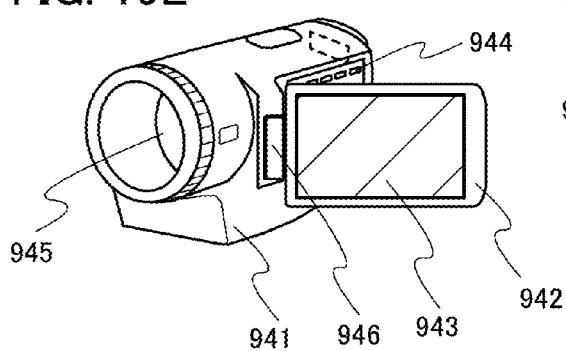

FIG. 19E illustrates a video camera, which includes a first housing 941, a second housing 942, a display portion 943, operation keys 944, a lens 945, a joint 946, and the like. The operation keys 944 and the lens 945 are provided in the first housing 941, and the display portion 943 is provided in the second housing 942. The first housing 941 and the second housing 942 are connected to each other with the joint 946, and an angle between the first housing 941 and the second housing 942 can be changed with the joint 946. An image displayed on the display portion 943 may be switched in accordance with the angle between the first housing 941 and the second housing 942 at the joint 946.

Figure 19F:
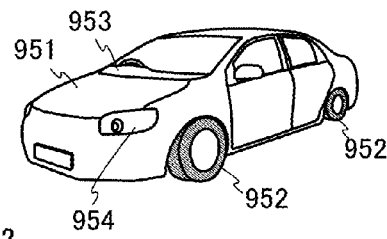
Figure 20A:
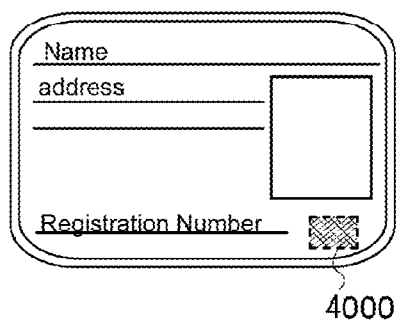
FIGS. 20A to 20F illustrate RF tag examples.
Figure 20B:
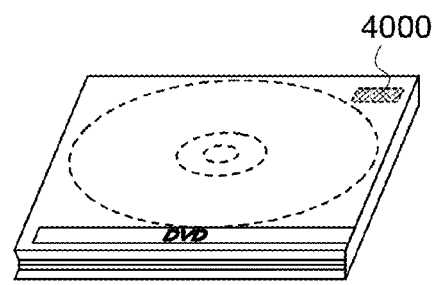
Figure 20C:
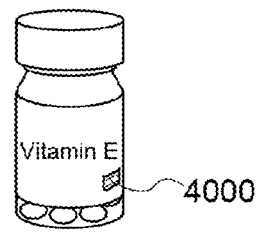
Figure 20D:
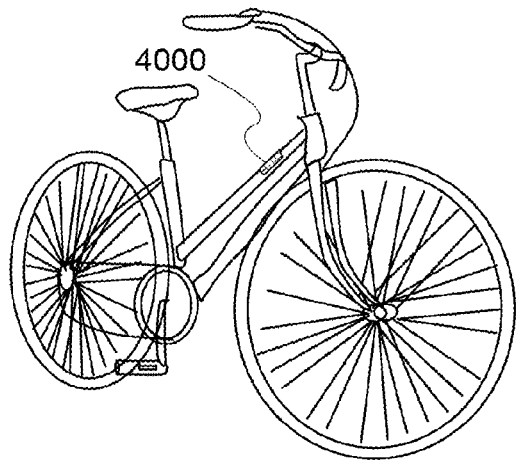
Figure 20E:
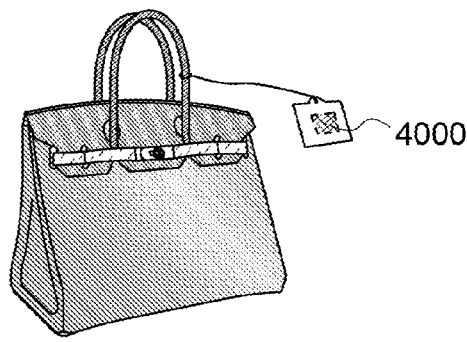
Figure 20F:
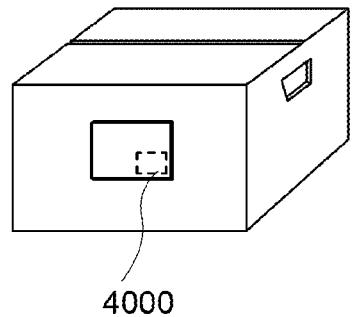

FIG. 19F illustrates an ordinary vehicle, which includes a car body 951, wheels 952, a dashboard 953, lights 954, and the like.

Note that this embodiment can be combined with any of the other embodiments in this specification as appropriate.

(Embodiment 7)

In this embodiment, application examples of an RF tag according to one embodiment of the present invention are described with reference to FIGS. 20A to 20F. The RF tag is widely used and can be provided for, for example, products such as bills, coins, securities, bearer bonds, documents (e.g., driver's licenses or resident's cards, see FIG. 20A), recording media (e.g., DVDs or video tapes, see FIG. 20B), packaging containers (e.g., wrapping paper or bottles, see FIG. 20C), vehicles (e.g., bicycles, see FIG. 20D), personal belongings (e.g., bags or glasses), foods, plants, animals, human bodies, clothing, household goods, medical supplies such as medicine and chemicals, and electronic devices (e.g., liquid crystal display devices, EL display devices, television sets, or cellular phones), or tags on products (see FIGS. 20E and 20F).

An RF tag 4000 according to one embodiment of the present invention is fixed to products by being attached to a surface thereof or embedded therein. For example, the RF tag 4000 is fixed to each product by being embedded in paper of a book, or embedded in an organic resin of a package. Since the RF tag 4000 according to one embodiment of the present invention can be reduced in size, thickness, and weight, the RF tag 4000 can be fixed to a product without spoiling the design of the product. Furthermore, bills, coins, securities, bearer bonds, documents, or the like can have an identification function by being provided with the RF tag 4000 according to one embodiment of the present invention, and the identification function can be utilized to prevent counterfeiting. Moreover, the efficiency of a system such as an inspection system can be improved by providing the RF tag according to one embodiment of the present invention for packaging containers, recording media, personal belongings, foods, clothing, household goods, electronic devices, or the like. Vehicles can also have higher security against theft or the like by being provided with the RF tag according to one embodiment of the present invention.

As described above, by using the RF tag according to one embodiment of the present invention for each application described in this embodiment, power for operation such as data writing or data reading can be reduced, which results in an increase in the maximum communication distance. Moreover, data can be retained for an extremely long period even in a state where power is not supplied; thus, the RF tag according to one embodiment of the present invention can be favorably used for application in which data is not frequently written or read.

Note that this embodiment can be combined with any of the other embodiments in this specification as appropriate.

This application is based on Japanese Patent Application serial No. 2014-051497 filed with Japan Patent Office on Mar. 14, 2014 and Japanese Patent Application serial No. 2014-069626 filed with Japan Patent Office on Mar. 28, 2014, the entire contents of which are hereby incorporated by reference.

What is claimed is:

1. A semiconductor device comprising:
a bit line;
a power supply line;
first and second word lines;
first to fourth transistors;
first and second capacitors; and
first and second retention nodes, wherein first data is input to the first retention node through the first transistor, wherein second data is input to the second retention node through the second transistor, wherein a gate of the third transistor is electrically connected to the first retention node, wherein a first terminal of the third transistor is electrically connected to the bit line, wherein a second terminal of the third transistor is electrically connected to a first terminal of the fourth transistor, wherein a second terminal of the fourth transistor is electrically connected to the power supply line, wherein a gate of the fourth transistor is electrically connected to the second retention node, wherein a first terminal of the first capacitor is electrically connected to the first retention node, wherein a second terminal of the first capacitor is electrically connected to the first word line, wherein a first terminal of the second capacitor is electrically connected to the second retention node, wherein a second terminal of the second capacitor is electrically connected to the second word line, wherein the first data and the second data are binary data or multilevel data, and wherein each of the first and second transistors includes an oxide semiconductor in a semiconductor layer.

2. The semiconductor device according to claim 1, wherein the third and fourth transistors are p-channel transistors.

3. The semiconductor device according to claim 1, wherein the third and fourth transistors are n-channel transistors.

4. An electronic device comprising:
the semiconductor device according to claim 1; and
at least one selected from the group consisting of a display device, a microphone, a speaker, an operation key, and a housing.

5. A semiconductor device comprising:
a memory cell comprising:
a first transistor;
a second transistor;
a third transistor;
a fourth transistor;
a first capacitor; and
a second capacitor, wherein a first terminal of the first transistor is electrically connected to a bit line, wherein a second terminal of the first transistor is electrically connected to a gate of the third transistor, wherein a first terminal of the second transistor is electrically connected to the bit line, wherein a second terminal of the second transistor is electrically connected to a gate of the fourth transistor, wherein a first terminal of the third transistor is electrically connected to the bit line, wherein a second terminal of the third transistor is electrically connected to a first terminal of the fourth transistor, wherein a second terminal of the fourth transistor is electrically connected to a power supply line, wherein a first terminal of the first capacitor is electrically connected to the gate of the third transistor, and wherein a first terminal of the second capacitor is electrically connected to the gate of the fourth transistor.

6. The semiconductor device according to claim 5, wherein the third and fourth transistors are p-channel transistors.

7. The semiconductor device according to claim 5, wherein the third and fourth transistors are n-channel transistors.

8. An electronic device comprising:
the semiconductor device according to claim 5; and
at least one selected from the group consisting of a display device, a microphone, a speaker, an operation key, and a housing.

9. The semiconductor device according to claim 5, wherein each of the first transistor and the second transistor includes an oxide semiconductor in a semiconductor layer.

10. The semiconductor device according to claim 5,
wherein a second terminal of the first capacitor is electrically connected to a first word line, and
wherein a second terminal of the second capacitor is electrically connected to a second word line.

11. A semiconductor device comprising:
a memory cell comprising:
a first transistor;
a second transistor;
a third transistor;
a fourth transistor;
a first capacitor; and
a second capacitor, wherein a first terminal of the first transistor is directly connected to a bit line, wherein a second terminal of the first transistor is directly connected to a gate of the third transistor, wherein a first terminal of the second transistor is directly connected to the bit line, wherein a second terminal of the second transistor is directly connected to a gate of the fourth transistor, wherein a first terminal of the third transistor is directly connected to the bit line, wherein a second terminal of the third transistor is directly connected to a first terminal of the fourth transistor, wherein a second terminal of the fourth transistor is directly connected to a power supply line, wherein a first terminal of the first capacitor is directly connected to the gate of the third transistor, and wherein a first terminal of the second capacitor is directly connected to the gate of the fourth transistor.

12. The semiconductor device according to claim 11, wherein the third and fourth transistors are p-channel transistors.

13. The semiconductor device according to claim 11, wherein the third and fourth transistors are n-channel transistors.

14. An electronic device comprising:
the semiconductor device according to claim 11; and
at least one selected from the group consisting of a display device, a microphone, a speaker, an operation key, and a housing.

15. The semiconductor device according to claim 11, wherein each of the first transistor and the second transistor includes an oxide semiconductor in a semiconductor layer.

16. The semiconductor device according to claim 11,
wherein a second terminal of the first capacitor is directly connected to a first word line, and
wherein a second terminal of the second capacitor is directly connected to a second word line.

* * * * *